United States Patent
Nemoto et al.

(10) Patent No.: US 7,452,751 B2
(45) Date of Patent: Nov. 18, 2008

(54) SEMICONDUCTOR DEVICE AND METHOD OF MANUFACTURING THE SAME

(75) Inventors: Yoshihiko Nemoto, Tokyo (JP);
Kazumasa Tanida, Kyoto (JP); Kenji Takahashi, Kawasaki (JP)

(73) Assignees: Renesas Technology Corp., Tokyo (JP);
Kabushiki Kaisha Toshiba, Tokyo (JP);
Rohm Co., Ltd., Kyoto (JP)

( * ) Notice: Subject to any disclaimer, the term of this patent is extended or adjusted under 35 U.S.C. 154(b) by 468 days.

(21) Appl. No.: 11/281,727

(22) Filed: Nov. 18, 2005

(65) Prior Publication Data
US 2006/0084258 A1   Apr. 20, 2006

Related U.S. Application Data

(62) Division of application No. 10/670,557, filed on Sep. 26, 2003, now Pat. No. 6,995,455.

(30) Foreign Application Priority Data
Nov. 29, 2002 (JP) .............................. 2002-347895

(51) Int. Cl.
*H01L 21/00* (2006.01)

(52) U.S. Cl. ................. 438/109; 438/107; 438/108; 257/621; 257/686; 257/E21.002

(58) Field of Classification Search ......... 438/107–109; 257/621, 686
See application file for complete search history.

(56) References Cited

U.S. PATENT DOCUMENTS

| 4,612,083 | A | 9/1986 | Yasumoto et al. | |
| 4,939,568 | A | 7/1990 | Kato et al. | |
| 6,087,719 | A | 7/2000 | Tsunashima | |
| 6,611,052 | B2 | 8/2003 | Poo et al. | |
| 6,809,421 | B1* | 10/2004 | Hayasaka et al. | 257/777 |
| 7,029,937 | B2* | 4/2006 | Miyazawa | 438/40 |
| 2001/0054770 | A1 | 12/2001 | Isaak | |
| 2002/0017710 | A1* | 2/2002 | Kurashima et al. | 257/686 |
| 2004/0188819 | A1* | 9/2004 | Farnworth et al. | 257/686 |

FOREIGN PATENT DOCUMENTS

| JP | 06-132474 | 5/1994 |
| JP | 11-307937 | 11/1999 |

* cited by examiner

*Primary Examiner*—Zandra Smith
*Assistant Examiner*—Christy L Novacek
(74) *Attorney, Agent, or Firm*—McDermott Will & Emery LLP

(57) ABSTRACT

Semiconductor device includes a pair of substrates (1, 2) disposed oppositely, semiconductor elements (5, 6) formed in the substrates (1, 2), respectively, and having semiconductor circuits (3, 4) and electrodes (7, 8), respectively, a wiring conductor (9) interposed between the electrodes (7, 8), and a through electrode (12) extending through one substrate (1) and connected to the electrode (7) via the wiring conductor (9). The other substrate (2) is disposed laterally of the through electrode (12). Surface of the through electrode (12) projecting from the one substrate (1) and lateral surface of the element (6) are coated with an insulation material (13). The through electrode (12) has one end exposed in a back surface of the one substrate (1), while other end is positioned flush with a back surface of the other substrate (2), being exposed.

6 Claims, 56 Drawing Sheets

SEMICONDUCTOR DEVICE AND METHOD OF MANUFACTURING THE SAME

RELATED APPLICATIONS

This application is a divisional of application Ser. No. 10/670,557, filed Sep. 26, 2003 now U. S. Pat. No. 6,995,455, which claims priority of Japanese Application No. 2002-347895, filed Nov. 29, 2002, the contents of which are hereby incorporated by reference.

BACKGROUND OF THE INVENTION

1. Field of the Invention

The present invention generally relates to an electrode structure of a semiconductor device. More particularly, the present invention is concerned with a semiconductor device having a through electrode incorporated therein and a method of manufacturing the semiconductor device incorporating the through electrode.

2. Related Art

In the semiconductor device known heretofore the through electrode such as mentioned above is fabricated by depositing a resist film having an opening on a semiconductor substrate, forming a column of an electrically conductive material through a plating process and fixing or consolidating the electrically conductive column by using a resin. For more particulars, reference may have to be made to Japanese Patent Application Laid-Open Publication No. 307937/1999 (page 7, FIG. 1).

In the semiconductor device having the through electrode manufactured as mentioned above, the electrode extending through the semiconductor substrate, i.e., the through electrode, is electrically isolated or insulated from the semiconductor substrate by an insulation film interposed therebetween. For manufacturing the semiconductor device of this type, a fine hole of a greater depth is formed with a large aspect ratio, whereon an insulation film having a high coating quality is formed on the inner wall of the hole by a chemical vapor deposition (CVD) method while a metal film serving as a cathode in an electroplating process is deposited with a high coating quality by a chemical vapor deposition (CVD) method.

After having filled the hole with a metal by electroplating by employing the metal film as a cathode, excessive insulation material deposited through the CVD process and excessive metal deposited by plating are removed. Thereafter, the semiconductor substrate is ground from the back side to expose the metal deposited on the bottom portion of the hole.

As is apparent from the above, in manufacturing the conventional semiconductor device, it is required to form the hole a large aspect ratio in the semiconductor substrate and then form the insulation film at least on the side or lateral wall of the hole with a high coating quality without any noticeable defects. In particular, however, it is technically very difficult to meet such requirement.

Further, the cathode material deposited by plating adheres not only the bottom portion of the hole but also the side wall. Consequently, when the metal is buried in the hole through the electroplating process, metal growth occurs not only from the hole bottom but also from the side wall of the hole. In general, since the metal grows from the side wall portion located at the top portion of the hole at a higher rate because of high fluidity, there may arise such unwanted situation that the top portion of the hole is firstly blocked by the metal in the course of plating, resulting in that the lower portion of the hole remains yet to be metalized. In order to evade such undesirable situation, it is necessary to control the metal growth, which control is however extremely difficult.

For the reasons mentioned above, great difficulties have been encountered heretofore in manufacturing the semiconductor device incorporating the through electrode, which has presented a great obstacle to wide-spreading of such semiconductor device. Besides, the yield and the operation reliability of the manufactured semiconductor device are very low. Additionally, high cost is involved in manufacturing the semiconductor device.

SUMMARY OF THE INVENTION

In the light of the state of the art described above, it is as an object of the present invention solve satisfactorily the problem mentioned above by providing a semiconductor device incorporating a through electrode which can be manufactured.

In view of the above and other objects which will become apparent as the description proceeds, there is provided according to a general aspect of the present invention a semiconductor device which includes first and second semiconductor substrates having respective opposite surfaces disposed in opposition to each other, a first semiconductor element formed in the opposite surface of the first semiconductor substrate and including a first semiconductor circuit and a first electrode, a second semiconductor element formed in the opposite surface of the second semiconductor substrate and including a second semiconductor circuit and a second electrode, a first wiring conductor layer formed of an electrically conductive material and interposed between the first and second electrodes, and a through electrode extending through the first semiconductor substrate and connected to the first and second electrodes through the medium of the first wiring conductor layer. In the semiconductor device described above, the second semiconductor substrate is disposed above the first semiconductor substrate and disposed on a lateral side of the through electrode, being distanced therefrom. Lateral surface of the through electrode projecting from the first semiconductor substrate and lateral surface of the second semiconductor element are coated with an insulation material layer. The through electrode has one end portion exposed from a back surface of the first semiconductor substrate to serve as a first external terminal. The through electrode has the other end portion positioned at a same height as a back surface of the second semiconductor substrate and exposed from the insulation material layer to serve as a second external terminal.

By virtue of the structure of the semiconductor device described above, it is possible to mount or incorporate or package a greater number of semiconductor circuits when compared with the conventional semiconductor device with a substantially same volume.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

The present invention will be described in detail in conjunction with what is presently considered as preferred or typical embodiments thereof by reference to the drawings. In the following description, it is to be understood that such terms as "top", "bottom", "back", "vertical" and the like are words of convenience and are not to be construed as limiting terms.

Embodiment 1

Figure 1:
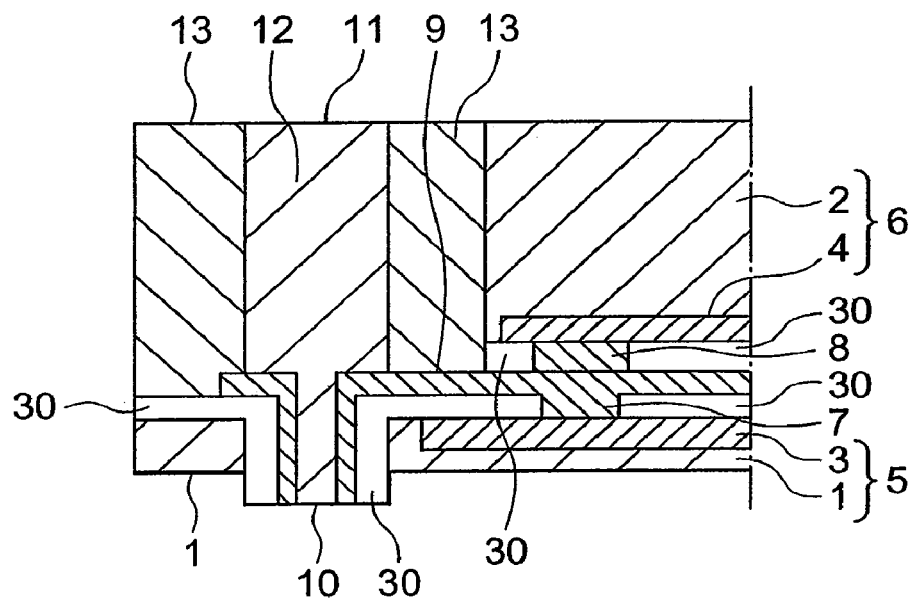
FIG. 1 is a sectional view showing a semiconductor device according to a first embodiment of the present invention.
Figure 2:
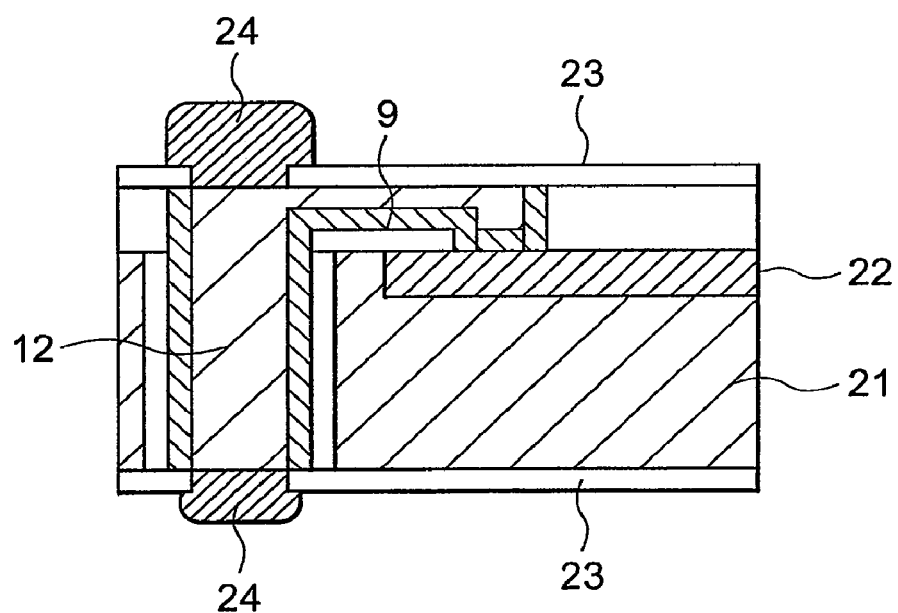
FIG. 2 is a sectional view showing a hitherto known semiconductor device.

FIG. 1 is a sectional view showing a semiconductor device according to a first embodiment of the present invention, and FIG. 2 is a sectional view showing a semiconductor device known heretofore.

Referring to FIG. 1, a first semiconductor circuit 3 is formed in a first semiconductor substrate 1. Further, a first electrode (or group of electrodes) 7 is formed at a-location inside of the first semiconductor circuit 3 or in a peripheral portion thereof.

A second semiconductor circuit 4 is formed in a second semiconductor substrate 2, and a second electrode (or group of electrodes) 8 is formed in the second semiconductor circuit 4 at a predetermined position thereof.

A first semiconductor element 5 which includes the first semiconductor circuit 3 formed in the first semiconductor substrate 1 on one hand and a second semiconductor element 6 which includes the second semiconductor circuit 4 formed in the second semiconductor substrate 6 on the other hand are disposed such that the surfaces in which the first semiconductor circuit 3 and the second semiconductor circuit 4 are formed, respectively, face oppositely to each other, wherein the first semiconductor element 5 and the second semiconductor element 6 are interconnected through the medium of the first electrode 7 and the second electrode 8.

Further, a column-like through electrode 12 is formed, being exposed from a surface (back surface) of the first semiconductor element 5 which surface is located oppositely to the surface in which the first semiconductor circuit 3 is formed and extending vertically toward the second semiconductor substrate to reach a surface which is located at the side opposite to the surface in which the second semiconductor circuit 4 of the second semiconductor element 6 is formed.

The through electrode 12 has one end portion exposed from the first semiconductor substrate 1 to serve as a first external terminal 10 used for connection to an external device or equipment, whereas the other end portion of the through electrode 12 is exposed from the surface which lies in a plane substantially flush with the surface of the second semiconductor element 6 formed in the second semiconductor substrate 2 and which is located oppositely to the surface in which the second semiconductor circuit 4 is formed, to serve as a second external terminal 11 for connection to an external device or equipment.

A wiring conductor layer 9 for the first external terminal 10 is formed on the main surface of the first semiconductor substrate 1 and has one end portion connected to the through electrode 12 with the other end portion thereof being connected to one of the first and second electrodes 7 and 8 on the first semiconductor substrate 1.

Further, the surface exclusive of the back surfaces of the first and second semiconductor substrates 1 and 2 located oppositely to the surfaces in which the semiconductor circuits 3 and 4 are formed, respectively, the top surface (the second external terminal 11) of the through electrode 12 which lies in a plane extending substantially in flush with the surface of the second semiconductor substrate 2 and the lateral surface of the first semiconductor substrate 1 is coated with an insulation material 13.

Incidentally, in FIG. 1, reference numeral 30 denotes an insulation film.

Turning to FIG. 2 which shows the conventional semiconductor device known heretofore, one semiconductor circuit 22 is formed in the semiconductor substrate 21, wherein the top and bottom surfaces of the semiconductor substrate 21 are coated with insulation films 23, respectively. A through electrode 12 extends through the semiconductor substrate 21 and has both exposed end portions which protrude from the semiconductor substrate 21 to form electrodes 24, respectively. Incidentally, in FIG. 2, reference numeral 9 denotes a wiring conductor layer.

As is apparent from the above description, in the semiconductor device according to the instant embodiment of the present invention, about twice as many semiconductor circuits can be implemented with a substantially same volume as the conventional semiconductor device having the similar through electrode.

Embodiment 2

Figure 3:
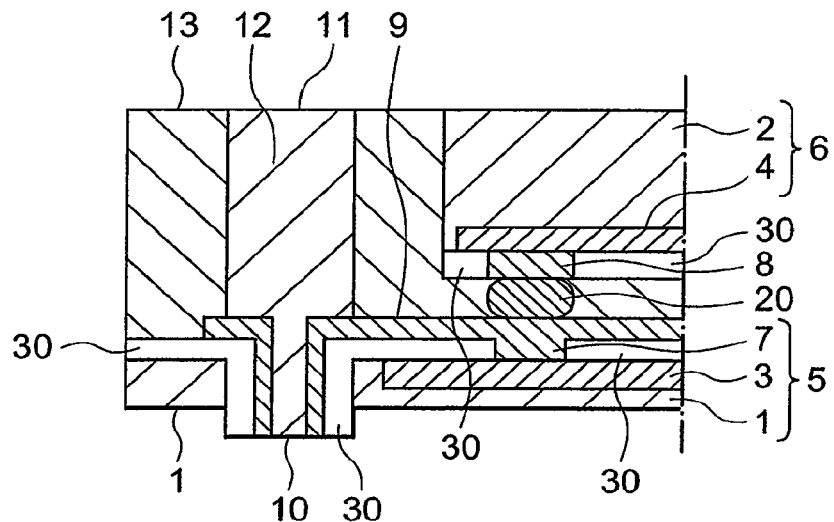
FIG. 3 is a sectional view showing a semiconductor device according to a second embodiment of the present invention.

FIG. 3 is a sectional view showing a semiconductor device according to a second embodiment of the present invention. In this figure, the constituents or components similar to those described previously in conjunction with the first embodiment of the invention by reference to FIG. 1 are denoted by like reference symbols, and repeated description in detail of these components will be omitted.

In the case of the semiconductor device according to the first embodiment of the invention, the first semiconductor element 5 and the second semiconductor element 6 are interconnected through the first electrode 7 and the second electrode 8 which are directly contacted with each other. By contrast, in the semiconductor device according to the instant embodiment of the invention, the first semiconductor element 5 and the second semiconductor element 6 are connected to each other through a bump electrode 20 formed between the first electrode 7 and the second electrode 8, as can clearly be seen in FIG. 3.

By adopting the connecting structure described above, interconnection of the first semiconductor element 5 and the second semiconductor element 6 can be realized with ease.

Further, in the semiconductor device now under consideration, the first semiconductor element 5 and the bump electrode 20 can be interconnected by making use of a portion of the wiring conductor layer 9 connected to the through electrode 12.

In this conjunction, it is to be added that the bump electrode 20 may be formed on the side of the first semiconductor, substrate 1 or on the side of the second semiconductor substrate 2. Alternatively, the bump electrode 20 may be formed on both the first semiconductor substrate 1 and the second semiconductor substrate 2.

Embodiment 3

Figure 4:
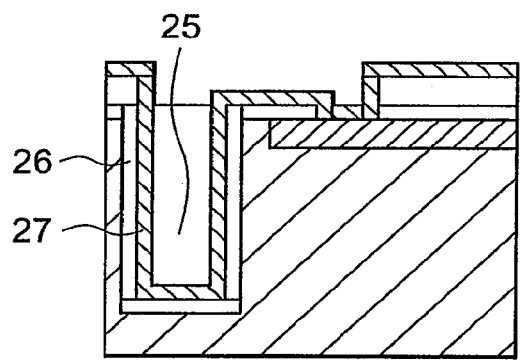
FIG. 4 is a view for illustrating a step in a method of manufacturing the hitherto known semiconductor device.
Figure 5:
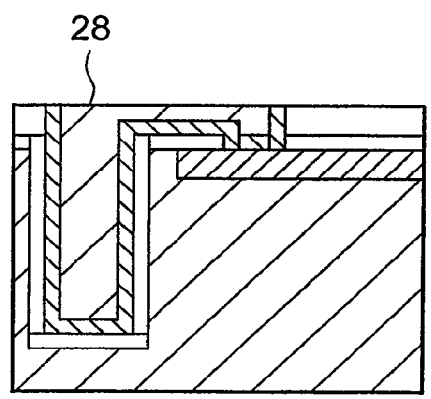
FIG. 5 is a view for illustrating a step in a method of manufacturing the hitherto known semiconductor device.

A third embodiment of the present invention is directed to a method of manufacturing the semiconductor devices according to the first and the second embodiments of the invention. FIGS. 4 and 5 are views for illustrating processes or steps involved in manufacturing the conventional semiconductor device known heretofore. FIGS. 6 to 19 are views for illustrating steps or processes involved in the semiconductor device manufacturing method according to the third embodiment of the invention. In FIGS. 4 to 19, the constituents or components similar to those described previously by reference to FIGS. 1 to 3 are denoted by like reference symbols, and repeated description in detail of these components will be omitted.

When the through electrode is formed in the conventional semiconductor device such as shown in FIG. 2, a deep hole 25 having a high aspect ratio is formed in a semiconductor substrate 21, and an insulation film 26 is formed on the inner surface of the hole 25, which is then followed by a step in which the insulation film 26 is coated with a matrix metal layer 27 for plating, as shown in FIG. 4.

Subsequently, the hole 25 is filled with a metal through a plating process to thereby form the through electrode 12 mentioned previously by reference to FIG. 2, as shown in FIG. 5.

Now, description will turn to a method of manufacturing the semiconductor device having the through electrode 12 according to the invention.

Figure 6:
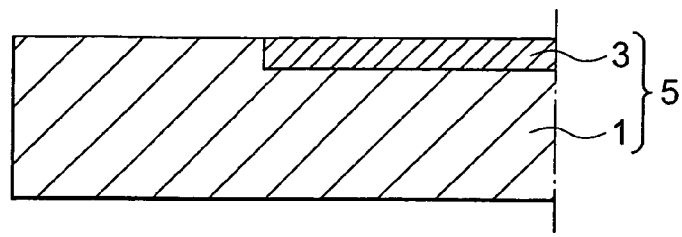
FIG. 6 is a view for illustrating a circuit forming step in a method of manufacturing a semiconductor device according to a third embodiment of the present invention.

At first, in a step shown in FIG. 6, the first semiconductor circuit 3 including a connecting terminal portion is formed in the first semiconductor substrate 1 of p- or n-type having a predetermined electric resistivity or resistance.

Figure 7:
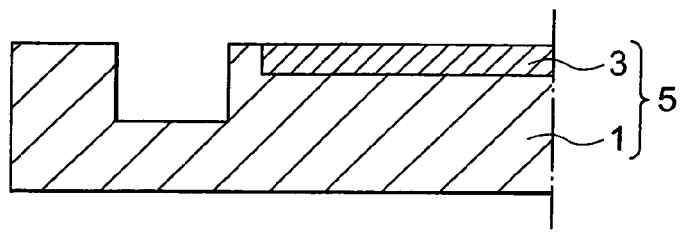
FIG. 7 is a view for illustrating a hole forming step in the semiconductor device manufacturing method according to the third embodiment of the present invention.

In succession, in a step shown in FIG. 7, a hole of a predetermined depth is formed in the first semiconductor substrate 1 at a location adjacent to the peripheral portion of the first semiconductor circuit 3.

In this conjunction, the depth of the hole formed in the first semiconductor substrate 1 is so selected that it is greater than the thickness which can effectively ensure operation of the semiconductor element and that mechanical damage which the first semiconductor substrate 1 may undergo during a process or step of machining the first semiconductor substrate (described later on) does not practically affect the operative layer (i.e., active layer). By way of example, the depth of the hole may be selected on the order of 10 μm or more.

When the depth of the hole is selected to be excessively great upon formation of the hole in the first semiconductor substrate 1, various difficulties will be encountered. To evade such difficulties, the hole should be formed as shallow as possible with the aspect ratio being selected in a range of about 1 (one) to 2. By way of example, when the hole diameter is selected on the order of 10 μm from the practical standpoint, then the depth of the hole or the thickness of the first semiconductor device, to say in another way, should preferably be selected to be in the range of about 10 to 20 μm, i.e., not greater than 20 μm, by taking into account the aspect ratio mentioned above.

Figure 8:
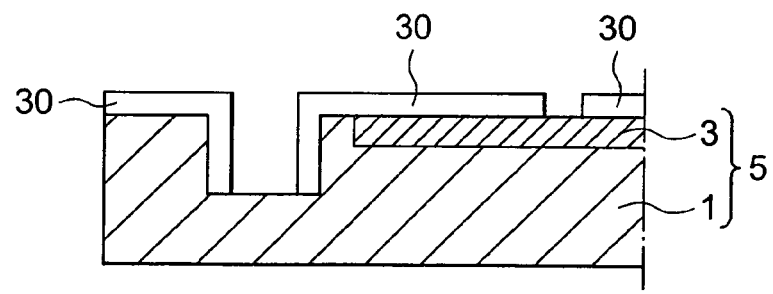
FIG. 8 is a view for illustrating an insulation film forming step in the semiconductor device manufacturing method according to the third embodiment of the present invention.

Subsequently, in a step shown in FIG. 8, an insulation film (e.g. $SiO_2$) 30 is deposited on the first semiconductor substrate. In succession, those portions of the insulation film 30 which are deposited on the bottom of the hole formed in the step shown in FIG. 7 and the connecting terminal portion formed in the first semiconductor circuit 3 at a predetermined position are removed by etching.

Figure 9:
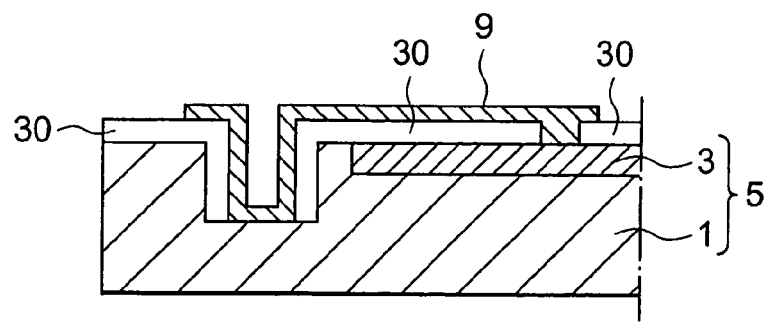
FIG. 9 is a view for illustrating a wiring conductor layer forming step in the semiconductor device manufacturing method according to the third embodiment of the present invention.

Next, in a step shown in FIG. 9, a metal film 9 is deposited in a manner illustrated in the figure. This metal film 9 serves as the matrix for the plating process which will be described hereinafter. In succession, the metal film 9 is processed to thereby form the wiring conductor pattern (which may also be referred to as the connecting conductor and wiring conductor layer). The metal film 9 is also formed on the bottom of the hole from which the insulation film 30 has been removed and the lateral wall of the hole.

Figure 10:
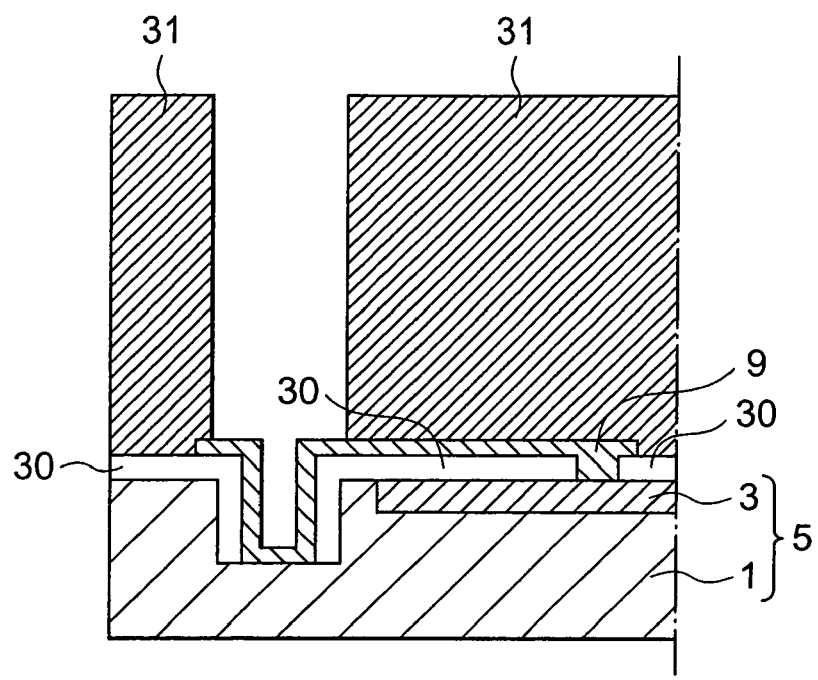
FIG. 10 is a view for illustrating a resist pattern forming step in the semiconductor device manufacturing method according to the third embodiment of the present invention.

In a next step shown in FIG. 10, a photoresist layer 31 is applied, whereon a photoresist pattern (also referred to as the resist pattern 31) of a predetermined thickness in which the top portion of the hole formed in the step shown in FIG. 7 is opened is formed through a photoengraving process.

In that case, the thickness of the photoresist pattern 31 should be so selected as to be slightly greater than the height of the column-like through electrode 12 which is subsequently to be formed by plating. By way of example, the thickness of the photoresist pattern 31 may be in a range of about 50 μm to 100 μm.

Figure 11:
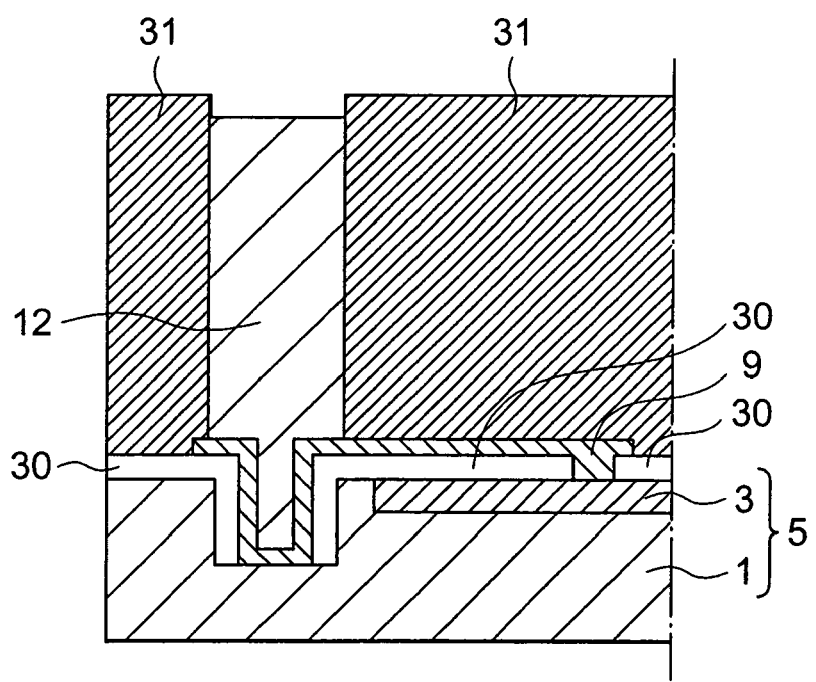
FIG. 11 is a view for illustrating a through electrode forming step in the semiconductor device manufacturing method according to the third embodiment of the present invention.

In succession, in a step shown in FIG. 11, a metal such as Cu is buried within the opening of the resist pattern 31 by a plating process with the first semiconductor substrate 1 being used as a cathode by taking advantage of the electrical conductivity of the substrate 1.

In that case, a metallic material suited as the matrix for the metal plating such as Cu is deposited at least on the outermost surface of the connecting conductor layer 9 formed in the step shown in FIG. 9.

Figure 12:
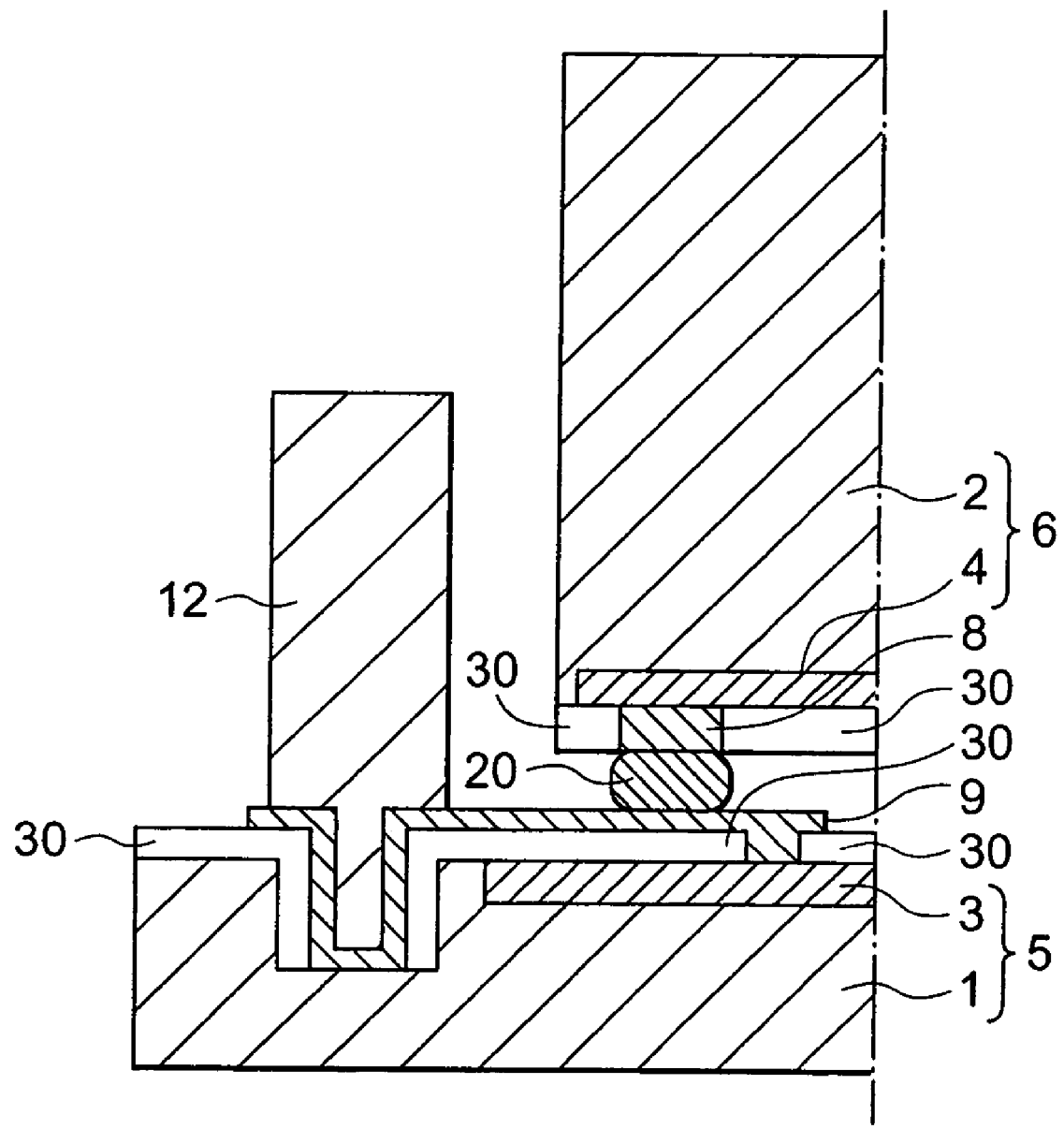
FIG. 12 is a view for illustrating an element interconnecting step in the semiconductor device manufacturing method according to the third embodiment of the present invention.

By the way, the second semiconductor element 6 which includes the second semiconductor circuit 4 formed in the second semiconductor substrate 2 and the bump electrode 20 is prepared in advance as the discrete element, as shown in FIG. 12.

The photoresist 31 formed in the step shown in FIG. 10 is removed, whereon the first semiconductor element 5 including the first semiconductor circuit 3 formed in the first semiconductor substrate 1 on one hand and the second semiconductor element 6 including the second semiconductor circuit 4 formed in the second semiconductor substrate 2 on the other hand are positionally aligned with each other so that the surfaces in which the circuits 3 and 4 are formed, respectively, face in opposition to each other. Subsequently, the first semiconductor element 5 and the second semiconductor element 6 are connected to each other by the bump electrode 20 interposed therebetween.

In that case, the second semiconductor element 6 is disposed on the inner side of the column formed by plating to serve as the through electrode 12. The thickness of the second semiconductor element 6 may be greater than the height (thickness) of the column 12 formed by plating. By way of example, the thickness of the second semiconductor element 6 may be in the range of 500 μm to 700 μm which is substantially ten times as great as the height of the column 12 formed by plating.

Figure 13:
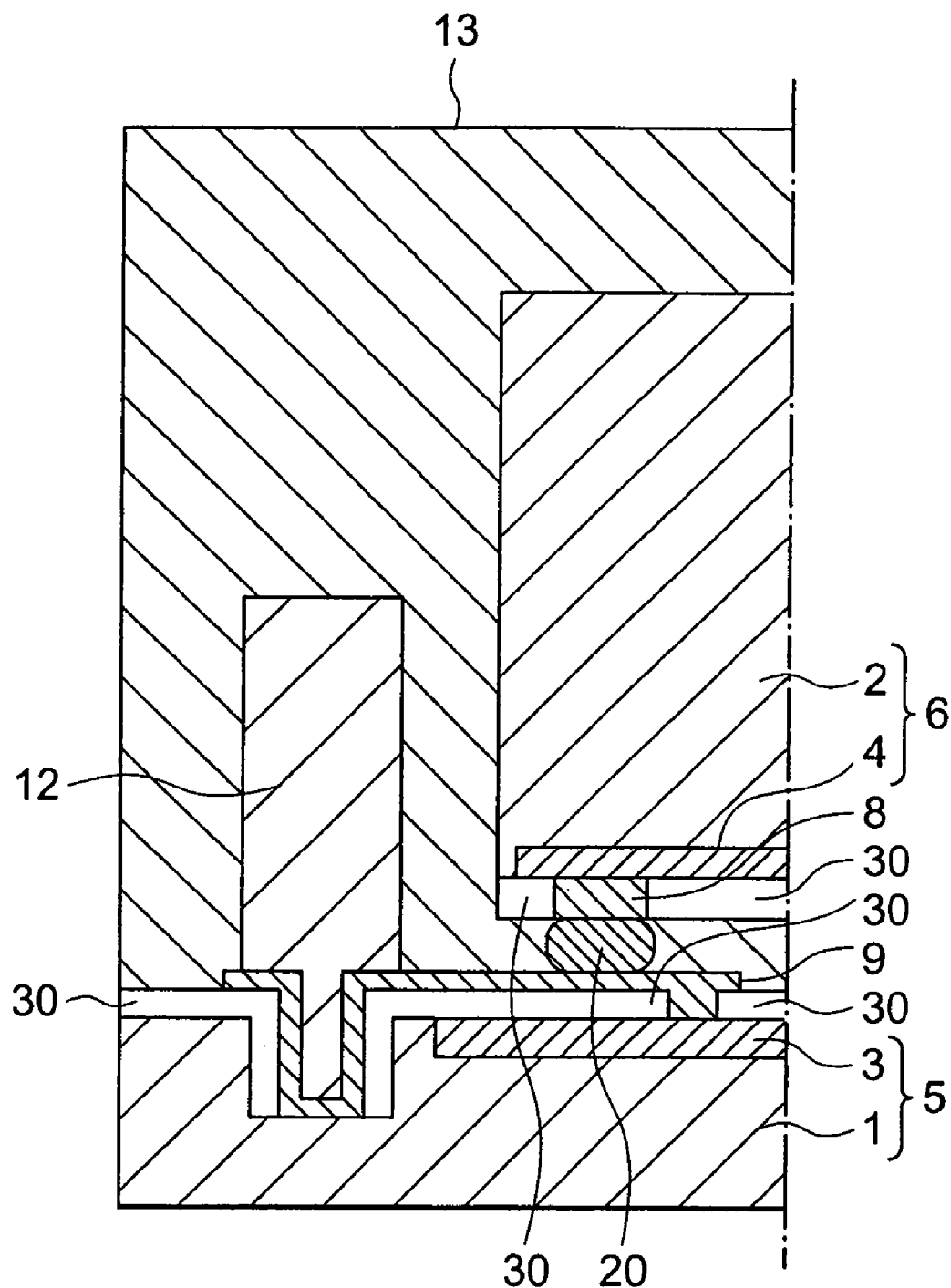
FIG. 13 is a view for illustrating an insulation material coating step in the semiconductor device manufacturing method according to the third embodiment of the present invention.

Subsequently, in a step shown in FIG. 13, the second semiconductor element 6 and the column formed by plating on the first semiconductor substrate 1 to serve as the through electrode 12 are coated with an insulation material 13 such as an epoxy resin which initially exhibits a high fluidity and which can -easily be hardened after curing so that the second semiconductor element 6 and the through electrode 12 are all embedded in a mass of the insulation material 13.

Figure 14:
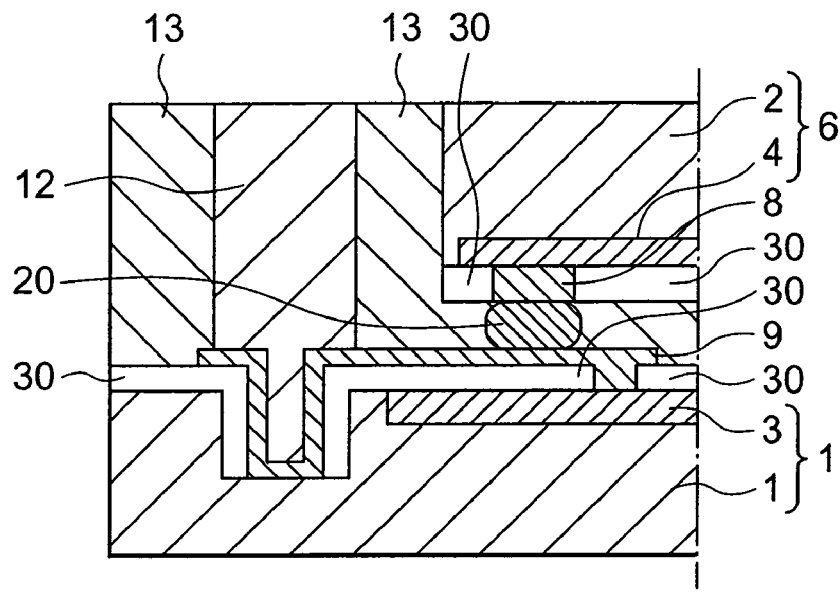
FIG. 14 is a view for illustrating an insulation coating grinding step in the semiconductor device manufacturing method according to the third embodiment of the present invention.

In a step shown in FIG. 14, the insulation material (resin) 13 is removed by grinding from the surface in which the second semiconductor element 6 is formed until the top portion of the through electrode (top portion of the column formed by metal plating) 12 is exposed.

In that case, since the second semiconductor element 6 has a greater thickness than the height of the column 12, the back surface of the second semiconductor element 6 is also exposed.

Figure 15:
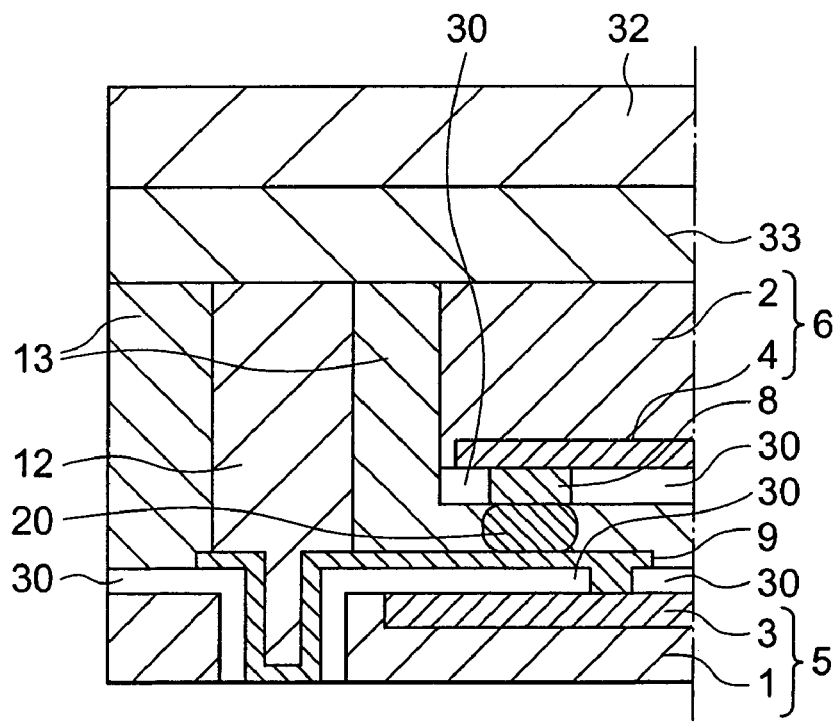
FIG. 15 is a view for illustrating a back surface grinding step in the semiconductor device manufacturing method according to the third embodiment of the present invention.

In a step shown in FIG. 15, a supporting member 32 is bonded to the ground and exposed surface of the second semiconductor element 6 with an adhesive layer 33 interposed therebetween. In succession, the back surface of the first semiconductor substrate 1 (i.e., the surface located oppositely to the surface in which the first semiconductor circuit 3 is formed) is ground until the back surface of the conductor layer 9 deposited on the bottom of the through electrode or the hole therefor is exposed.

Figure 16:
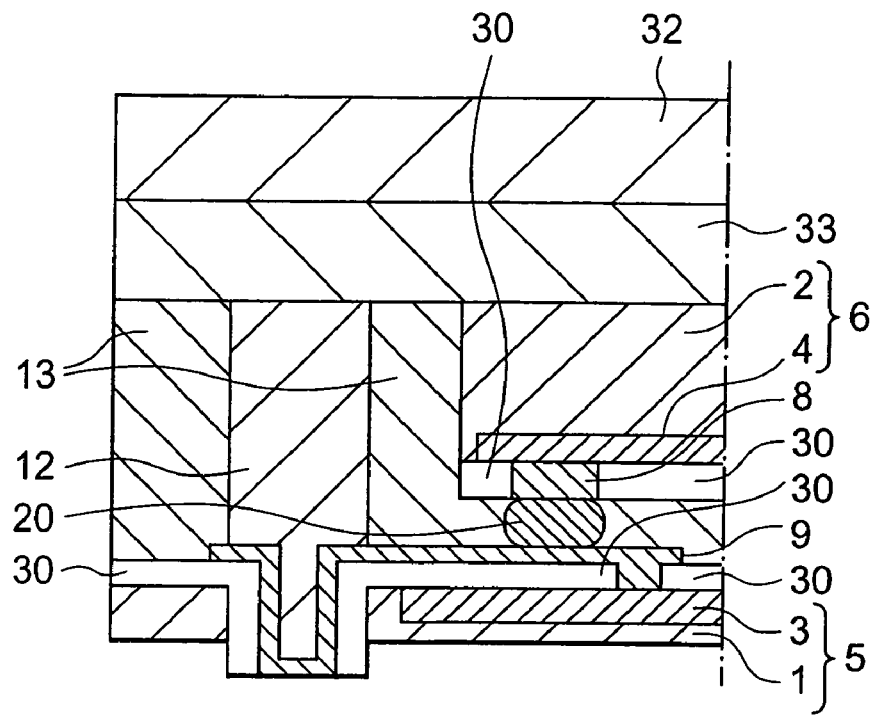
FIG. 16 is a view for illustrating a substrate back surface etching step in the semiconductor device manufacturing method according to the third embodiment of the present invention.

In a step shown in FIG. 16, semiconductor substrate material of the first semiconductor substrate 1 itself is partially etched away by a predetermined amount in order to eliminate those portions of the back surface of the first semiconductor substrate 1 which are injured by the machine grinding, as occasion requires.

Figure 17:
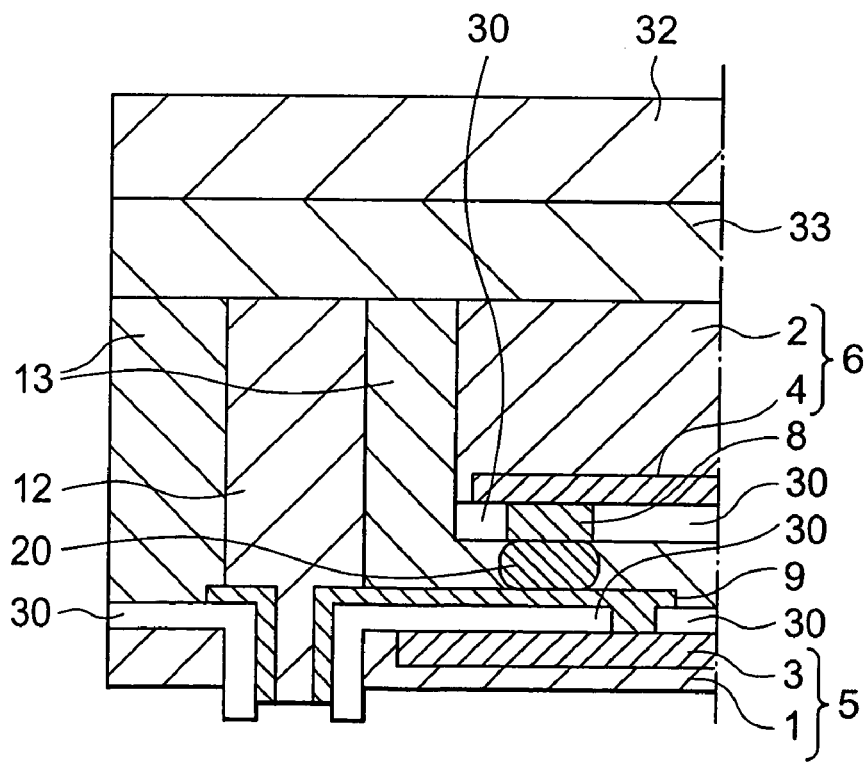
FIG. 17 is a view for illustrating a step of etching a bottom portion of a through electrode in the semiconductor device manufacturing method according to the third embodiment of the present invention.

Additionally, in a step shown in FIG. 17, the metal layer 9 deposited at the bottom of the through electrode or the very bottom portion of the through electrode itself is partially etched away by a predetermined amount with a view to eliminating the injuries taken place in the machine grinding, as the case may be.

In this conjunction, it should however be mentioned that either the etching of the first semiconductor substrate 1 or that of the bottom portion of the through electrode or both of them may be spared. Of course, the sequential order of the etching processes mentioned above can be interchanged. The bottom of the through electrode can be used as the terminal for external connection.

Figure 18:
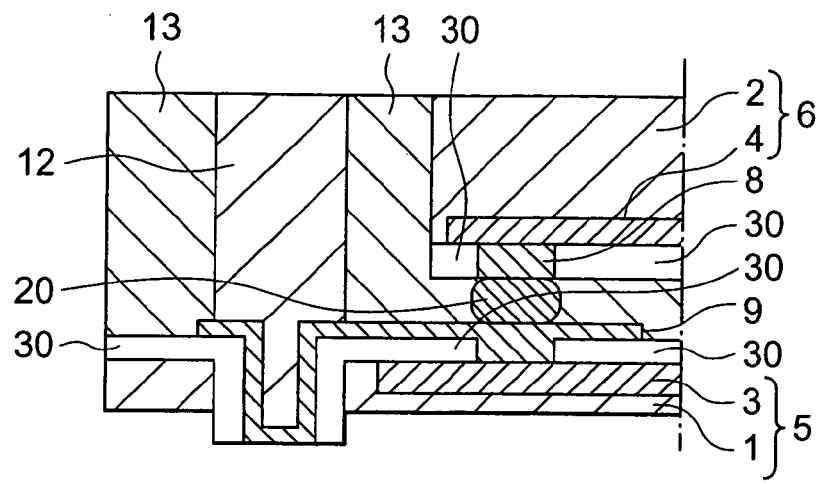
FIG. 18 is a view for illustrating a supporting member removing step in the semiconductor device manufacturing method according to the third embodiment of the present invention.

Finally, in a step shown in FIG. 18, the adhesive layer 33 and the supporting member 32 are stripped off. Thus, the structure of the semiconductor device having the through electrode such as described previously by reference to FIG. 3 can be realized.

At this juncture, it is to be added that the height of the through electrode 12 as measured from the first semiconductor substrate 1 should preferably be determined by selecting the aspect ratio to be small. However, when the aspect ratio is excessively small, the overall thickness of the semiconductor substrates (combination of the first semiconductor substrate 1 and the second semiconductor substrate 2) is decreased, which will result in that the bending strength or rigidity of the composite semiconductor substrate will become lowered. Under the circumstances, the overall thickness of the semiconductor substrates should preferably be on the order of 100 μm or less on the condition that the maximum thickness of the layer of the plated metal buried in the hole or opening formed in the photoresist layer 31 deposited in a thickness appropriate from the practical viewpoint is in a range of 50 μm to 100 μm.

Figure 19:
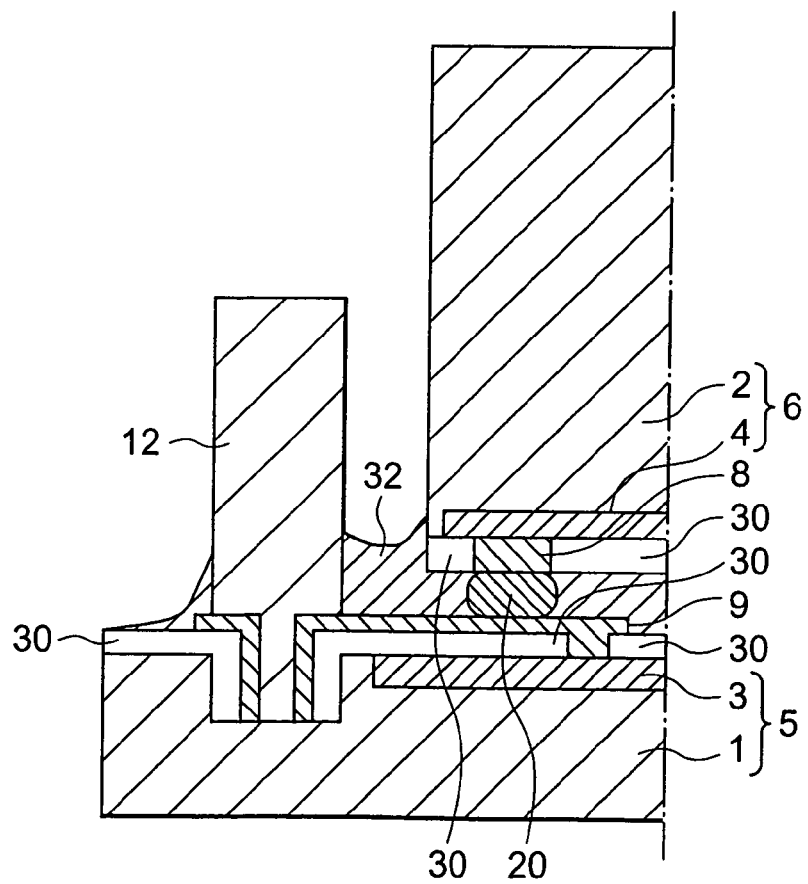
FIG. 19 is a view for illustrating a reinforcing step in the semiconductor device manufacturing method according to the third embodiment of the present invention.

FIG. 19 is a view illustrating a modification of the process described above. More specifically, in precedence to the coating with the insulation material 13 described in conjunction with the step shown in FIG. 13, the first semiconductor substrate 1, the second semiconductor substrate 2 and the through electrode 12 are precoated with a non-conductive paste (NCP) and subsequently they are coated with the insulation material 13 such as a resin after flip chip bonding (FCB) with a view to enhancing the strength and reliability by employing the non-conductive paste (NCP).

In that case, a non-conductive film (NCF), an anisotropic conductive paste (ACP) or an anisotropic conductive film (ACF) may be employed in place of the non-conductive paste (NCP), substantially to the same effect.

In the conventional semiconductor device manufacturing process, difficulty has been encountered in forming the through electrode with regards to etching of the hole 25 having a great depth and a large aspect ratio, deposition of the insulation film 26 on the hole 25 with an acceptable coating quality and deposition of the matrix metal 27 for plating.

Besides, when the hole 25 is deep, the hole burying plating process which is not accompanied with formation of cavities is difficult to be carried out. More specifically, since metal growth will occur on the lateral wall of the hole as well, cavity is easily produced at a location such as a top portion of the hole where the fluidity of the plating solution is high and where electrolysis is likely to occur concentratively. For this reason, it has been difficult to bury the hole by plating while suppressing formation of the cavity or cavities.

By contrast, in the manufacture of the semiconductor device having the through electrode according to the method of the invention which includes the processes or steps described above, there arises no necessity of resorting to the techniques for forming the deep hole for formation of the through electrode, forming the insulation film of high coating susceptibility over the lateral wall of the hole, and for suppressing occurrence of the cavity at or around the center portion of the hole due to high plating rate on the hole wall at the top portion thereof.

More specifically, according to the teachings of the present invention incarnated in the instant embodiment, the hole of a small aspect ratio is formed, while the through electrode is formed only through the electroplating from the bottom of the hole. Thereafter, the surrounding surface of the through electrode is coated with the insulation material. Thus, it is unnecessary to deposit the insulation film on the major portion of the lateral wall of the electrode where the coating is difficult. Further, it is not required to deposit on the lateral wall of the hole the metal film destined to serve as the cathode for the electroplating. By virtue of these features, the through electrode can be formed with ease without being accompanied with any cavity formation.

Further, it should be added that according to the teachings of the invention incarnated in the instant embodiment thereof, the semiconductor device can easily be manufactured with an enhanced integration density approximately twice as high as that of the semiconductor device known heretofore.

Embodiment 4

Figure 20:
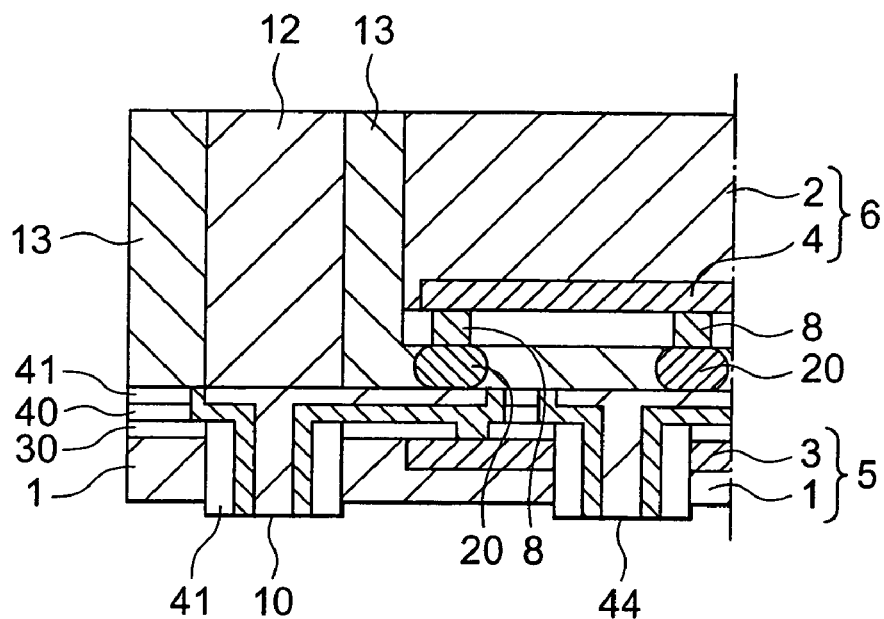
FIG. 20 is a sectional view showing a semiconductor device according to a fourth embodiment of the present invention.
Figure 21:
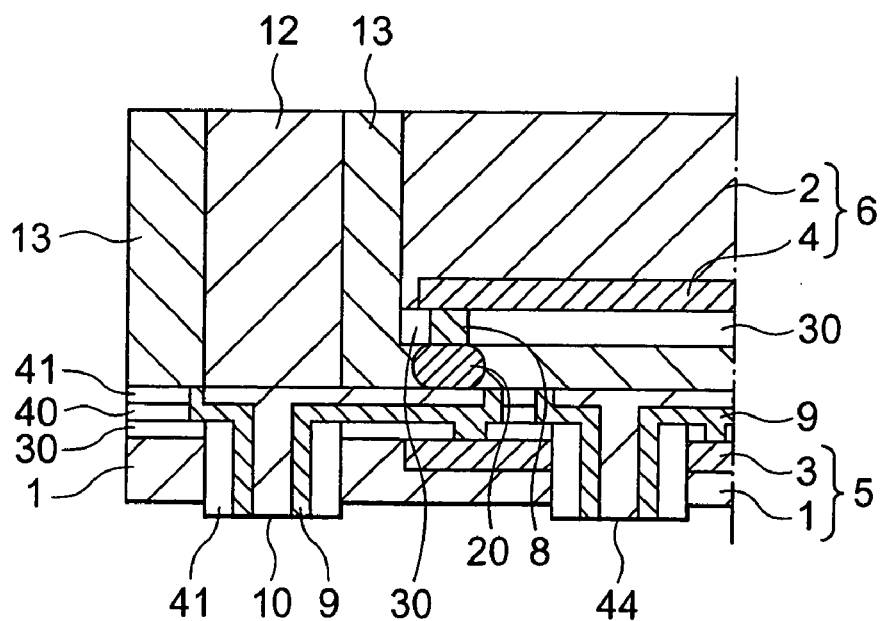
FIG. 21 is a sectional view showing a version of the semiconductor device according to the fourth embodiment of the present invention.

FIGS. 20 and 21 are sectional views showing semiconductor devices according to a fourth embodiment of the present invention. In these figures, the constituents or components similar to those described previously in conjunction with the first to third embodiments of the invention by reference to FIGS. 1 to 19 are denoted by like reference symbols, and repeated description in detail of these components will be omitted.

Referring to FIGS. 20 and 21, in the semiconductor device according to the instant embodiment of the invention, a first additional external terminal 44 is additionally provided in a region of the first semiconductor substrate 1 facing oppositely to the second semiconductor element 6 so as to extend through the first semiconductor substrate 1.

In the semiconductor device shown in FIG. 20, the first additional external terminal 44 is connected to the second semiconductor element 6 through the medium of the bump electrode 20. In the semiconductor device shown in FIG. 21, the first additional external terminal 44 is connected to the first semiconductor circuit 3 of the first semiconductor element 5 by way of the connecting conductor 9.

As can easily be appreciated, in the semiconductor devices according to the instant embodiment of the invention, the first and second semiconductor circuits 3 and 4 can be connected in various forms through the medium of the first external terminal 10 and the first additional external terminal 44, whereby the degree of freedom in design of the semiconductor device can significantly be enhanced.

Embodiment 5

A fifth embodiment of the present invention is directed to a method of manufacturing the semiconductor devices according to the fourth embodiment of the invention. FIGS. 22 to 28 are views for illustrating steps or processes involved in the semiconductor device manufacturing method according to the fifth embodiment of the invention. In FIGS. 22 to 28, the constituents or components similar to those described previously in conjunction with the first to fourth embodiments of the invention (refer to FIGS. 1 to 21) are denoted by like reference symbols, and repeated description in detail of these components will be omitted.

Figure 22:
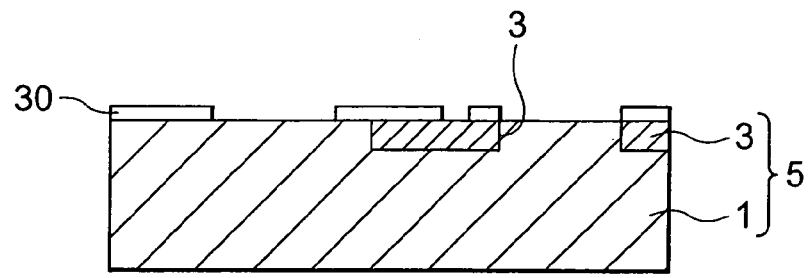
FIG. 22 is a view for illustrating a step of forming a first semiconductor circuit in a semiconductor device manufacturing method according to a fifth embodiment of the present invention.

In a step shown in FIG. 22, first semiconductor circuits 3 are formed in the p- or n-type substrate having a predetermined resistance. In this conjunction, it is to be mentioned that the regions in which the first semiconductor circuits 3 are to be formed are previously covered with insulation films 30 except for the locations where the holes and the connecting portions (electrodes) are to be formed.

Figure 23:
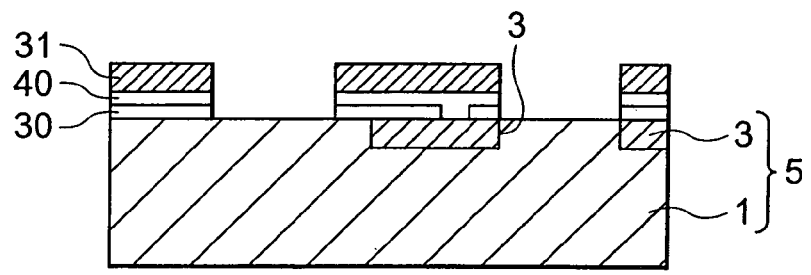
FIG. 23 is a view for illustrating an insulation film/resist deposition step in the semiconductor device manufacturing method according to the fifth embodiment of the present invention.

In a step shown in FIG. 23, first insulation films 40 are additionally deposited over the top surfaces of the insulation films 30, whereon a photoresist film 31 is formed on the first insulation films 40 in a predetermined thickness. Subsequently, the portions for forming holes are removed.

Figure 24:
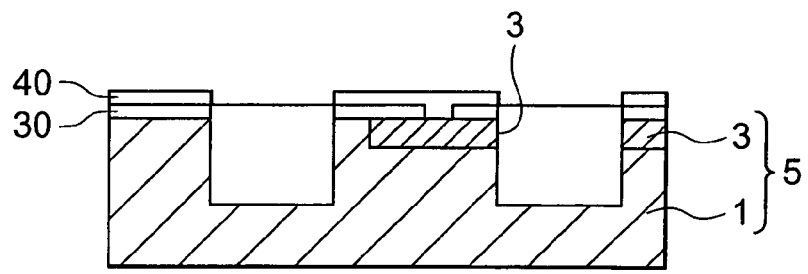
FIG. 24 is a view for illustrating a hole forming step in the semiconductor device manufacturing method according to the fifth embodiment of the present invention.

In a step shown in FIG. 24, holes of a predetermined depth are formed in the first semiconductor substrate 1 at two locations, respectively, by using the first insulation film 40 as the mask.

Figure 25:
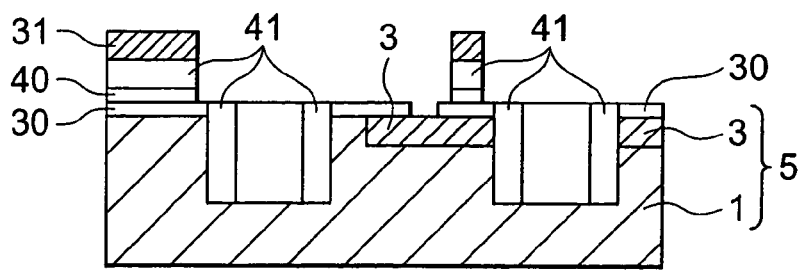
FIG. 25 is a view for illustrating a second insulation film deposition step in the semiconductor device manufacturing method according to a fifth embodiment of the present invention.

Substantially, in a step shown in FIG. 25, a second insulation film 41 is deposited on the top surface of the first insulation film 40. Further, all the insulation films formed on the bottom of the holes and the connecting portions (electrodes) formed at the predetermined locations of the first semiconductor circuits 3 and additionally the second insulation film 41 on the portion which is to form the connecting conductor 9 are all removed.

Figure 26:
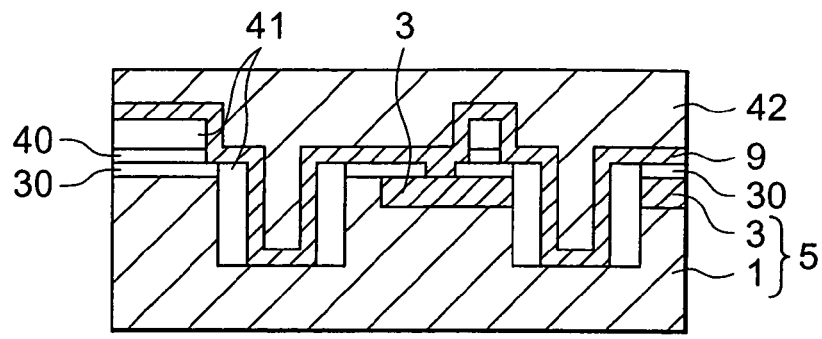
FIG. 26 is a view for illustrating a metal layer plating step in the semiconductor device manufacturing method according to the fifth embodiment of the present invention.

In a step shown in FIG. 26, the metal film 9 which is to serve as the matrix for the plating is deposited on the top surface of the first semiconductor substrate 1. In addition, the top surface of the first semiconductor substrate 1 inclusive of the hole, the connecting portion and the wiring conductor layer 9 is electroplated to form a plated metal layer 42 by making use of the metal film 9 or the first semiconductor substrate 1 as the cathode.

Figure 27:
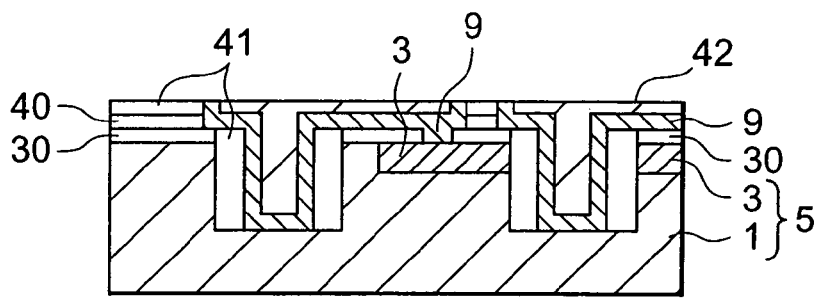
FIG. 27 is a view for illustrating a metal layer polishing step in the semiconductor device manufacturing method according to the fifth embodiment of the present invention.

Next, in a step shown in FIG. 27, the plated metal layer 42 formed on the whole surface is ground by a chemical-mechanical polishing (CMP) until the second insulation film 41 is exposed.

In that case, the metal layers deposited on the hole, the connecting portion and the wiring conductor layer 9 formed concavely due to the second insulation film 41 remain unremoved.

Figure 28:
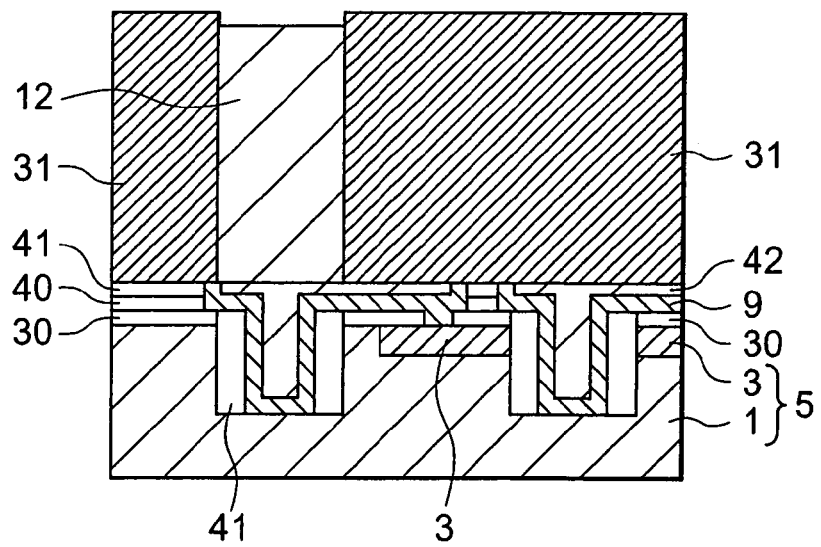
FIG. 28 is a view for illustrating a photoresist pattern forming step in the semiconductor device manufacturing method according to the fifth embodiment of the present invention.

In a step shown in FIG. 28, a resist pattern 31 in which the through electrode forming portion is opened is formed on the ground or polished surface, whereon a metal is buried into the opening portion of the resist pattern 31 through electroplating process with the first semiconductor substrate 1 being used as the cathode.

Subsequently, the first semiconductor substrate 1 and the second semiconductor element 6 are interconnected to form the semiconductor device(s) having the through electrode 12 as shown in FIGS. 20 and 21 through the processes similar to those described hereinbefore by reference to FIGS. 12 to 18.

In this way, the through electrode can be formed without resorting to the technique or process which is difficult to carry out as in the case of the prior art. Further, the semiconductor device having a plurality of external terminals can easily be fabricated with approximately twice as large integration density as the conventional semiconductor device.

Incidentally, although the foregoing description has been made that the present invention is applied to a so-called dual machine, it should be appreciated that the semiconductor device of the similar structure can be fabricated by adopting the metal film pattern formation based on the photoetching and the hole burying electroplating.

Embodiment 6

Figure 29:
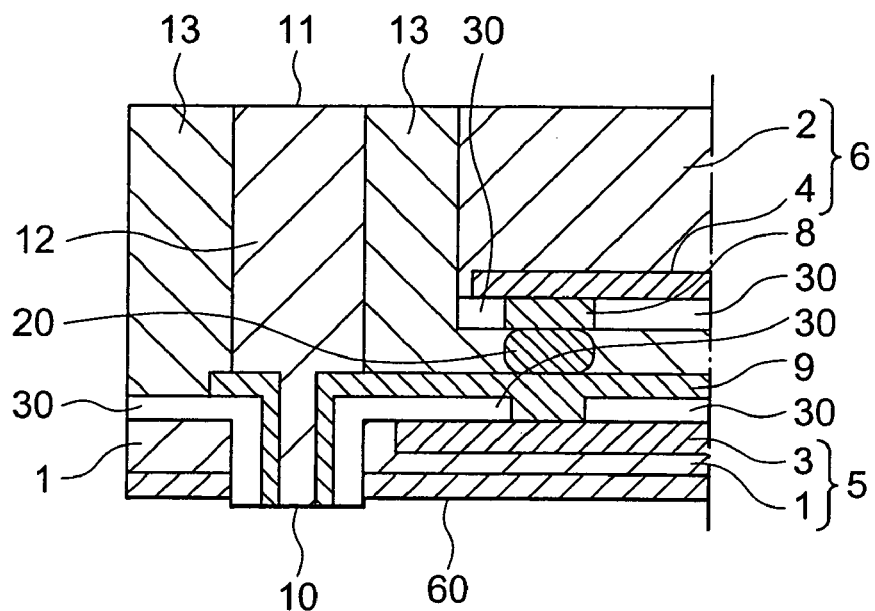
FIG. 29 is a sectional view showing a semiconductor device according to a sixth embodiment of the present invention.

FIG. 29 is a sectional view showing a semiconductor device according to a sixth embodiment of the present invention. In this figure, the constituents or components similar to those described previously in conjunction with the first to fifth embodiments of the invention by reference to FIGS. 1 to 28 are denoted by like reference symbols, and repeated description in detail of these components will be omitted.

Referring to FIG. 29, in the semiconductor device according to the instant embodiment of the invention, an insulation film (back-surface insulation film) 60 is deposited on the surface of the first semiconductor substrate 1 in which the first external terminal 10 is formed. By virtue of this structure, electrical/chemical stability of the semiconductor device can be improved, whereby reliability thereof can be enhanced.

Embodiment 7

Figure 30:
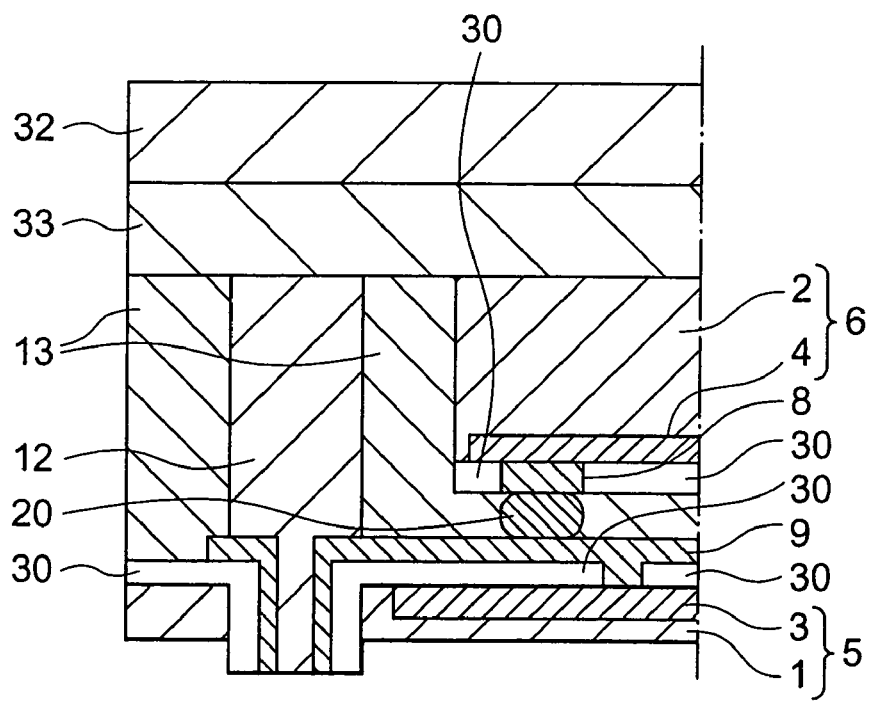
FIG. 30 is a view for illustrating a substrate back surface grinding step in a method of manufacturing a semiconductor device according to a seventh embodiment of the present invention.
Figure 31:
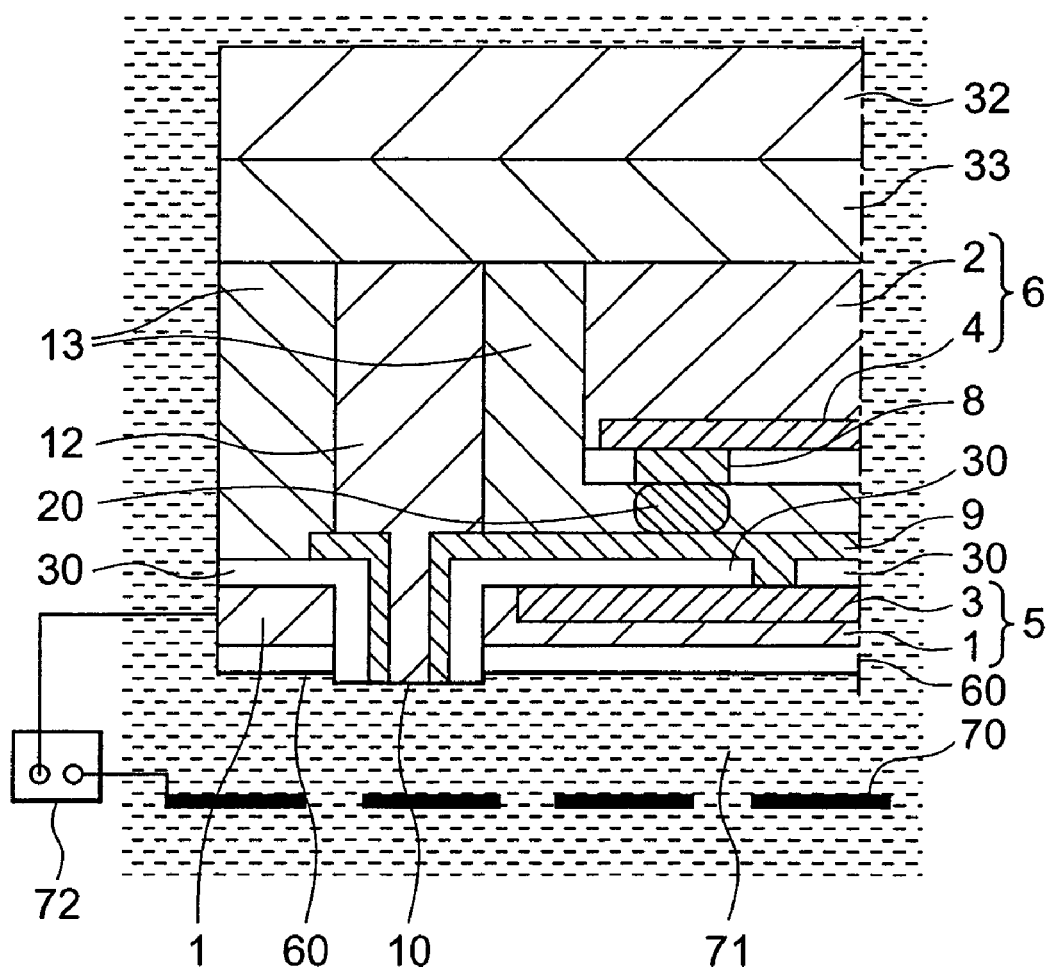
FIG. 31 is a view for illustrating an electroplating step of forming a back surface insulation film in the semiconductor device manufacturing method according to the seventh embodiment of the present invention.
Figure 32:
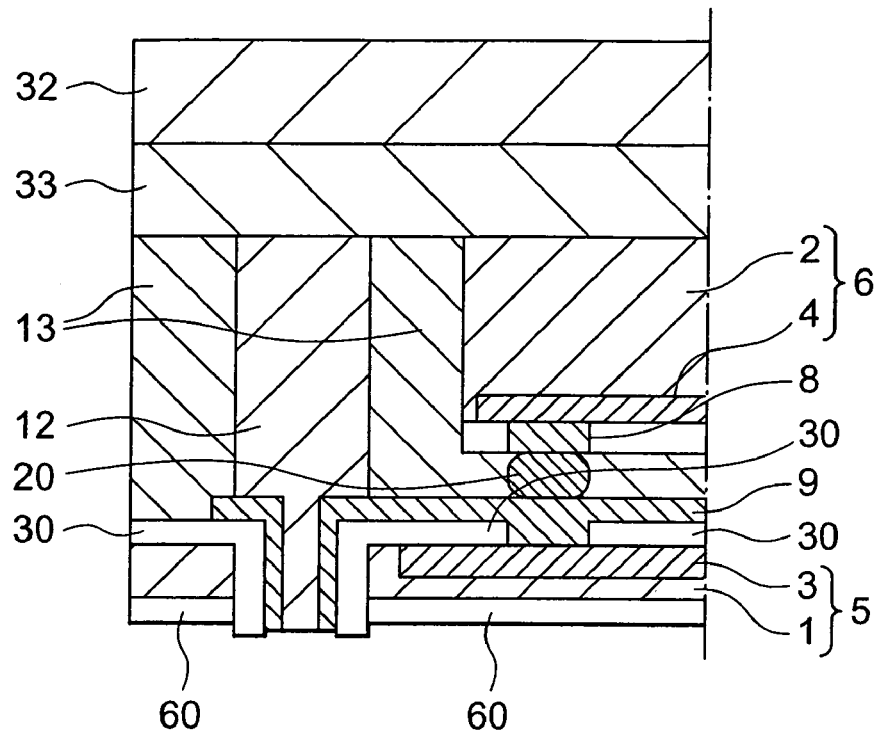
FIG. 32 is a view for illustrating a through electrode bottom exposing step in the semiconductor device manufacturing method according to the seventh embodiment of the present invention.

A seventh embodiment of the present invention is directed to a method of forming the back-surface insulation film 60 in the semiconductor device according to the sixth embodiment of the present invention. FIGS. 30 to 32 are views for illustrating steps or processes involved in the method of forming the back-surface insulation film 60 according to the seventh embodiment of the invention. In FIGS. 30 to 32, the constituents or components similar to those described previously in conjunction with the first to sixth embodiments of the invention by reference to FIGS. 1 to 29 are denoted by like reference symbols, and repeated description in detail of these components will be omitted.

In a step shown in FIG. 30, the semiconductor substrate material itself is etched away by a predetermined amount in order to eliminate those portions of the back surface of the first semiconductor substrate 1 which are injured by the machine grinding, as described hereinbefore in conjunction with the step shown in FIG. 16.

Subsequently, in a step shown in FIG. 31, one electrode of a power supply 72 is electrically connected to the first semiconductor substrate 1 of the semiconductor device which is immersed in a solution 71 while the other electrode of the power supply 72 is connected to an electrode array (opposite electrode array) 70 which is disposed in opposition to the surface of the first semiconductor substrate 1 in which the first external terminal 10 is exposed, to thereby cause an electric current to flow through the first semiconductor substrate 1. Then, only the exposed portion of the first semiconductor substrate 1 itself undergoes anode oxidation, whereby the back-surface insulation film 60 is formed.

Although it has been described that the electrode array 70 is disposed in opposition to the surface of the first semiconductor substrate 1 in which the first external terminal 10 is exposed, the invention is not necessarily restricted to such disposition.

In a step shown in FIG. 32, the portion of the connecting conductor layer 9 formed around the first external terminal 10 is removed to thereby expose the bottom portion of the through electrode 12.

In this manner, the back-surface insulation film 60 can be formed relatively easily and selectively, i.e., only over the exposed portion of the first semiconductor substrate 1 expect the bottom portion of the through electrode 12.

As a variation, an insulative organic film can selectively be formed over the exposed surface of the first semiconductor substrate 1 through an electrodeposition coating process as well.

Further, it goes without saying that such a process can equally be employed that includes deposition of the insulation film and elimination of the electrode by etching, as known generally in this art.

Embodiment 8

Figure 33:
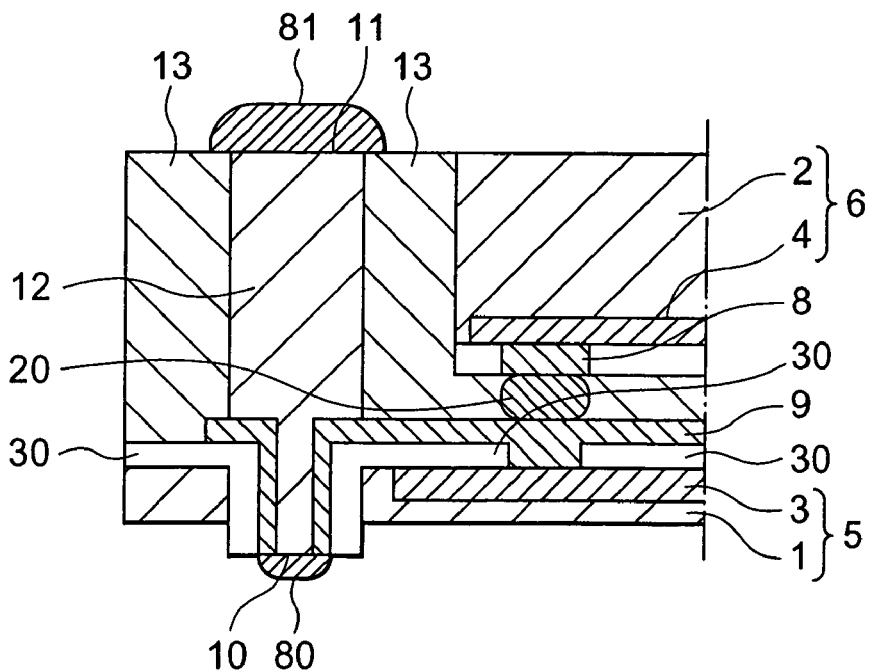
FIG. 33 is a sectional view showing a semiconductor device according to an eighth embodiment of the present invention.

FIG. 33 is a sectional view showing a semiconductor device according to an eighth embodiment of the present invention. In this figure, the components similar to those described previously in conjunction with the first to seventh embodiments of the invention by reference to FIGS. 1 to 32 are denoted by like reference symbols, and repeated description in detail of these components will be omitted.

Referring to FIG. 33, in the semiconductor device according to the instant embodiment of the invention, at least one of the first and second external terminals 10 and 11 is provided with a first protruding electrode 80 or a second protruding electrode 81 with a view to facilitating the electrical connection with the external terminal.

Embodiment 9

A ninth embodiment of the present invention is directed to a method of forming the second protruding electrode 81 in the semiconductor device according to the eighth embodiment of the invention. FIGS. 34 to 37 are views for illustrating steps or processes involved in the method of forming the second protruding electrode 81 according to the ninth embodiment of the invention. In these figures, the constituents or components similar to those described previously in conjunction with the first to eighth embodiments of the invention by reference to FIGS. 1 to 33 are denoted by like reference symbols, and repeated description in detail of these components will be omitted.

Figure 34:
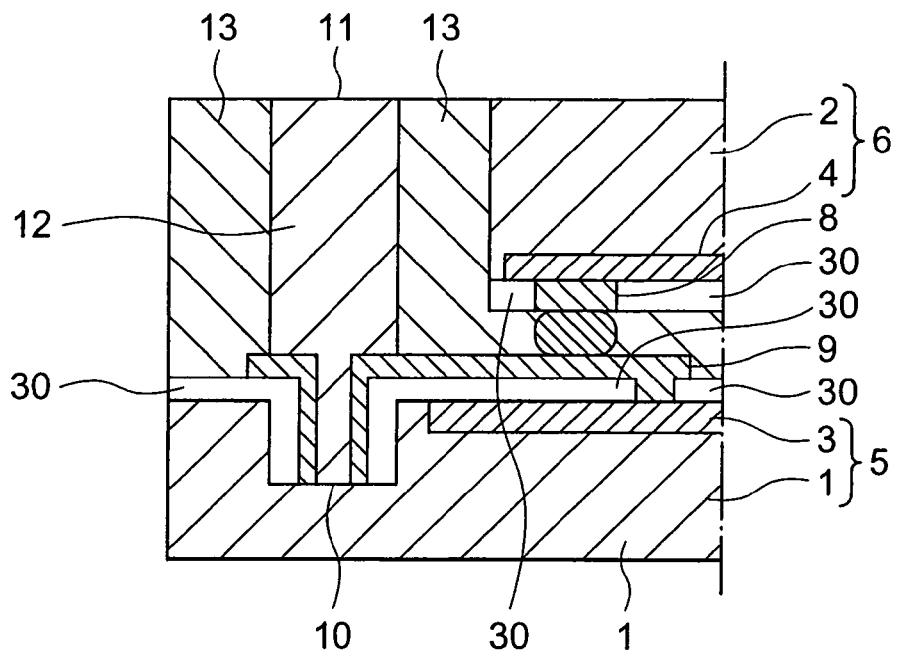
FIG. 34 is a view for illustrating a through electrode exposing step in a semiconductor device manufacturing method according to a ninth embodiment of the present invention.

In a step shown in FIG. 34, the insulation material 13 is removed by grinding the semiconductor device from the side on which the second semiconductor element 6 is mounted until the through electrode 12 is exposed, as described hereinbefore in conjunction with the step shown in FIG. 14.

Subsequently, in a step shown in FIG. 35, the semiconductor device is immersed in an electroplating solution 90, whereon one terminal of the power supply 72 is electrically connected to the first semiconductor substrate 1 while connecting the other terminal of the power supply 72 to an electrode array 70 disposed in opposition to the surface of the semiconductor device in which the through electrode 12 is exposed, whereon the electroplating is performed on the exposed top portion of the through electrode 12 by using the electrode array 70 as anode while using the first semiconductor substrate 1 as cathode, to thereby form a second protruding electrode 81.

Although it has been described above that the electrode array 70 is disposed in opposition to the surface of the semiconductor device in which the through electrode 12 is exposed, the invention is not necessarily restricted to such disposition.

Figure 36:
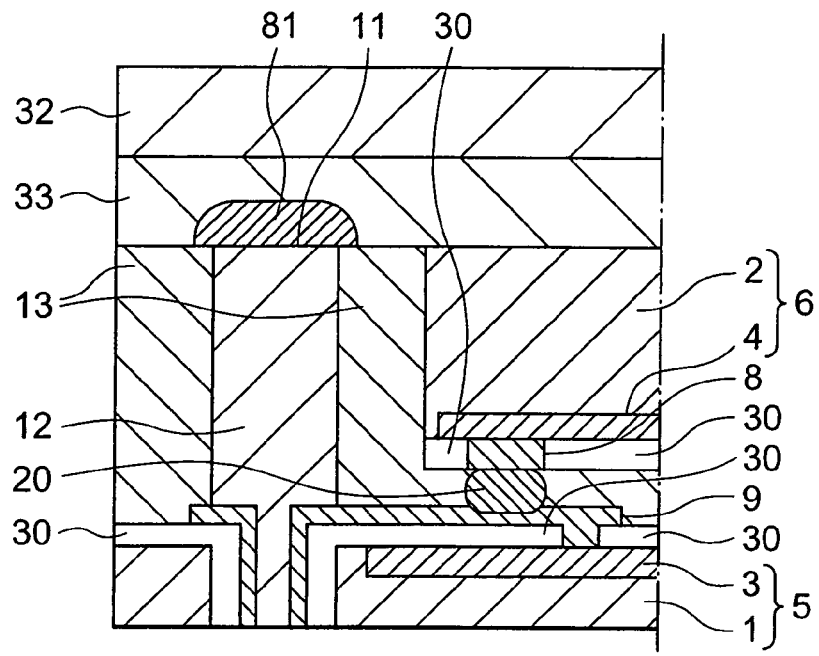
FIG. 36 is a view for illustrating a step of exposing a wiring conductor layer at a hole bottom in the semiconductor device manufacturing method according to the ninth embodiment of the present invention.

Next, in a step shown in FIG. 36, a supporting member 32 is bonded to the semiconductor device on the side at which the second semiconductor element 6 is located by using an interposed adhesive layer 33, whereon the grinding process is carried out for removing the substrate material from the back surface of the first semiconductor substrate 1 until the back surface of the wiring conductor layer 9 deposited on the bottom of the hole or the bottom of the through electrode 12 is exposed, as described hereinbefore in conjunction with the step shown in FIG. 15.

Figure 37:
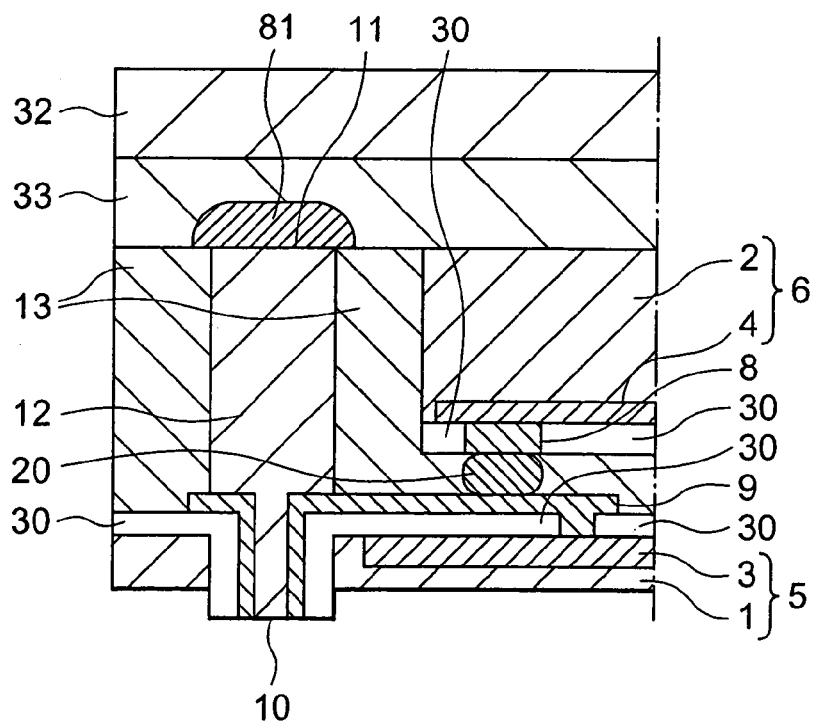
FIG. 37 is a view for illustrating a first semiconductor substrate etching step in the semiconductor device manufacturing method according to the ninth embodiment of the present invention.

Subsequently, in a step shown in FIG. 37, substrate material is removed by a predetermined amount from the first semiconductor substrate 1 by etching.

Figure 35:
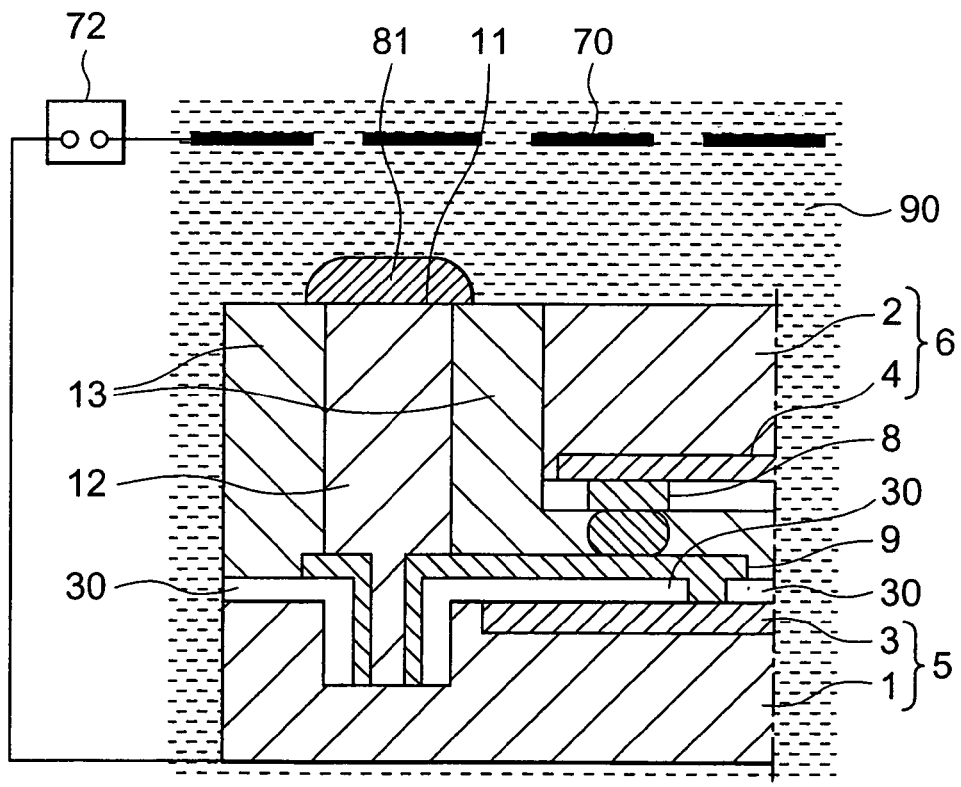
FIG. 35 is a view for illustrating a step of forming a second protruding electrode by plating in the semiconductor device manufacturing method according to the ninth embodiment of the present invention.

In the stage shown in FIG. 35, the first semiconductor substrate 1 and the through electrode 12 are electrically shortcircuited. Accordingly, by resorting to the electroplating step described above, the protruding electrode 81 can easily be formed only on the second external terminal 11.

Embodiment 10

A tenth embodiment of the present invention is directed to a method of forming the first protruding electrode 80 in the semiconductor device according to the eighth embodiment of the present invention. FIGS. 38 to 41 are views for illustrating steps or processes involved in the method of forming the first protruding electrode 80 according to the eighth embodiment of the invention. In FIGS. 38 to 41, the constituents or components similar to those described previously in conjunction with the first to ninth embodiments of the invention by reference to FIGS. 1 to 37 are denoted by like reference symbols, and repeated description in detail of these components will be omitted.

Figure 38:
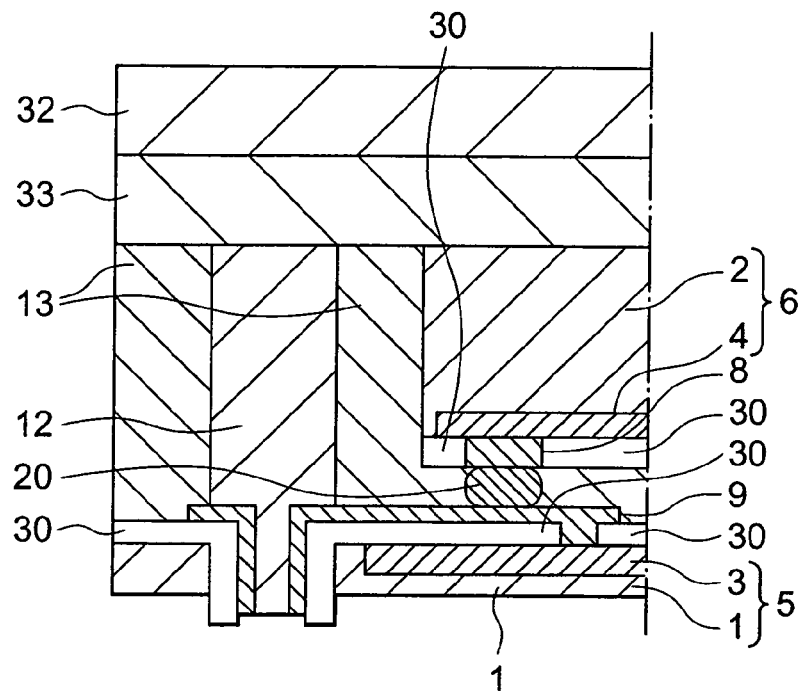
FIG. 38 is a view for illustrating a through electrode bottom portion etching step in a semiconductor device manufacturing method according to a tenth embodiment of the present invention.
Figure 39:
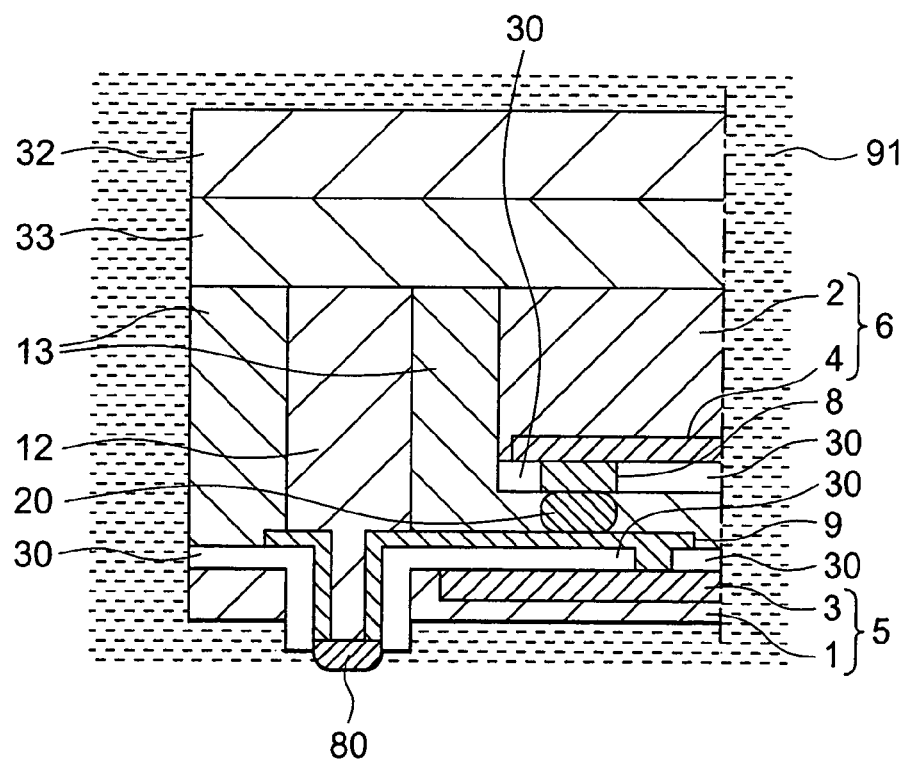
FIG. 39 is a view for illustrating a step of forming a first protruding electrode by plating in the semiconductor device manufacturing method according to the tenth embodiment of the present invention.
Figure 40:
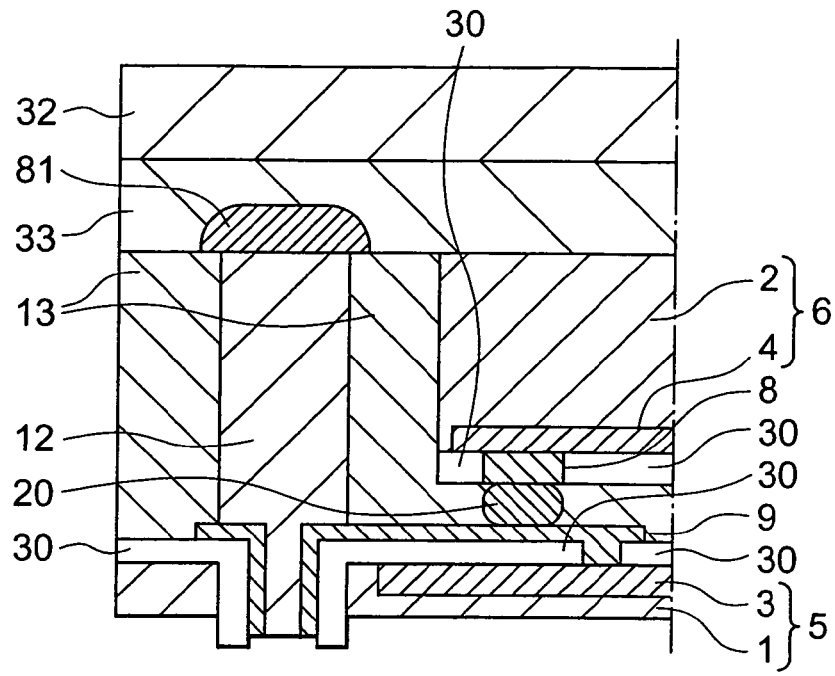
FIG. 40 is a view for illustrating a step similar to that shown in FIG. 38 in the semiconductor device manufacturing method according to a version of the tenth embodiment of the present invention.

In a step shown in FIG. 38, the matrix metal layer forming the bottom portion of the through electrode 12 is removed, which is then followed by a step shown in FIG. 39 in which the first protruding electrode 80 is formed only on the metal matrix exposed on the bottom portion of the through electrode 12 by an electroless plating in the state in which the semiconductor device is immersed in an electroless plating solution 91, similarly to the step described hereinbefore by reference to FIG. 15 or FIG. 16.

Figure 41:
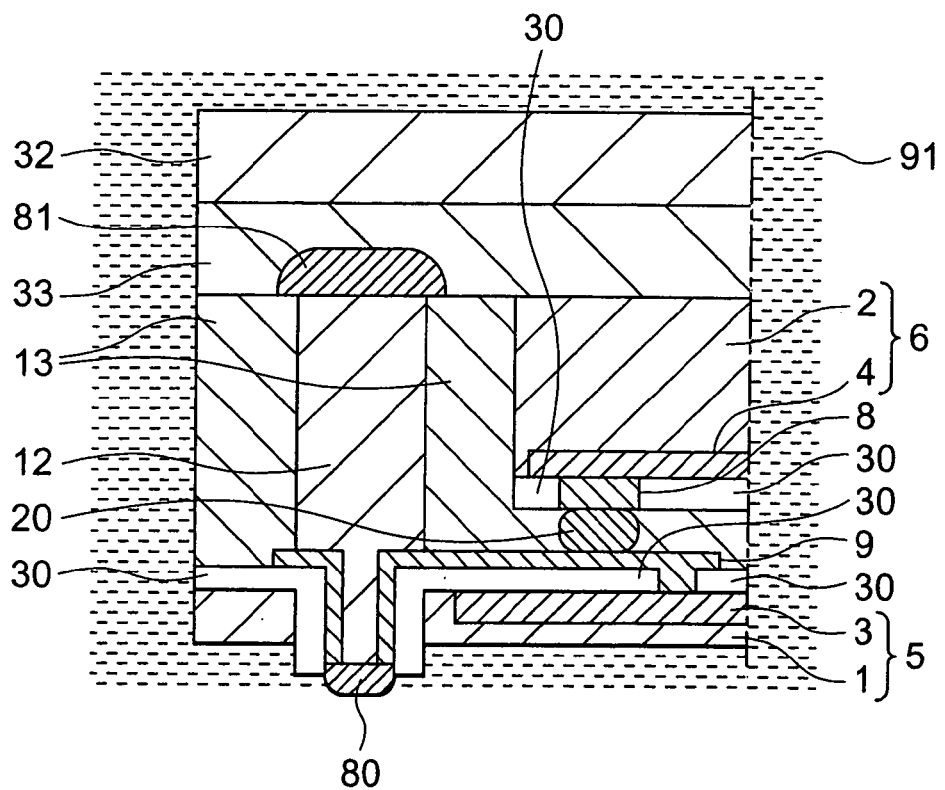
FIG. 41 is a view for illustrating a step similar to that shown in FIG. 39 according to the version of the tenth embodiment of the present invention.

Subsequently, after the process described hereinbefore by reference to FIG. 37, the matrix metal layer of the bottom portion of the through electrode 12 is removed, whereon the first protruding electrode 80 is formed on the exposed bottom portion of the through electrode 12 through electroless plating process in a step shown in FIG. 41 similarly to the step described previously by reference to FIG. 39.

By way of example, when the through electrode 12 is formed of Cu, the protruding electrode can easily be formed through an electroless nickel (Ni) plating or the like process by taking advantage of the property that the electroless-plated film (e.g. Ni) grows selectively only on the metal (Cu) matrix exposed on the bottom portion of the through electrode.

Embodiment 11

Figure 42:
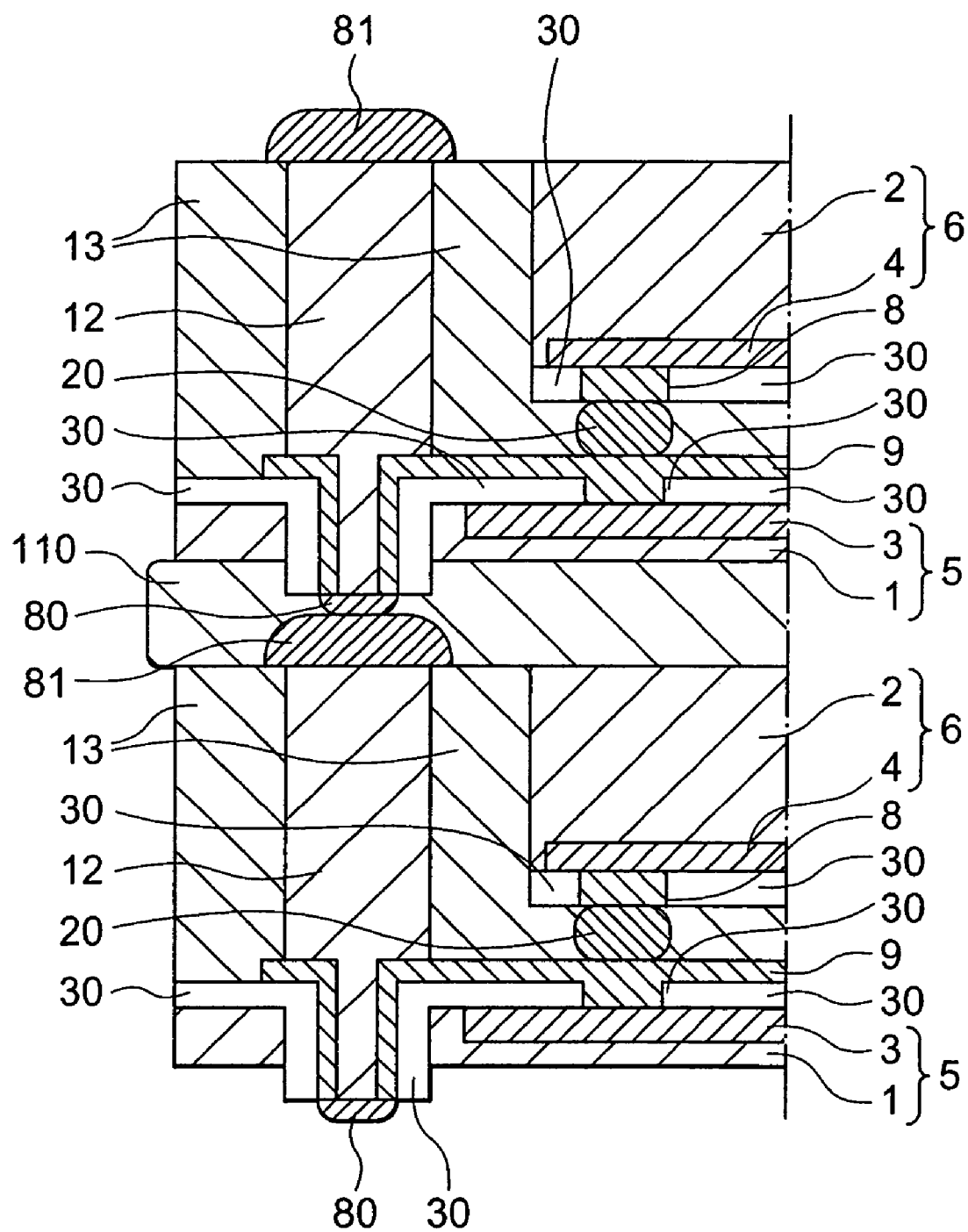
FIG. 42 is a sectional view showing a semiconductor device according to an eleventh embodiment of the present invention.

FIG. 42 is a sectional view showing a semiconductor device of a stack type according to an eleventh embodiment of the present invention.

Incidentally, in FIG. 42, the parts or components similar to those described hereinbefore by reference to FIGS. 1 to 41 are denoted by like reference symbols and repeated description in detail thereof is omitted.

The semiconductor device shown in FIG. 42 is implemented in a stacked structure in which a plurality of semiconductor devices described heretofore are stacked one to another.

More specifically, in the semiconductor device of the stacked structure shown in FIG. 42, two semiconductor devices are stacked together in the vertical direction with the first protruding electrode 80 and the second protruding electrode 81 being contacted to each other.

As can be seen in the figure, there is formed a layer 110 of a resin between the surface of the top-side semiconductor device on which the first protruding electrode 80 is provided on one hand and the surface of the bottom-side semiconductor device on which the second protruding electrode 81 is located on the other hand, wherein the first and second protruding electrodes 80 and 81 of the top- and bottom-side semiconductor devices are positioned in contact with each other.

By stacking a plurality of semiconductor devices in a so-called laminated structure as described above, not only the integration density but also the operation speed can be increased because the signal transmission paths can be shortened.

At this juncture, it should be added that the individual semiconductor elements may differ from one another so long as the positions of the through electrodes 12 are same.

Further, in the case of the semiconductor device stack shown in FIG. 42, the bump electrodes (fist and second protruding electrodes 80 and 81) are formed on both the top and bottom sides of the semiconductor device. However, the bump electrode may be formed only on one side without any adverse influence to the operation.

Embodiment 12

Figure 43:
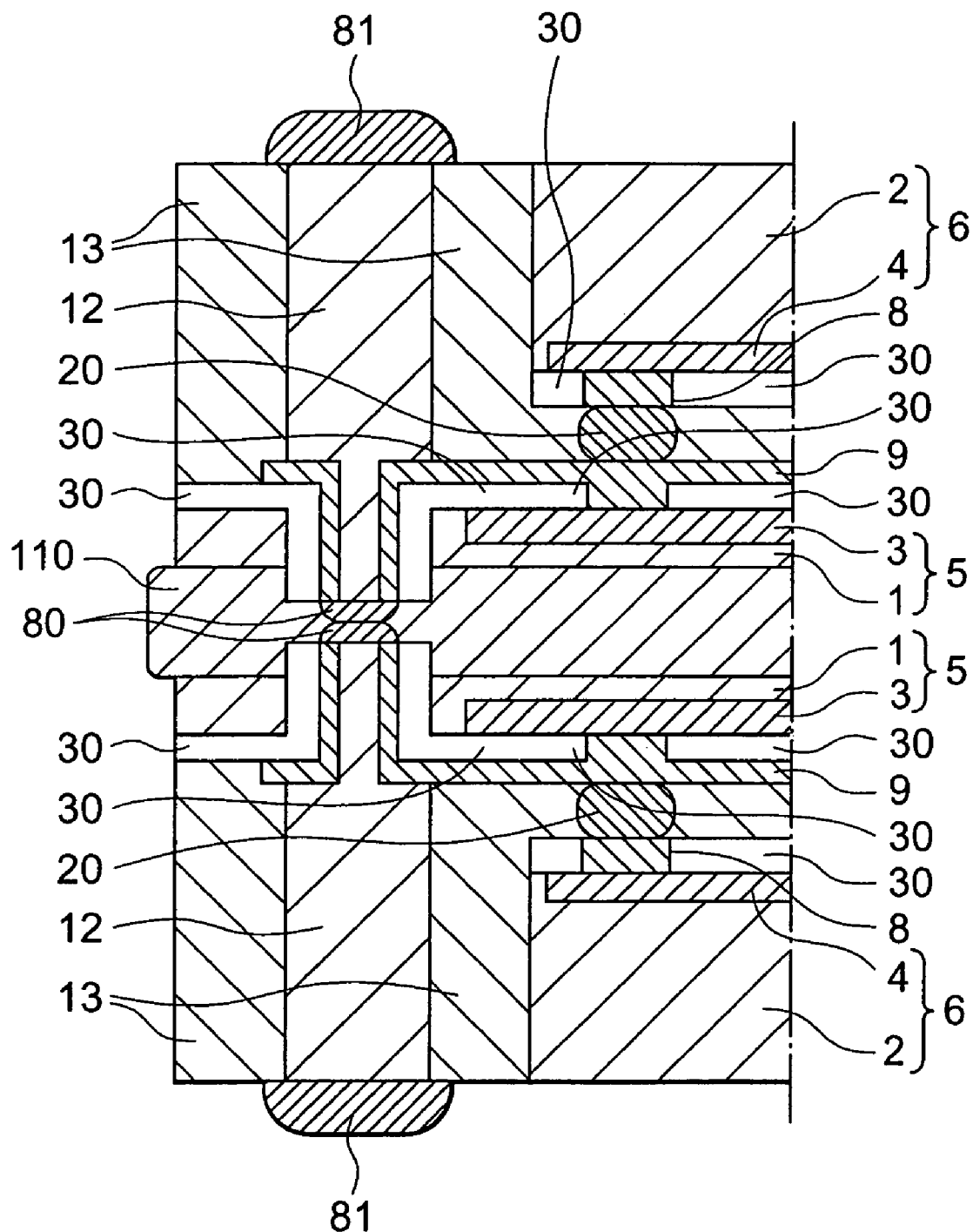
FIG. 43 is a sectional view showing a semiconductor device according to a twelfth embodiment of the present invention.

FIG. 43 is a sectional view showing a semiconductor device of a stacked type (also referred to as the integrated semiconductor device stack) according to a twelfth embodiment of the present invention.

Incidentally, in FIG. 43, the parts or components similar to those described hereinbefore by reference to FIGS. 1 to 42 are denoted by like reference symbols and repeated description in detail thereof is omitted.

In the semiconductor device stack shown in FIG. 43, two semiconductor devices described previously are stacked in the vertical direction with the respective first protruding electrodes 80 being positioned in contact with each other.

As can be seen in the figure, there is formed a resin layer 110 between the surfaces of the top- and bottom-side semiconductor devices on which the first protruding electrodes 80 are provided, respectively, wherein the first protruding electrodes (80) of the both semiconductor devices are contacted to each other.

In each of the semiconductor devices of the integrated semiconductor device stack shown in FIG. 43, the distance between the back surface of the first semiconductor substrate 1 and the first semiconductor circuit (activated layer) 3 is short. For this reason, in the case where the semiconductor device is employed discretely, it is susceptible to the influence of external disturbance. Besides, from the mechanical standpoint, the semiconductor device is rather feeble. Accordingly, by stacking the semiconductor devices in opposition to each other as shown in FIG. 43, there can also be realized a function for protecting the individual semiconductor devices.

In that case, the insulation film formed on the back surfaces of the first semiconductor substrates in the semiconductor device stack may be spared without incurring degradation in the operation reliability owing to the protecting function mentioned above.

Embodiment 13

Figure 44:
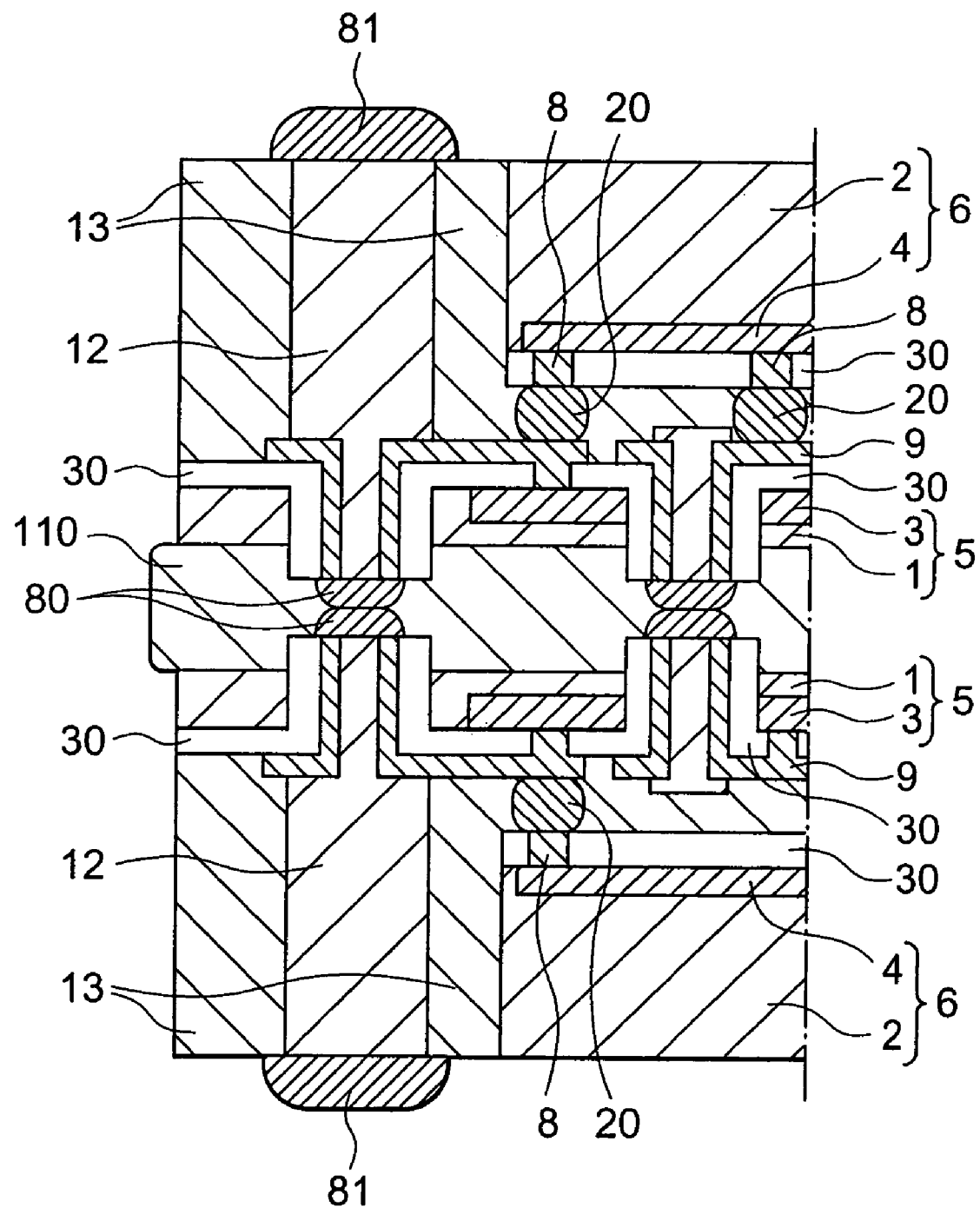
FIG. 44 is a sectional view showing a semiconductor device according to a thirteenth embodiment of the present invention.
Figure 45:
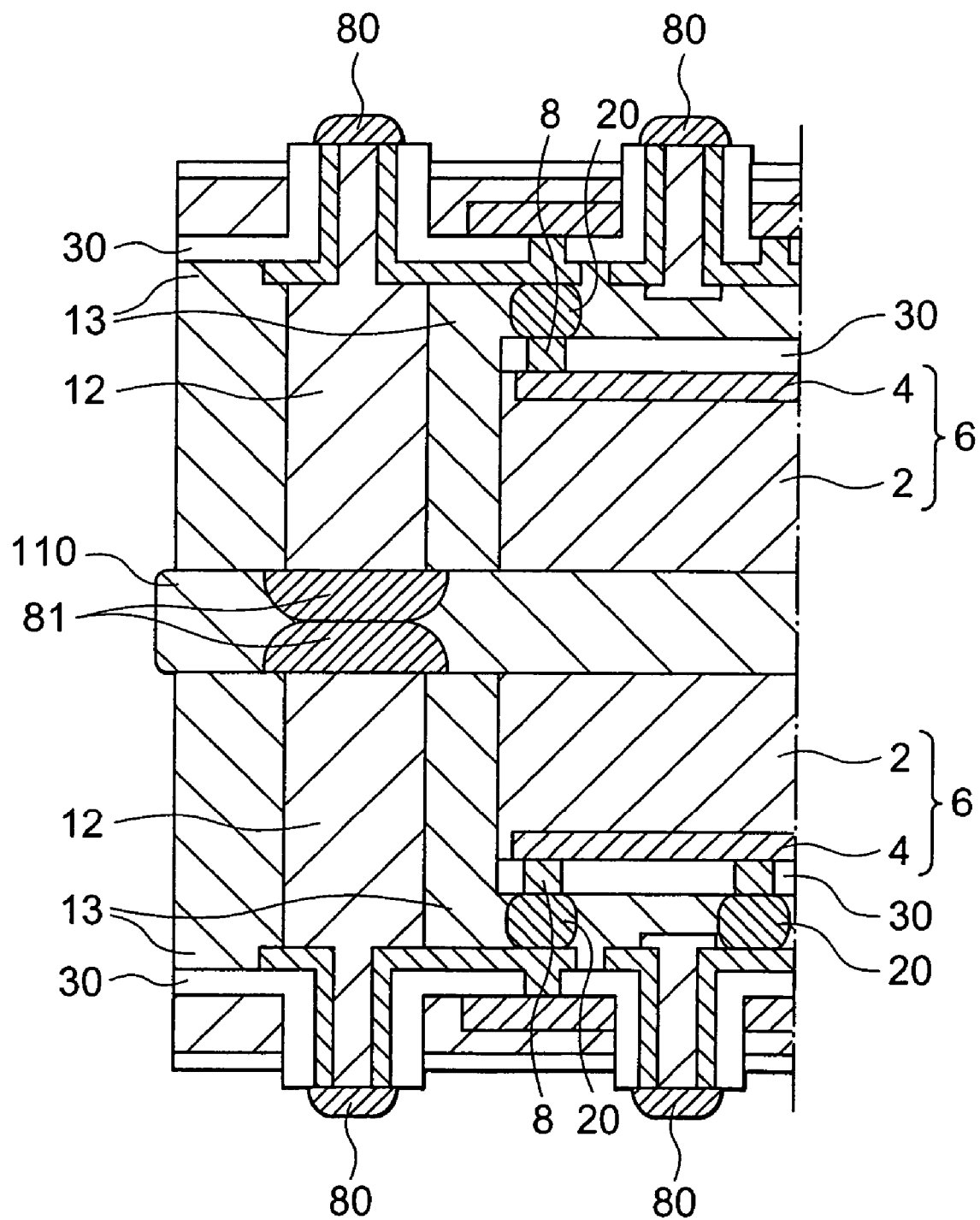
FIG. 45 is a sectional view showing a modification of the semiconductor device according to the thirteenth embodiment of the present invention.

FIGS. 44 and 45 are sectional views showing a stack type semiconductor device according to a thirteenth embodiment of the present invention.

Incidentally, in FIGS. 44 and 45, the parts or components similar to those described hereinbefore by reference to FIGS. 1 to 43 are denoted by like reference symbols and repeated description in detail thereof is omitted.

In the integrated semiconductor device stack shown in FIG. 44, the semiconductor devices each equipped with the first additional external terminal 44 as described hereinbefore in conjunction with the fourth embodiment of the invention are stacked together with the first protruding electrodes formed on both the first external terminals and the first additional external terminals, respectively, being interconnected, whereas in the integrated semiconductor device stack shown in FIG. 45, the semiconductor devices are stacked together with the respective second protruding electrodes 80 being contacted to each other.

In the integrated semiconductor device stack shown in FIG. 44 in which the first semiconductor elements 5 are stacked with the back surfaces thereof being disposed in opposition to each other, as shown in FIG. 44, the number of the terminals can be increased while the signal transmission paths can be shortened. Thus, the semiconductor device stack can effectively be employed in such application where high-speed signal processing on a large scale has to be executed internally of the semiconductor device stack.

On the other hand, in the semiconductor device stack shown in FIG. 45 in which two semiconductor devices are stacked together with the respective second semiconductor elements 6 being disposed in opposition to each other, there are available a greater number of terminals for external connection when compared with the structure shown in FIG. 44. Thus, the integrated semiconductor device stack shown in FIG. 45 can advantageously be employed in the application where signal processings have to be executed on a large scale basis with external devices or equipment.

Embodiment 14

FIGS. 46, 47, 48 and 49 are sectional views showing semiconductor devices according to a fourteenth embodiment of the present invention.

Incidentally, in FIGS. 46 to 49, the constituents or components similar to those described hereinbefore by reference to FIGS. 1 to 45 are denoted by like reference symbols and repeated description in detail thereof is omitted.

Figure 46:
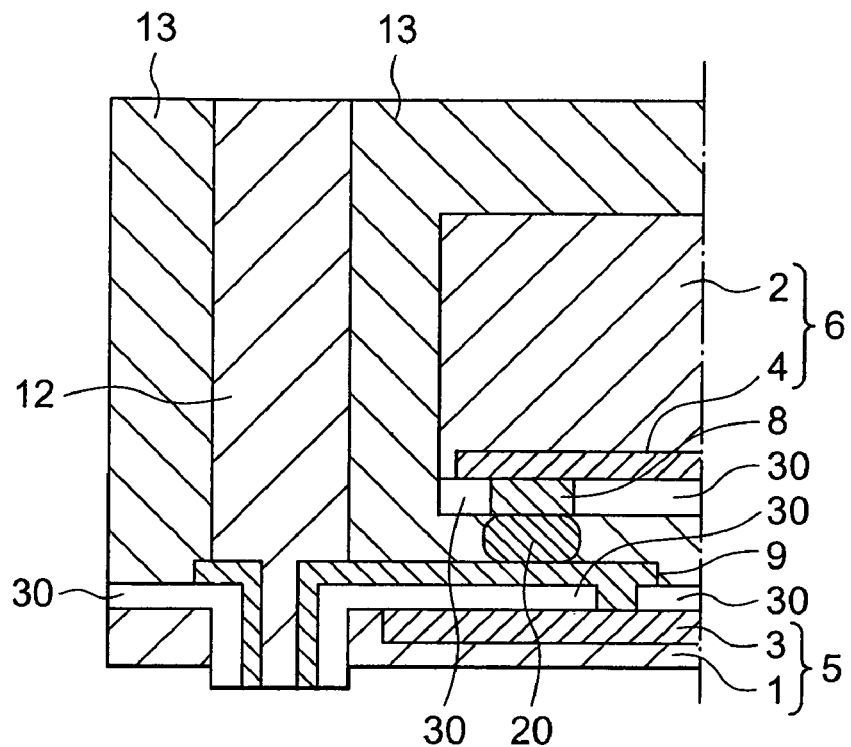
FIG. 46 is a sectional view showing a semiconductor device according to a fourteenth embodiment of the present invention.
Figure 47:
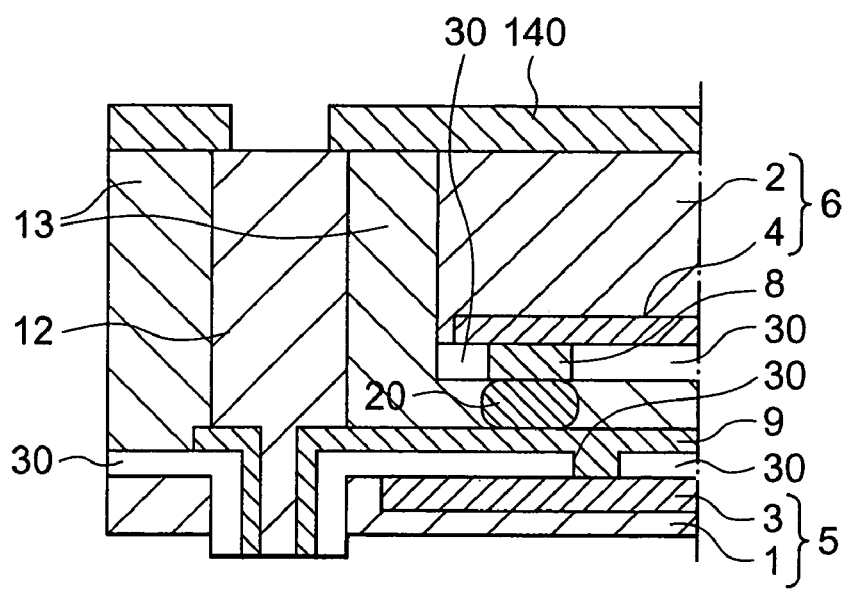
FIG. 47 is a sectional view showing a modification of the semiconductor device according to the fourteenth embodiment of the present invention.

Referring to FIGS. 46 and 47, the back surface of the second semiconductor element 6 (back surface of the second semiconductor substrate 2) is covered with an insulation material 13. In the semiconductor device shown in FIG. 46, the back surface of the second semiconductor element 6 is coated with the insulation material 13 which covers at the same time the lateral surfaces of the through electrode 12 and the second semiconductor element 6, respectively. On the other hand, in the semiconductor device shown in FIG. 47, the step of covering the lateral surfaces of the through electrode 12 and the second semiconductor element 6 with the insulation material 13 and the step of coating the back surface of the second semiconductor element 6 with the insulation film 140 are carried out separately from each other.

By covering the back surface of the second semiconductor element 6 with the insulation material (insulation film), not only the electrical stability can be improved but also the chemical and mechanical withstanding capability can be enhanced because the insulation material 13 in general serves for the protecting function as well, whereby high reliability can be ensured.

Incidentally, in the case where the coating with the insulation material is carried out separately, as in a case of the semiconductor device stack shown in FIG. 47, there can be employed same or different types of insulation materials, as the case may be.

Figure 48:
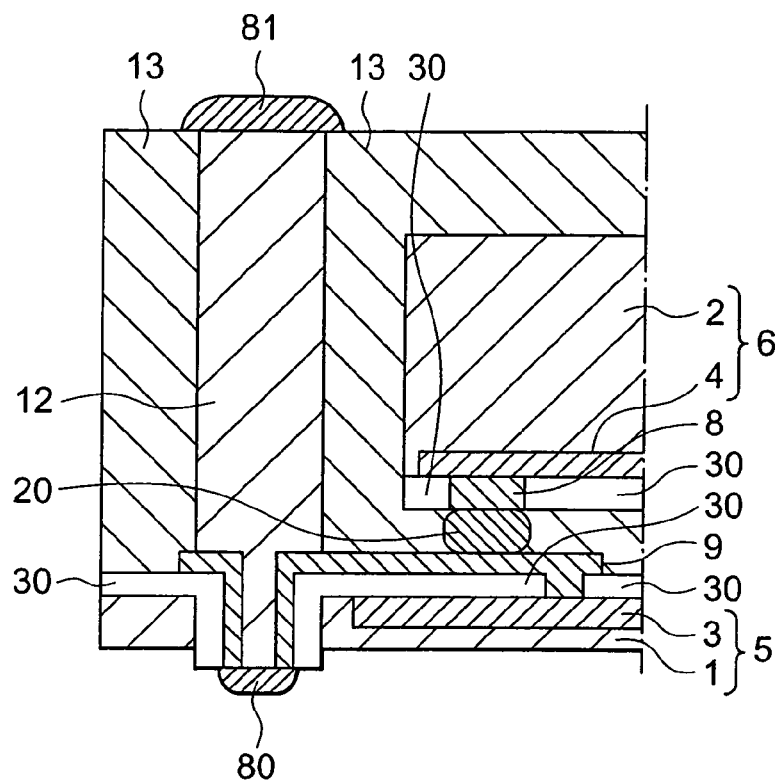
FIG. 48 is a sectional view showing another modification of the semiconductor device according to the fourteenth embodiment of the present invention.
Figure 49:
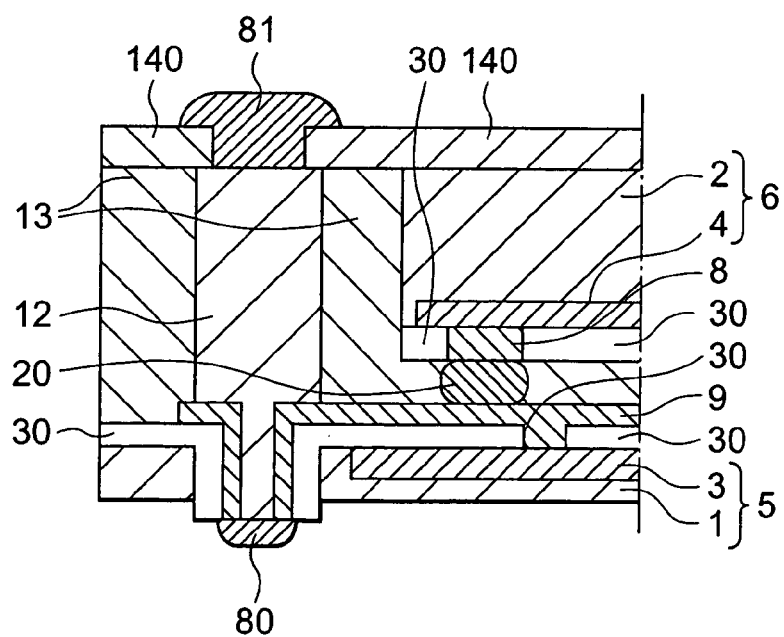
FIG. 49 is a sectional view showing still another modification of the semiconductor device according to the fourteenth embodiment of the present invention.

Further, as shown in FIGS. 48 and 49, the bump electrode (first and second protruding electrodes) may be formed on either one or both surfaces in the semiconductor devices shown in FIGS. 46 and 47.

Embodiment 15

FIGS. 50, 51, 52, 53, 54 and 55 are sectional views showing, respectively, semiconductor devices according to a fifteenth embodiment of the present invention.

Incidentally, in these figures, the parts or components similar to those described hereinbefore by reference to FIGS. 1 to 49 are denoted by like reference symbols and repeated description in detail thereof is omitted.

Figure 50:
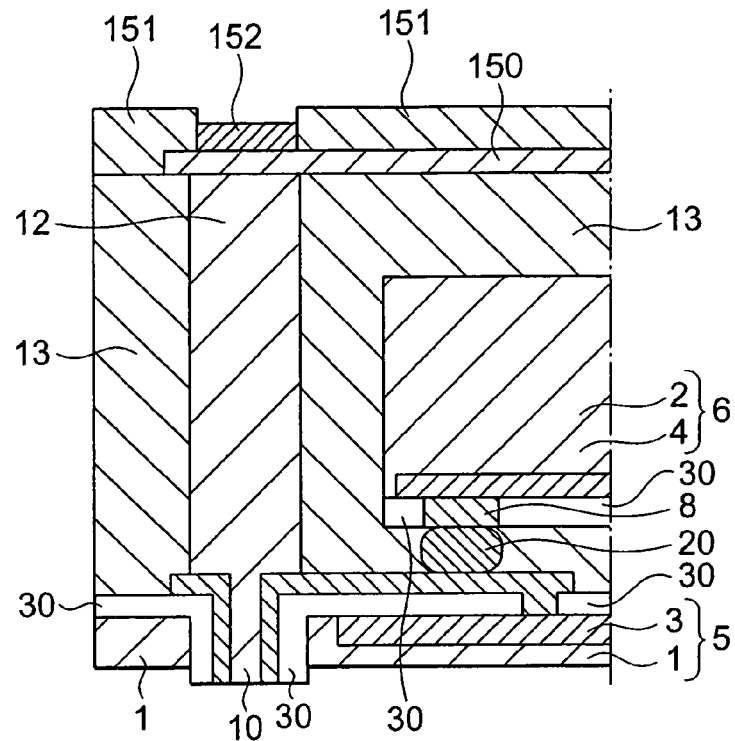
FIG. 50 is a sectional view showing a semiconductor device according to a fifteenth embodiment of the present invention.

In the semiconductor device of a structure shown in FIG. 50, a wiring conductor layer 150 is formed on the back surface region of the second semiconductor element 6 coated with the insulation material 13 in the semiconductor device according to the fourteenth embodiment of the invention described hereinbefore. Although one wiring conductor layer 150 is shown in FIG. 50, the invention is never restricted thereto. Two or more wiring conductor layers may be formed with an interlayer insulation film being interposed therebetween. A protection film 151 is formed on the top surface of the wiring conductor layer 150 except the portion where the electrode is to be formed, as mentioned below. This protection film 151 may be spared although it depends on the properties of the material of the material of the wiring conductor layer 150 as exposed.

Formed at a predetermined location on the top surface of the wiring conductor layer 150 is an electrode (land) 152.

Figure 51:
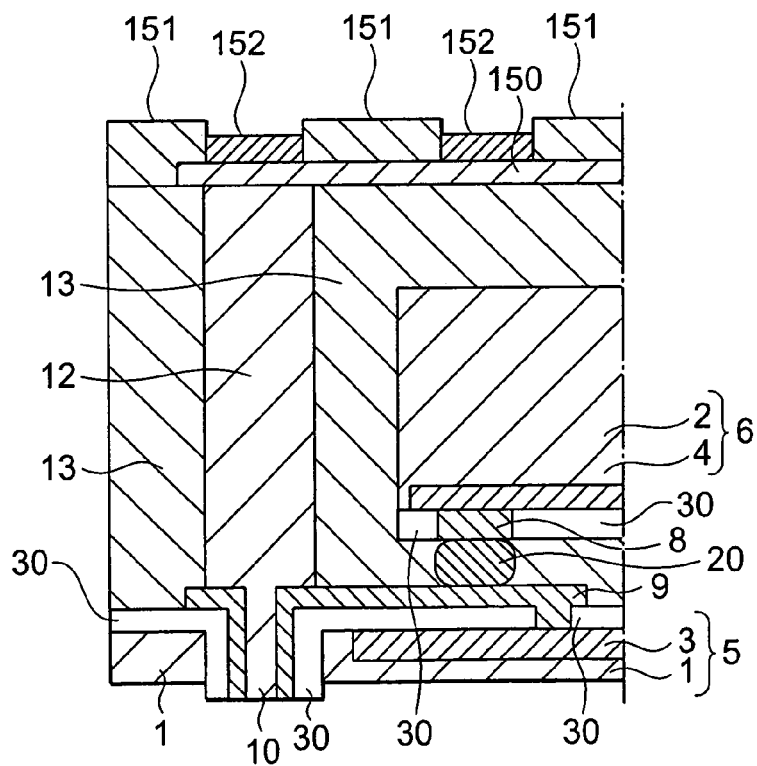
FIG. 51 is a sectional view showing a modification of the semiconductor device according to the fifteenth embodiment of the present invention.

In the semiconductor device shown in FIG. 51, a plurality of portions of the wiring conductor layer 150 are used as external terminals by employing an insulation film pattern 151 in which a plurality of locations for disposition of electrodes 152 are formed.

Figure 52:
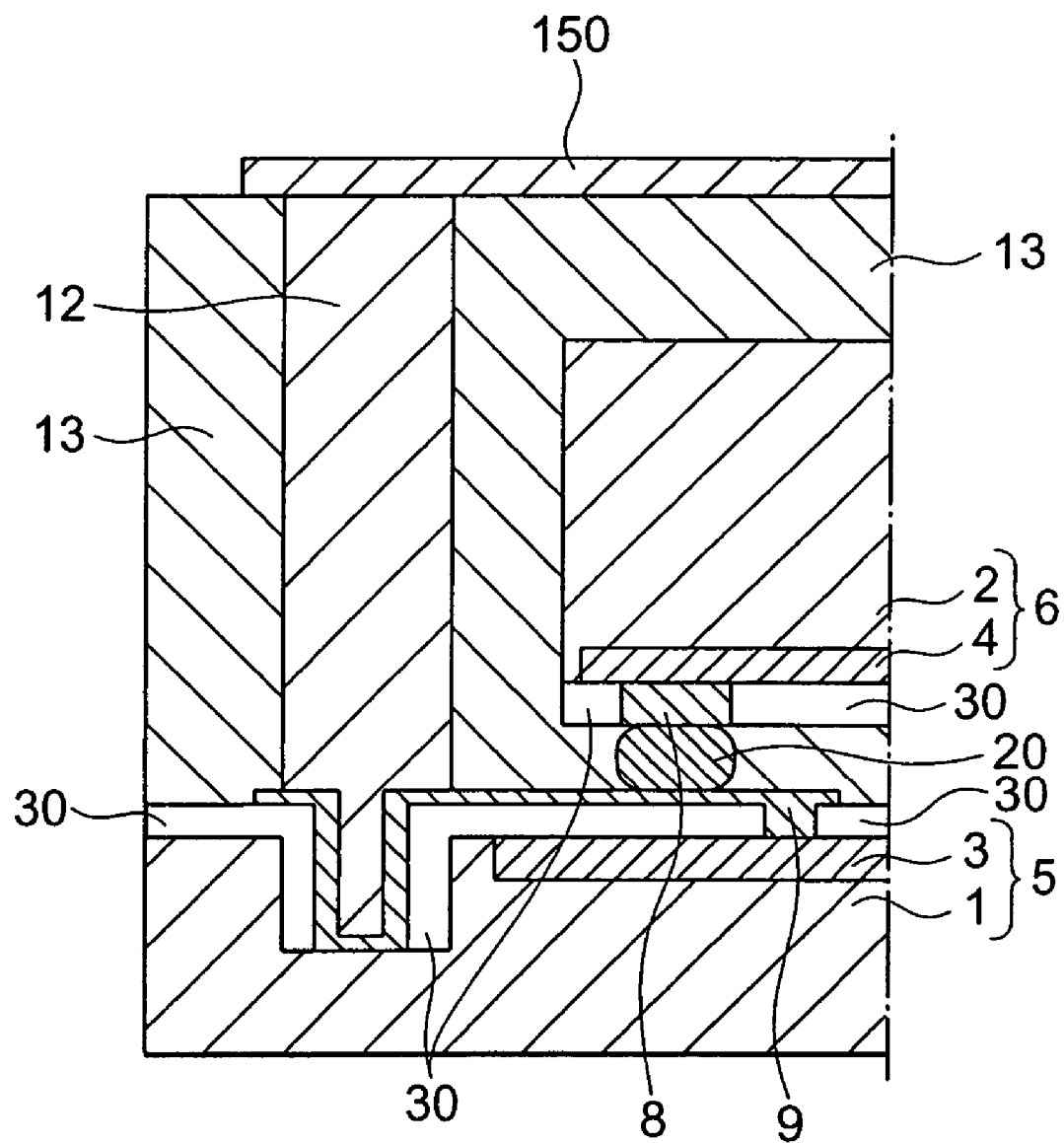
FIG. 52 is a sectional view showing another modification of the semiconductor device according to the fifteenth embodiment of the present invention.
Figure 53:
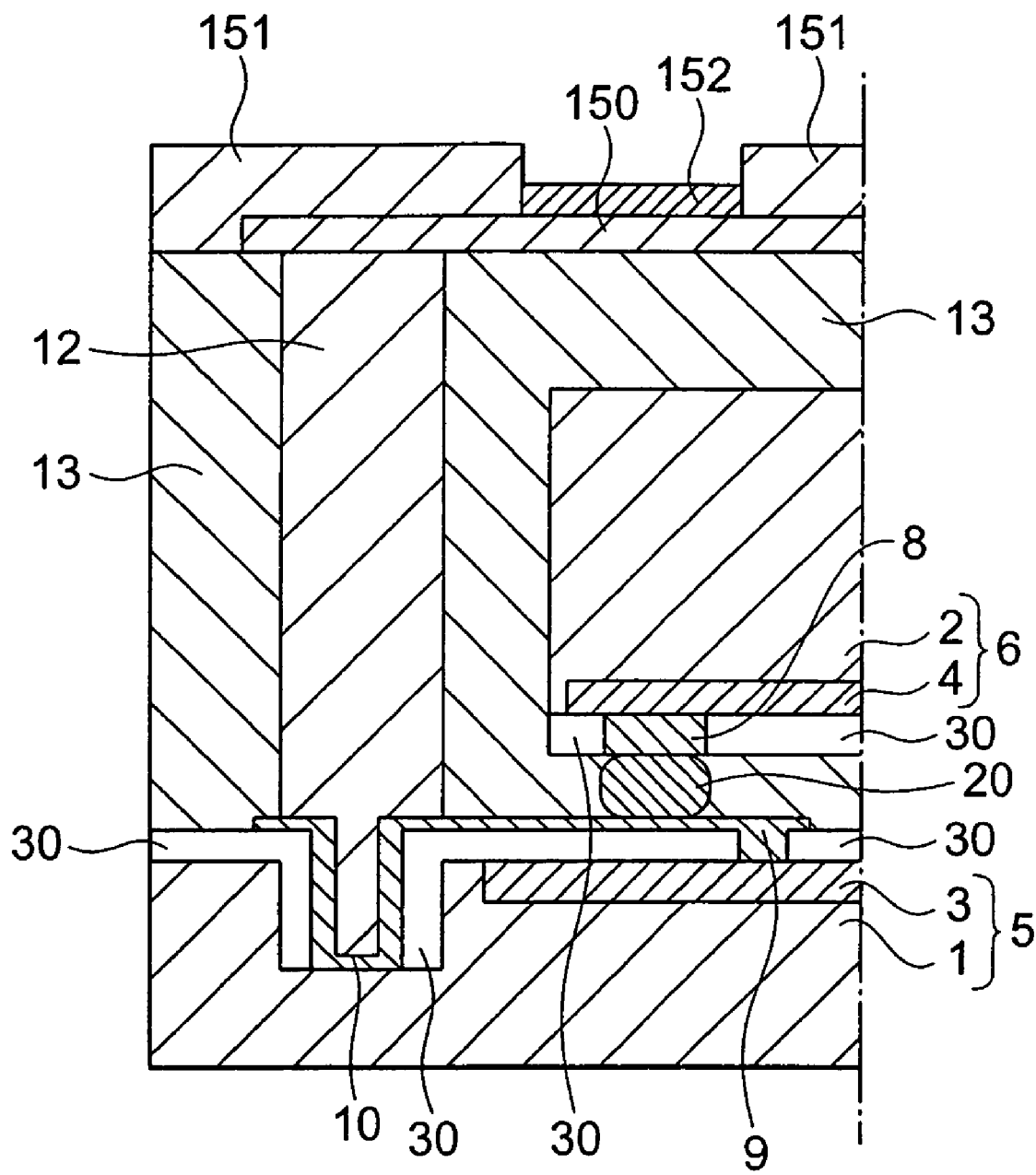
FIG. 53 is a sectional view showing still another modification of the semiconductor device according to the fifteenth embodiment of the present invention.
Figure 54:
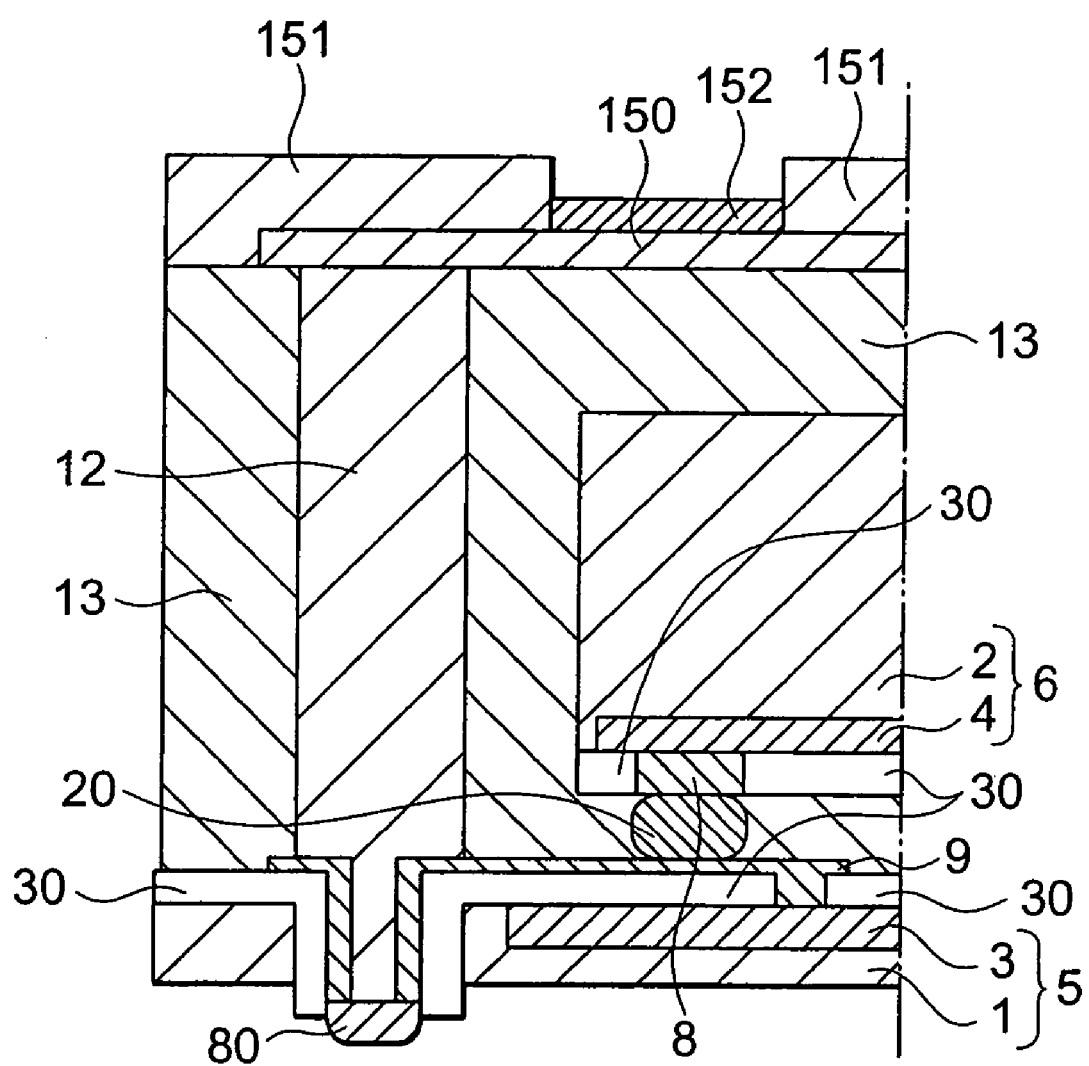
FIG. 54 is a sectional view showing yet another modification of the semiconductor device according to the fifteenth embodiment of the present invention.
Figure 55:
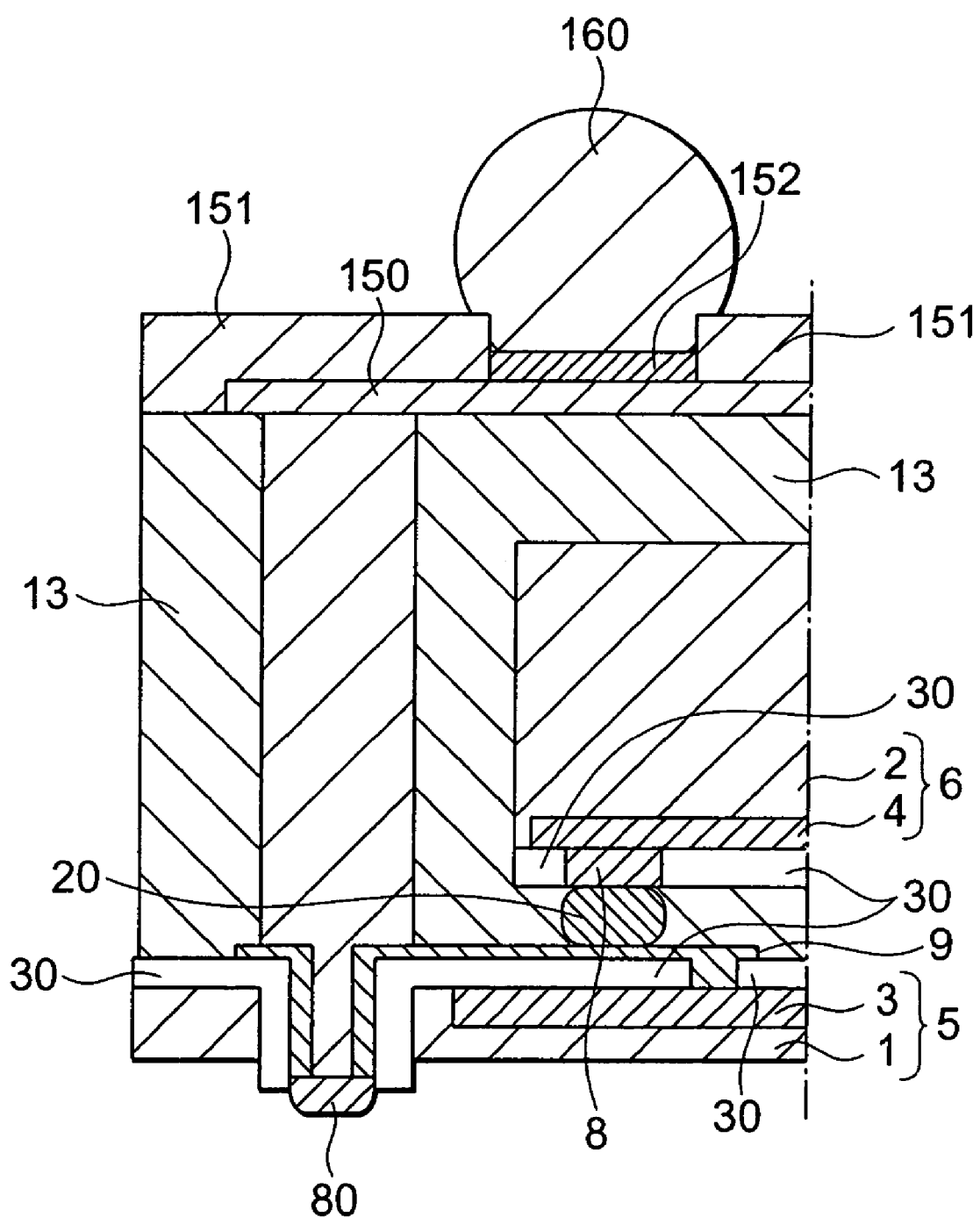
FIG. 55 is a sectional view showing a further modification of the semiconductor device according to the fifteenth embodiment of the present invention.

Referring to FIGS. 52 to 54, FIGS. 52 to 54, the wiring conductor layer 150 is formed on the exposed surface of the insulation material 13 coated on the side of the second semiconductor element 6 (FIG. 52). Subsequently, the protection film 151 is formed on the top surface of the wiring conductor layer (150) except the location where the electrode is to be formed (FIG. 53). The electrode 152 is formed at the electrode forming location, whereon the back surface of the first semiconductor substrate 1 is ground and etched, which is then followed by formation of a bump electrode (first protruding electrode 80) by electroless plating process (FIG. 54). Additionally, a solder ball 160 is formed on the electrode 152, as shown in FIG. 55.

As is apparent from the above, the back surface of the second semiconductor element 6 (i.e., exposed surface of the insulation material 13) can effectively be utilized for forming the electrode(s) (external terminal(s)). By virtue of this feature, a-large electrode (e.g. 152) can be attached without being limited by the size of the exposed top portion of the through electrode 12.

Further, the degree of freedom in selecting the disposition of the electrode(s) can be increased. Besides, the number of electrodes (the number of external terminals) can be increased as well.

Moreover, not only the integration density can be increased but also the degree of freedom in design can be enhanced.

It should further be added that although the instant embodiment of the invention starts from the semiconductor device according to the fourteenth embodiment of the invention (see FIG. 46), the teachings of the invention incarnated in the instant embodiment can equally be applied to the semiconductor device shown in FIG. 47 substantially to the same advantageous effects.

Embodiment 16

A sixteenth embodiment of the present invention is directed to a method of manufacturing the semiconductor device shown in FIG. 46 according to the fourteenth embodiment of the invention. FIGS. 56, 57, 58 and 59 are views for illustrating steps or processes involved in the semiconductor device manufacturing method according to the sixteenth embodiment of the invention. In FIGS. 56 to 59, the constituents or components similar to those described previously in conjunction with the first to fifteenth embodiments of the invention by reference to refer to FIGS. 1 to 55 are denoted by like reference symbols, and repeated description in detail of these components will be omitted. Further, in the manufacturing method now under consideration, the steps same as described hereinbefore by reference to FIGS. 6 to 9 and FIGS. 15 to 18 will be omitted from the following description. Thus, the following description will be directed to the steps corresponding to those described previously by reference to FIGS. 10 to 14.

Figure 56:
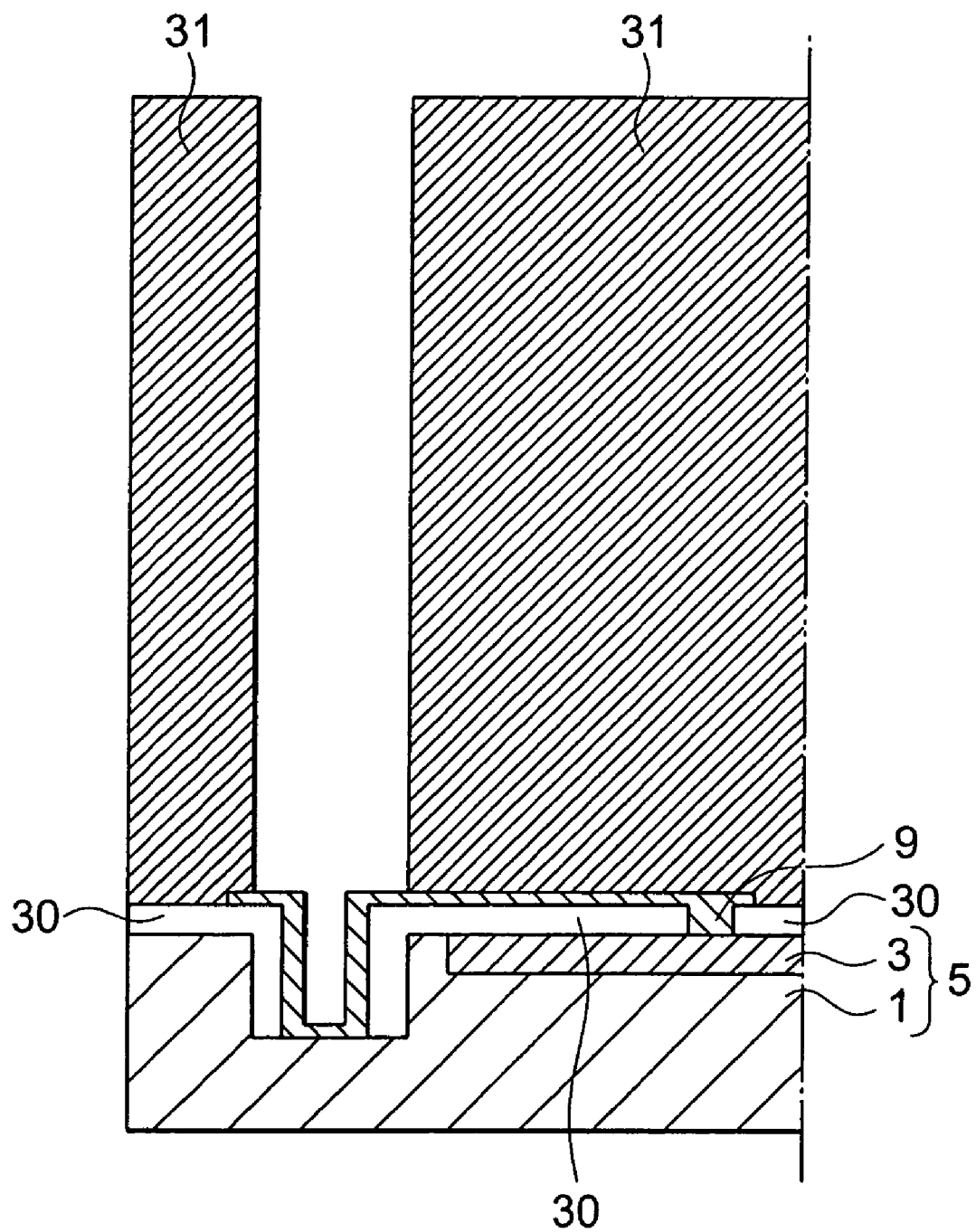
FIG. 56 is a view for illustrating a resist pattern deposition step in a semiconductor device manufacturing method according to a sixteenth embodiment of the present invention.

In a step shown in FIG. 56, a photoresist 31 having a greater thickness than that of the second semiconductor element 6 mounted later on is formed with an opening or hole.

Figure 57:
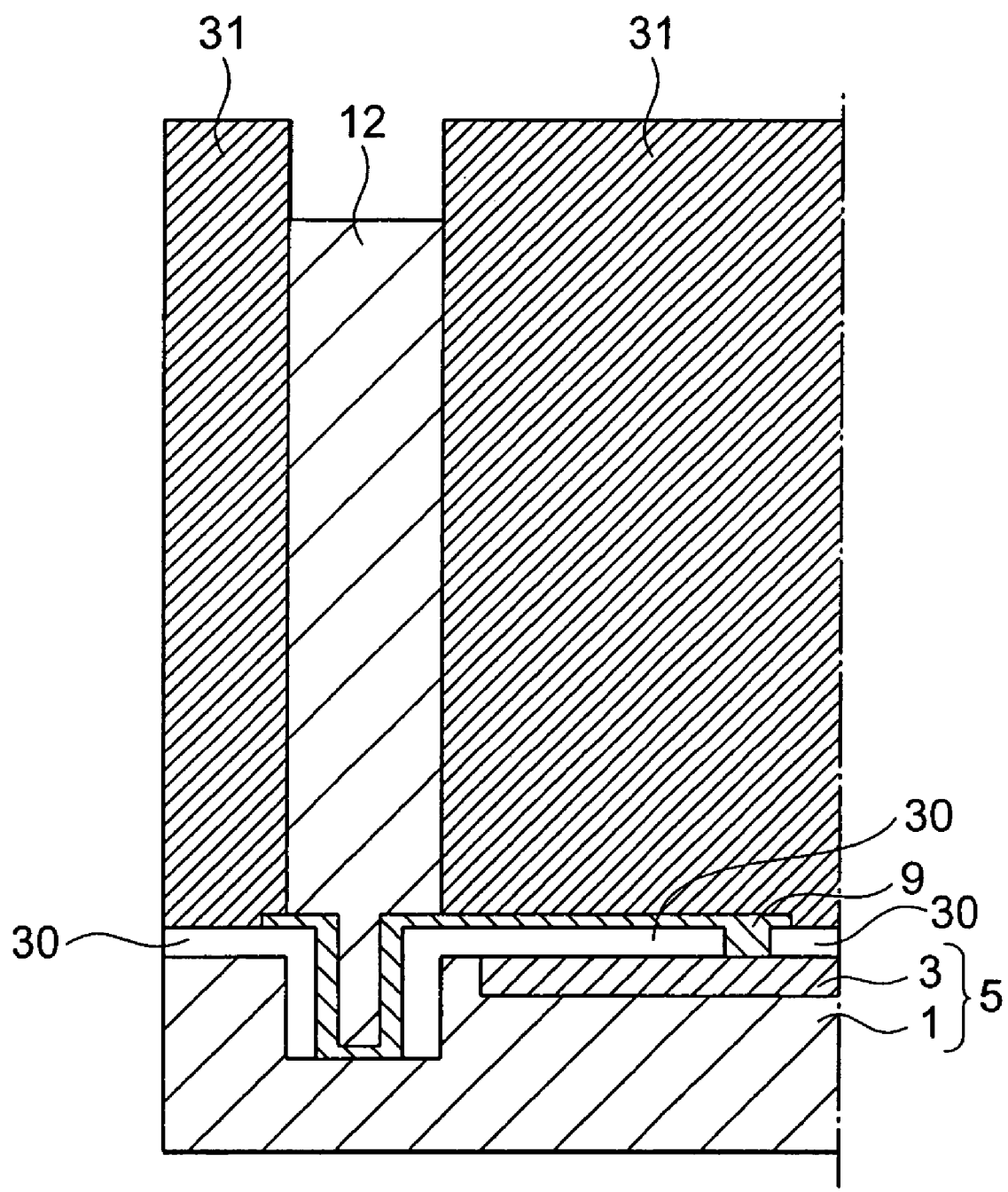
FIG. 57 is a view for illustrating a through electrode forming step in the semiconductor device manufacturing method according to the sixteenth embodiment of the present invention.

In a step shown in FIG. 57, an electrode material is buried in the hole formed in the resist pattern 31 by electroplating with the first semiconductor substrate 1 being used as cathode, to thereby form the through electrode 12.

In that case, the electrode material is buried up to a height higher than the second semiconductor element 6 to be subsequently mounted and lower than the thickness of the resist 31.

Figure 58:
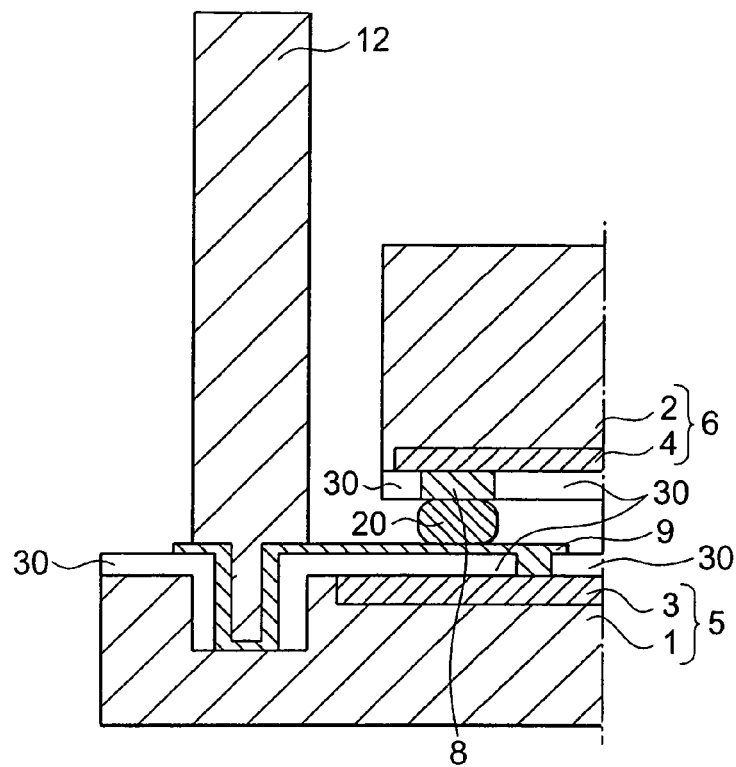
FIG. 58 is a view for illustrating a second semiconductor element connecting or mounting step in the semiconductor device manufacturing method according to the sixteenth embodiment of the present invention.

In a step shown in FIG. 58, the second semiconductor element 6 is connected to the first semiconductor element 5 with the bump electrode 20 being interposed therebetween. The second semiconductor element 6 is formed thin in advance so that the height of the through electrode 12 formed by plating exceeds the back surface of the second semiconductor element 6.

Figure 59:
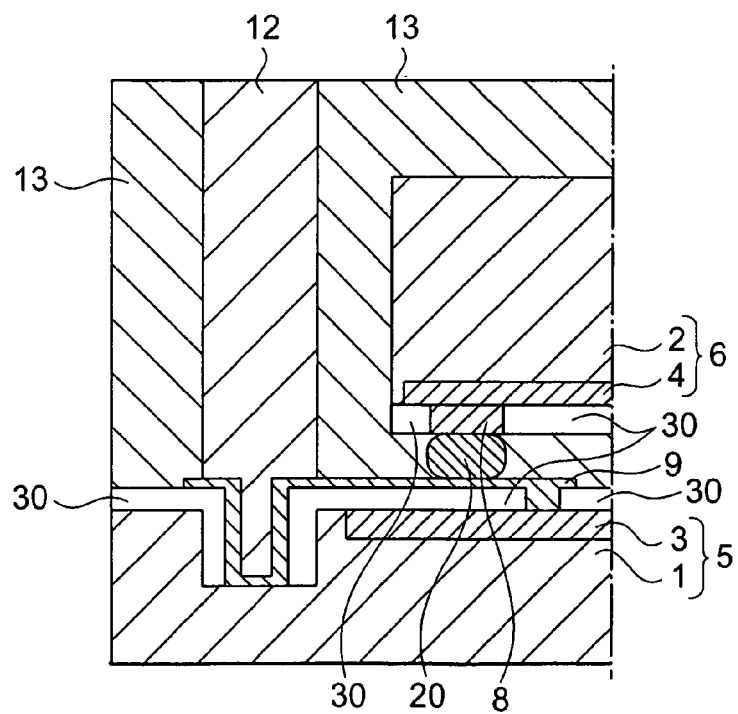
FIG. 59 is a view for illustrating an insulation material coating and grinding step in the semiconductor device manufacturing method according to the sixteenth embodiment of the present invention.

In a step shown in FIG. 59, an insulation material 13 such as a resin, glass or the like is coated and cured. In succession, a grinding process is carried out until the top portion of the through electrode 12 as formed is exposed.

Since the second semiconductor element 6 is formed thinner than the height of the through electrode 12 formed by plating, the insulation material 13 is deposited not only on the lateral surface of the through electrode 12 but also over the back surface of the second semiconductor element 6.

In this manner, the back surface of the second semiconductor element 6 can easily be coated with the insulation material by using intactly the steps described hereinbefore in conjunction with the third embodiment of the invention simply by changing the thickness of the result, plating height of the through electrode and the thickness of the semiconductor element to be mounted.

Embodiment 17

A seventeenth embodiment of the present invention is directed to a method of manufacturing the semiconductor devices shown in FIGS. 46 and 48 according to the fourteenth embodiment of the invention. FIGS. 60, 61, 62 and 63 are views for illustrating steps or processes involved in the semiconductor device manufacturing method according to the seventeenth embodiment of the invention. In these figures, the constituents or components similar to those described previously in conjunction with the first to sixteenth embodiments of the invention by reference to FIGS. 1 to 59 are denoted by like reference symbols, and repeated description in detail of these components will be omitted. Further, in the manufacturing method now under consideration, the steps same as described hereinbefore by reference to FIGS. 6 to 9 and FIGS. 15 to 18 will be omitted from the following description. Thus, the following description is directed to the steps corresponding to those described previously by reference to FIGS. 10 to 14.

Figure 60:
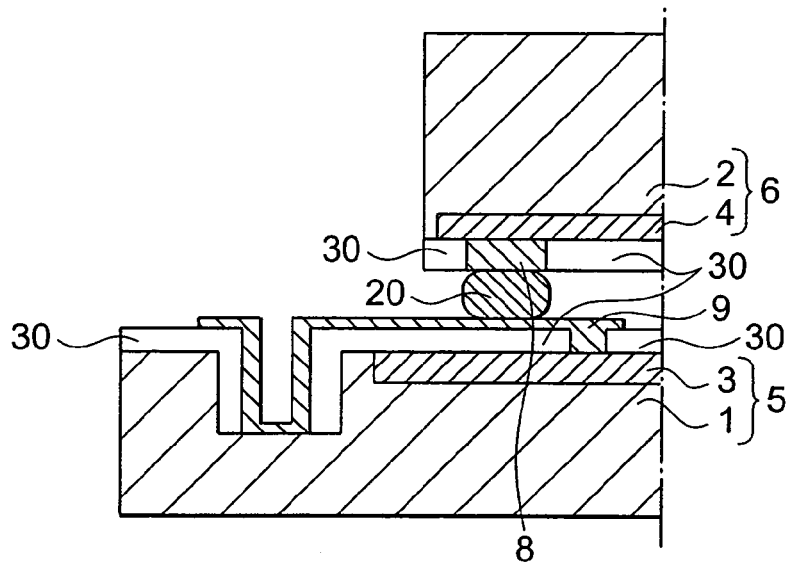
FIG. 60 is a view for illustrating a second semiconductor element mounting step in a semiconductor device manufacturing method according to a seventeenth embodiment of the present invention.

In a step shown in FIG. 60, the second semiconductor element 6 ground to a predetermined thickness is mounted at a predetermined location by interposing the bump electrode 20 and the predetermined electrode (second electrode 8).

Figure 61:
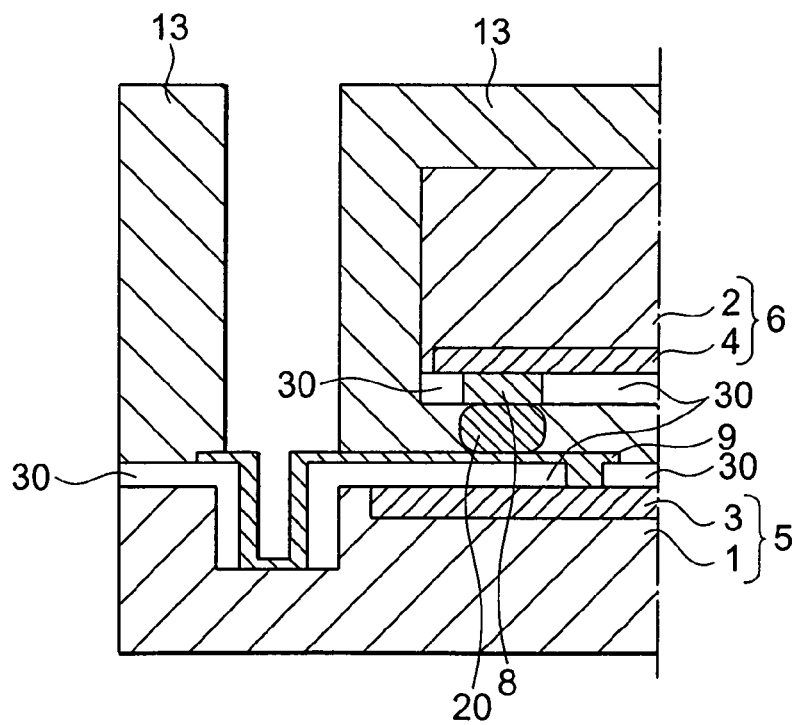
FIG. 61 is a view for illustrating an insulation material coating step in the semiconductor device manufacturing method according to the seventeenth embodiment of the present invention.

In succession, in a step shown in FIG. 61, a material forming the insulation film 13 is applied in a thickness greater than that of the second semiconductor element 6. As the material forming the insulation film 13, such material as photosensitive polyimide which has initially a high fluidity and exhibits photosensitivity after application and which can be cured to form a proper insulation layer should preferably be used so that a desired pattern can be formed by exposure through a mask.

After the second semiconductor element 6 has wholly been covered with the insulation film 13, a hole is opened through exposure/development process, which is then followed by a curing process.

Figure 62:
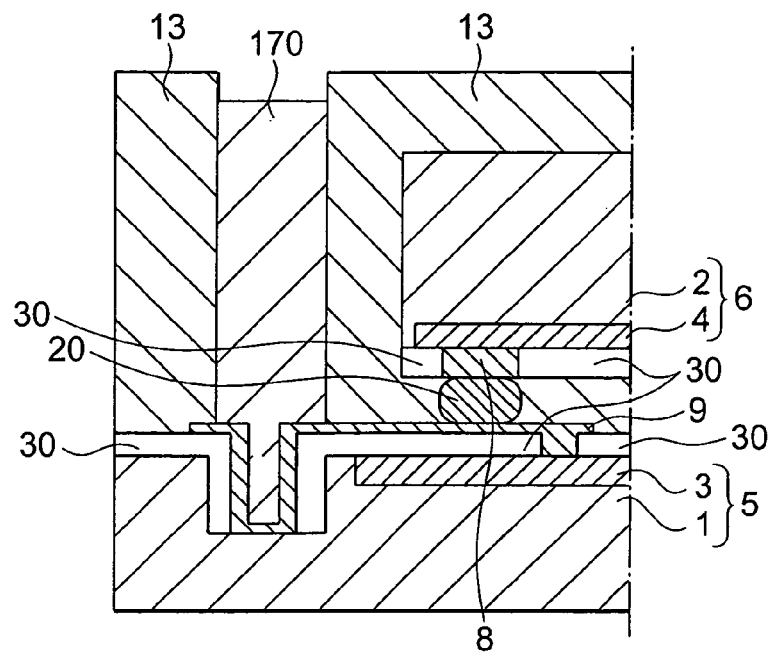
FIG. 62 is a view for illustrating a step of forming a through electrode by electroplating in the semiconductor device manufacturing method according to the seventeenth embodiment of the present invention.

In a step shown in FIG. 62, a conductive material is buried into the opened portion through an electroplating process by using the first semiconductor substrate 1 as the cathode to thereby form a column (through electrode) 170 of an electrically conductive material on the matrix constituted by the metal film 9 in a height greater than the thickness of the second semiconductor element 6.

Figure 63:
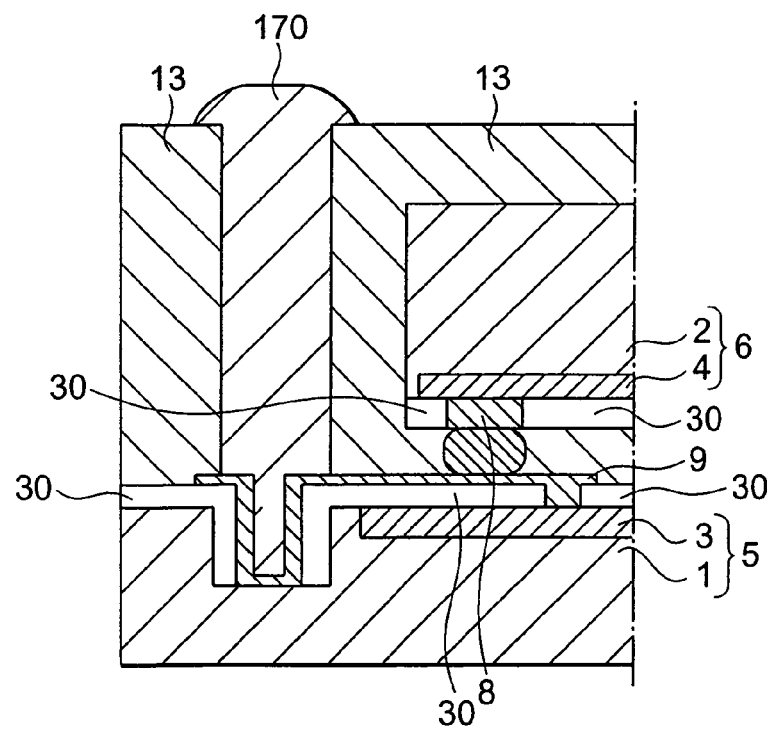
FIG. 63 is a view for illustrating a bump electrode forming step in the semiconductor device manufacturing method according to the seventeenth embodiment of the present invention.

In this conjunction, it should be mentioned that the electrically conductive column 170 may be formed as a bump electrode projecting beyond the surface of the photosensitive polyimide film 13 through the electroplating process, as shown in FIG. 63. In that case, the step of additionally forming the bump electrode can be spared.

Subsequently, the top portion of the column 170 formed of the electrically conductive material and serving as the through electrode may be exposed by grinding the photosensitive polyimide layer 13 from the back side of the second semiconductor element 6 so that the top portion of the through electrode 170 lies in a plane flush with the surface of the photosensitive polyimide layer 13. In that case, the polyimide film remains as the insulation material 13 on the back surface of the second semiconductor element 6 because the second semiconductor element 6 is thinner than the plated column 170.

As is apparent from the above, the plated column or through electrode 170 of the height greater than the thickness of the second semiconductor element 6 can be formed after the second semiconductor element 6 has been mounted. Owing to this feature, mounting of the second semiconductor element 6 and the positional alignment can be much facilitated.

Embodiment 18

Figure 64:
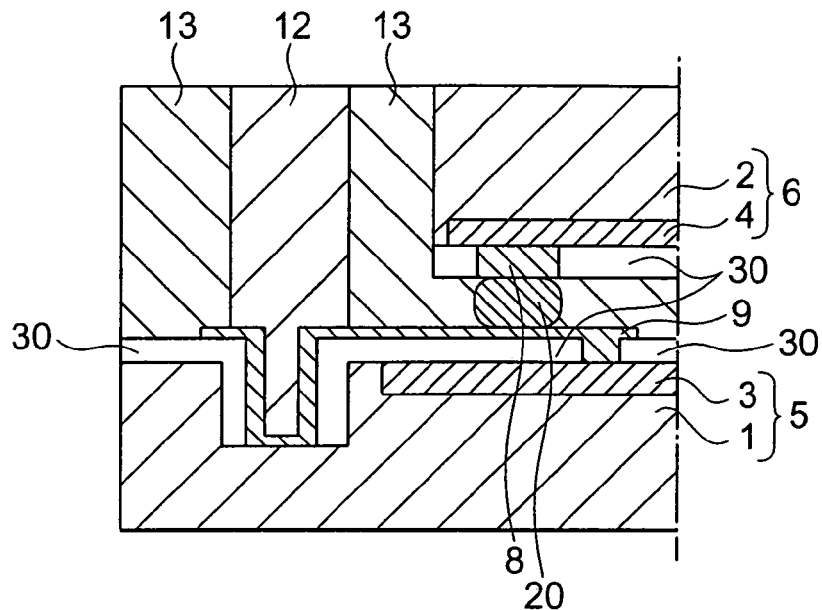
FIG. 64 is a view for illustrating a step of exposing a top portion of a through electrode in a semiconductor device manufacturing method according to an eighteenth embodiment of the present invention.
Figure 65:
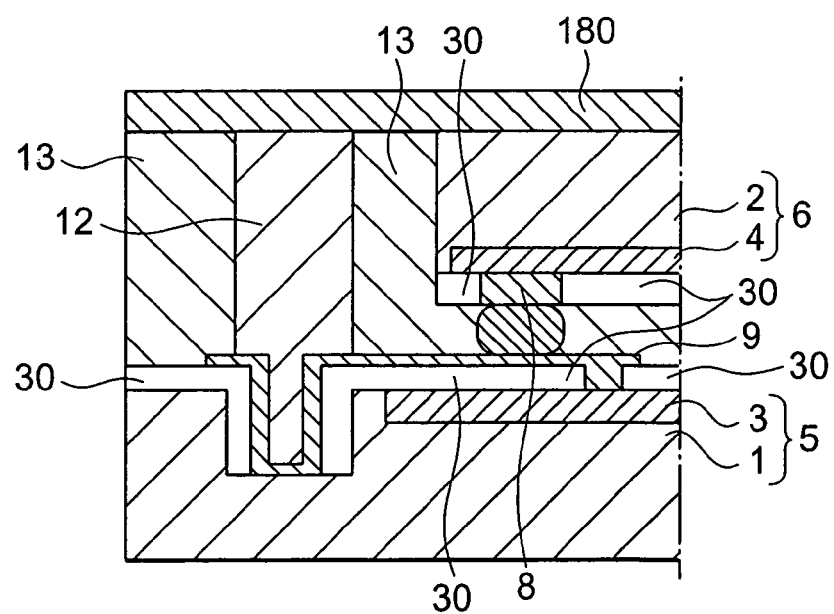
FIG. 65 is a view for illustrating an insulation film forming step in the semiconductor device manufacturing method according to the eighteenth embodiment of the present invention.
Figure 66:
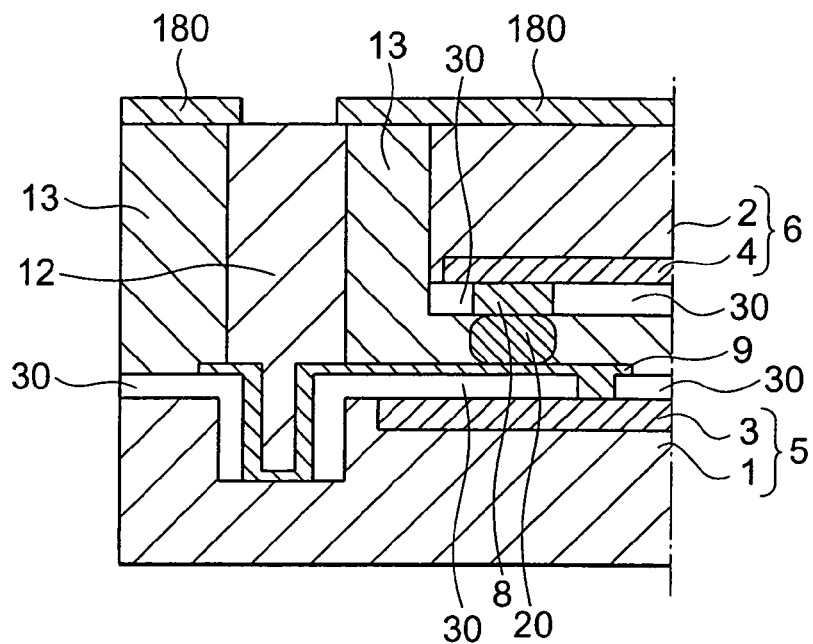
FIG. 66 is a view for illustrating a step of removing partially the insulation film at the top portion of the through electrode in the semiconductor device manufacturing method according to the eighteenth embodiment of the present invention.

FIGS. 64, 65 and 66 are views for illustrating steps or processes involved in the semiconductor device manufacturing method according to an eighteenth embodiment of the present invention. In these figures, the constituents or components similar to those described previously in conjunction with the first to seventeenth embodiments of the invention by reference to FIGS. 1 to 63 are denoted by like reference symbols, and repeated description in detail of these components will be omitted. Further, description of the steps same as those described previously by reference to FIGS. 6 to 18 is omitted. The steps described below are added between the step shown in FIG. 14 and the one shown in FIG. 15.

In a step shown in FIG. 64, an insulation material 13 is ground to thereby expose the top portion of the through electrode 12 as described hereinbefore by reference to FIG. 14.

In succession, in a step shown in FIG. 65, a material 180 is applied over the surface on the back side of the second semiconductor element 6 in a uniform thickness. As the material 180, there may be used such a material as photosensitive polyimide which has initially a high fluidity and exhibits photosensitivity after application so that a desired pattern can be formed by exposure through a mask and which can be cured to form a proper insulation layer.

In a step shown in FIG. 66, when the applied material 180 is the insulation material having the photosensitivity, the top portion of the electrode 12 is exposed trough exposure/development process to thereby form the insulation film (180) by heat curing. On the other hand, unless the material 180 has no photosensitivity, a photoresist pattern is additionally applied for carrying out the etching process to expose the top portion of the through electrode 12.

In this way, there can be formed the insulation film of high quality and high reliability.

In the foregoing description of the instant embodiment, it has been presumed that photosensitive polyimide is employed as the insulation film 180. It should however be appreciated that more fine patterning can be realized with high reliability by resorting to a deposition process such as a chemical vapor deposition (CVD) and a patterning process based on etching through a photoresist mask which are well known in the art.

Further, a screen printing which is technically of slightly poor in respect to the fine processing capability can equally be employed without difficulty. The screen printing process itself is also a technique well known in this art. Besides, by applying the processes mentioned above to the formation of the (metal) wiring conductor layer, the inter-layer insulation film and the protection film, there may be formed an additional wiring conductor layer(s) and an additional external terminal(s) on the back surface of the second semiconductor element 6.

Figure 93:
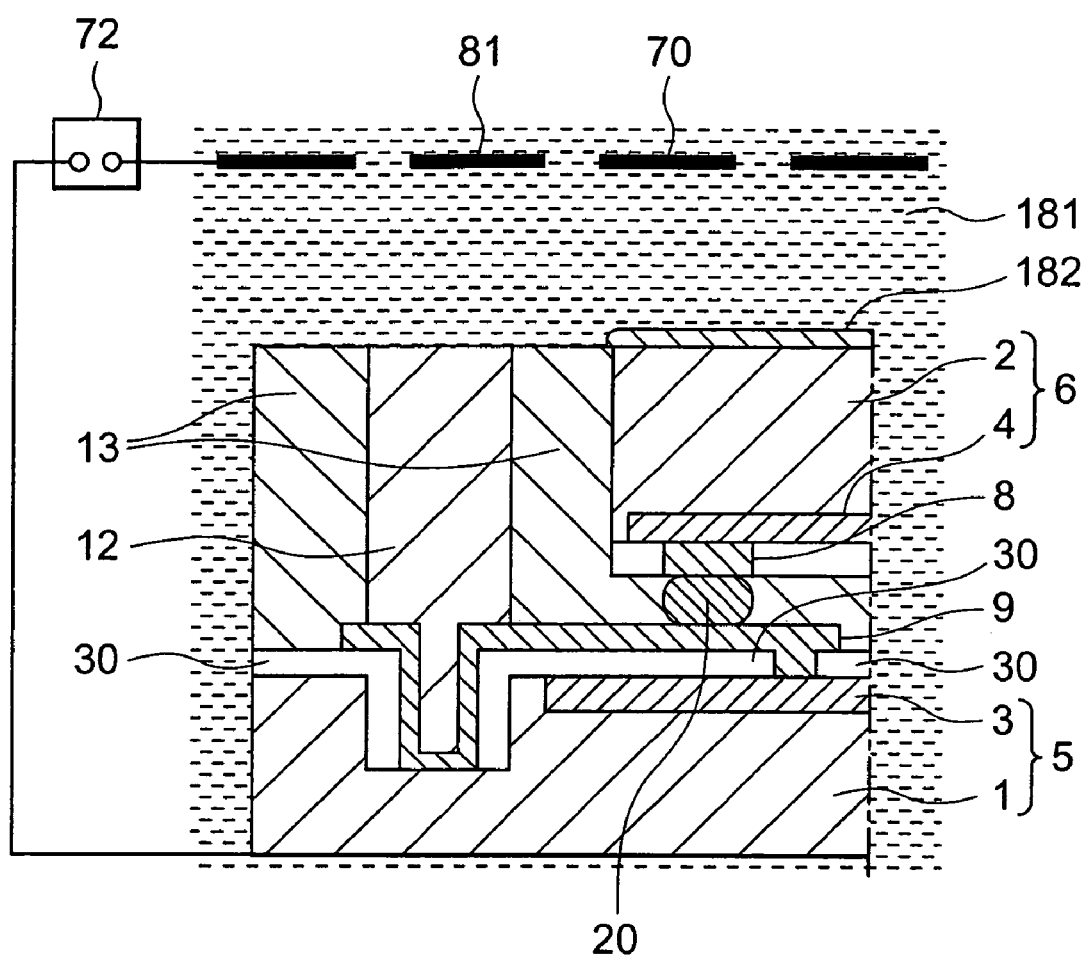
FIG. 93 is a view for illustrating a plating step which can be adopted in the semiconductor device manufacturing method according to the eighteenth embodiment of the invention.
Figure 94:
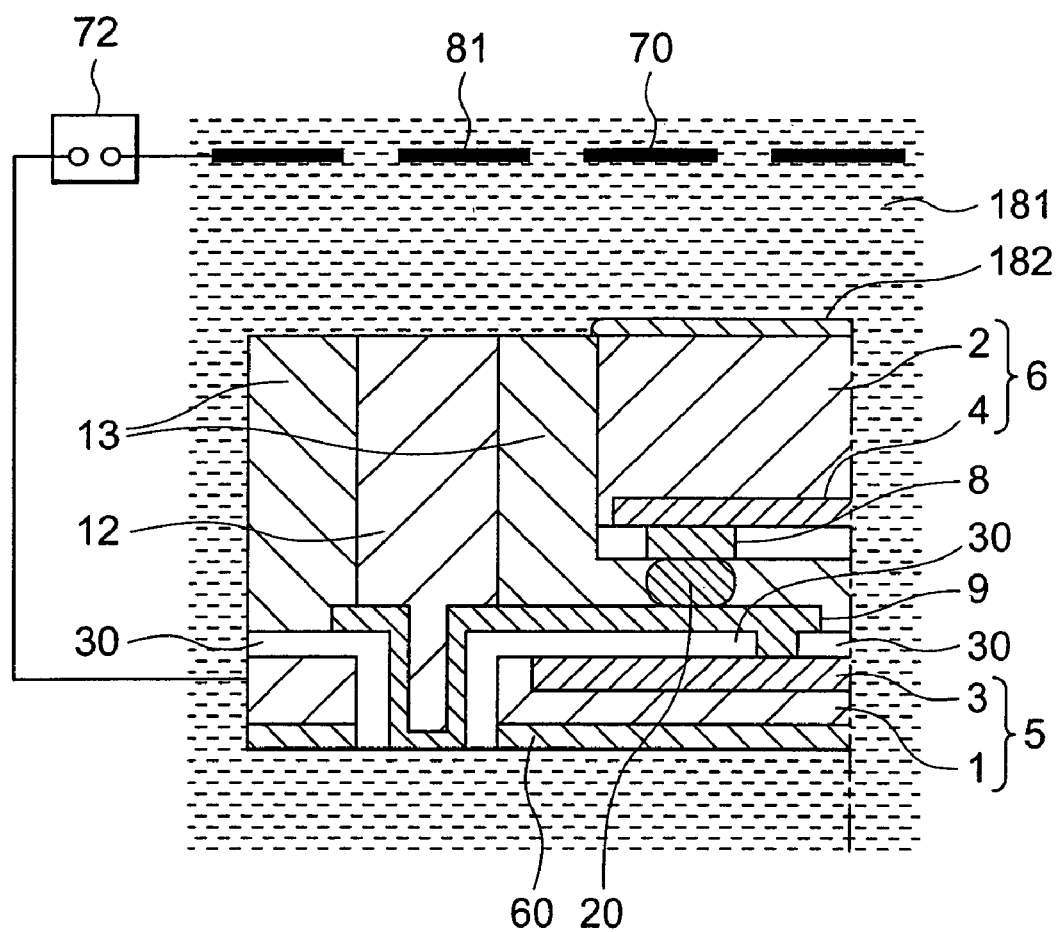
FIG. 94 is a view for illustrating a plating step which can be adopted in the semiconductor device manufacturing method according to the eighteenth embodiment of the present invention.

FIGS. 93 and 94 are views for illustrating steps in a semiconductor device manufacturing method according to the eighteenth embodiment of the present invention.

As can be seen in FIGS. 93 and 94, since the first semiconductor substrate 1 is electrically coupled to the second semiconductor element 6 by way of the through electrode 12 and the bump electrode 20 at least through the grounded potential in common, it is possible to form selectively an insulation film 182 of a material e.g. of polyimide series on the back surface of the second semiconductor element 6 by a method similar to the electrodeposition coating.

Further, the insulation film 182 can equally be formed through an anodic oxidation process as well.

Additionally, the process mentioned above can be carried out simultaneously with the process for forming the insulation film 60 on the back surface of the first semiconductor element 5 after grinding the first semiconductor substrate 1 and stripping off the supporting member as described hereinbefore in conjunction with the seventh embodiment of the invention.

Incidentally, in FIGS. 93 and 94, reference numeral 70 denotes an electrode array 181 denotes a solution and numeral 72 denotes a power supply.

Embodiment 19

Figure 67:
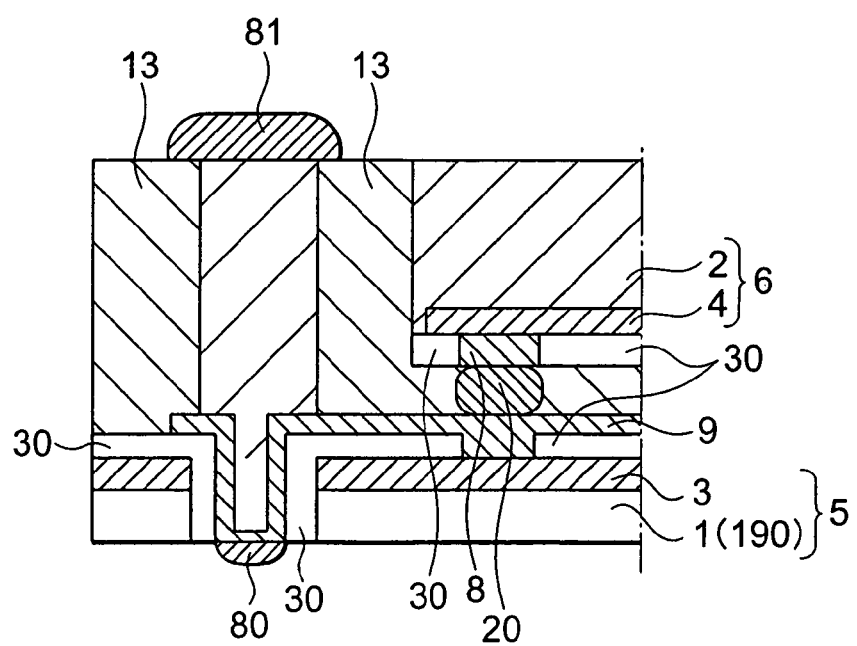
FIG. 67 is a sectional view showing a semiconductor device according to a nineteenth embodiment of the present invention.

FIG. 67 is a sectional view showing a semiconductor device according to a nineteenth embodiment of the present invention. FIGS. 68, 69, 70, 71 and 72 are views for illustrating steps or processes involved in the method of manufacturing the semiconductor device according to the nineteenth embodiment. In these figures, the constituents or components similar to those described previously in conjunction with the first to eighteenth embodiments of the invention by reference to FIGS. 1 to 66 are denoted by like reference symbols, and repeated description in detail of these components is omitted.

In the semiconductor device shown in FIG. 67, a composite substrate which is known as the silicon-on-insulator (SOI) substrate (hereinafter referred to as the SOI substrate) is employed as the first semiconductor substrate 1.

The SOI substrate is composed of a semiconductor substrate matrix (semiconductor) 190, an insulation film (buried insulation film) 191 deposited on the semiconductor substrate matrix 190 and an extremely thin semiconductor film (activated layer) deposited on the insulation film 191.

The method of manufacturing the semiconductor device in which the SOI substrate 1 is employed as the first semiconductor substrate 1 is substantially same as the method described hereinbefore in conjunction with the third embodiment of the invention.

Now, description will be directed to the method of manufacturing the semiconductor device in which the SOI substrate 1 is employed.

Figure 68:
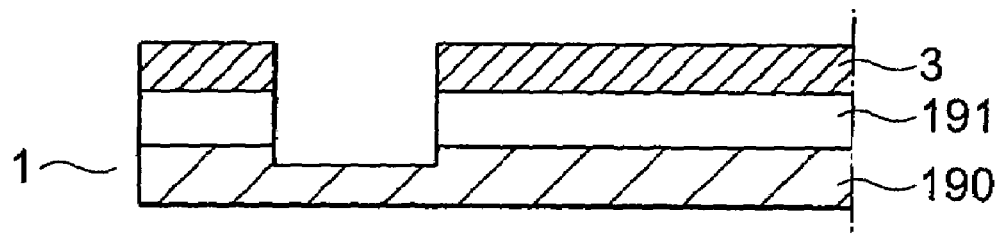
FIG. 68 is a sectional view showing an SOI (Silicon On Insulator) substrate employed in a semiconductor device manufacturing method according to the nineteenth embodiment of the invention.

In a step shown in FIG. 68, the SOI substrate is employed as the first semiconductor substrate (1) and a hole is formed which reaches the semiconductor substrate matrix 190, extending through the extremely thin semiconductor film 3 deposited on the SOI substrate and the buried insulation film 191.

Figure 69:
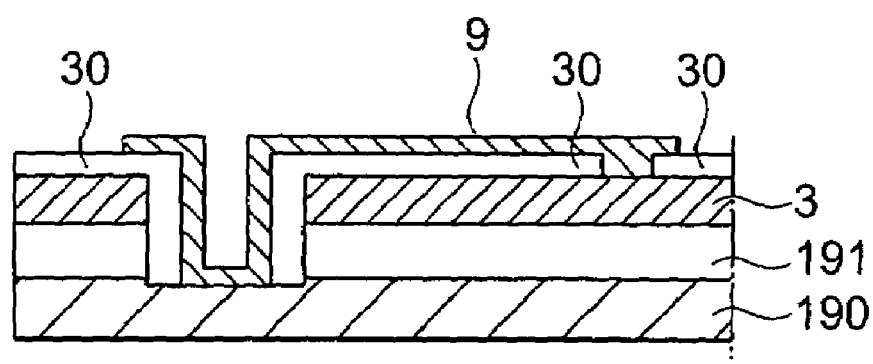
FIG. 69 is a view for illustrating a step of forming an insulation layer, a hole and a wiring conductor layer in the semiconductor device manufacturing method according to the nineteenth embodiment of the present invention.

Subsequently, in a step shown in FIG. 69, an insulation film 30 is deposited on the top surface of the SOI substrate, whereon the insulation film 30 is removed from the bottom portion of the hole and the portion where the electrode is to be formed by etching, which is then followed by formation of the connecting conductor layer 9, similarly to the steps shown in FIGS. 8 and 9.

Figure 70:
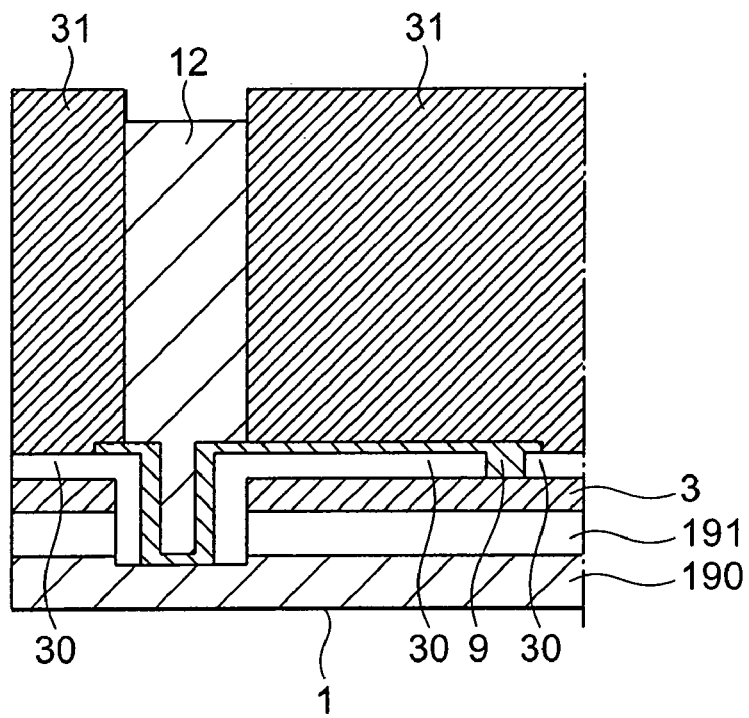
FIG. 70 is a view for illustrating a through electrode forming step in the semiconductor device manufacturing method according to the nineteenth embodiment of the present invention.

In a step shown in FIG. 70, the material for forming the through electrode 12 is buried in the opening formed in the resist layer 31 through the similar processes described hereinbefore by reference to FIGS. 10 and 11. In that case, since the bottom portion of the hole reaches the layer of the semiconductor substrate matrix 190, plating can be carried out by making use of the semiconductor substrate matrix 190 as the electrode.

Figure 71:
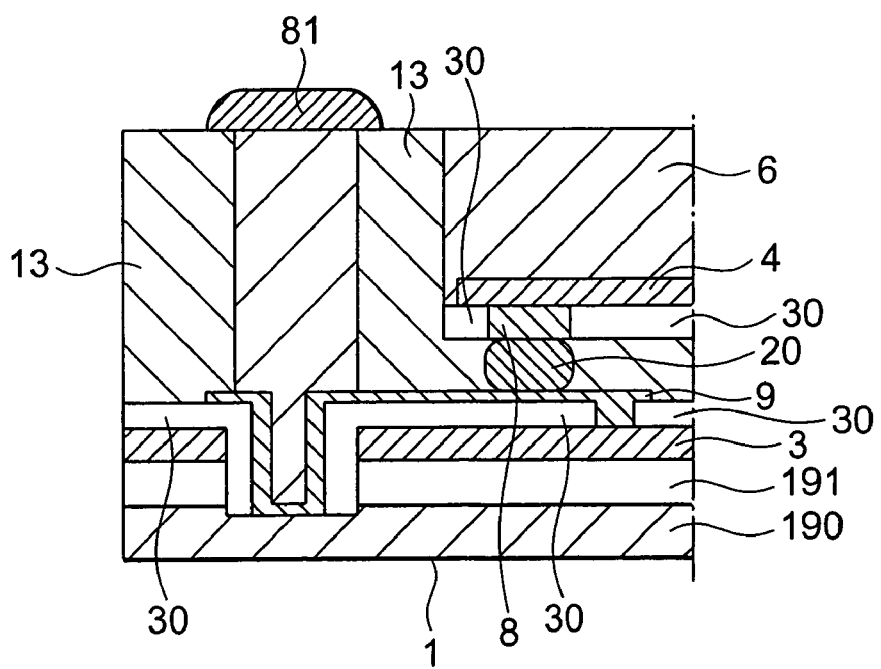
FIG. 71 is a view for illustrating a bump electrode forming step in the semiconductor device manufacturing method according to the nineteenth embodiment of the present invention.

Subsequently, in a step shown in FIG. 71, the second semiconductor element 6 is mounted, whereon the insulation material 13 is deposited, which is then followed by the step where the top portion of the through electrode 12 is exposed by grinding, similarly to the processes described previously by reference to FIGS. 12 to 14. At this juncture, it should also be added that in the step shown in FIG. 71, the bump electrode (second protruding electrode) 81 is formed by plating with the SOI substrate layer 190 being used as the cathode.

Figure 72:
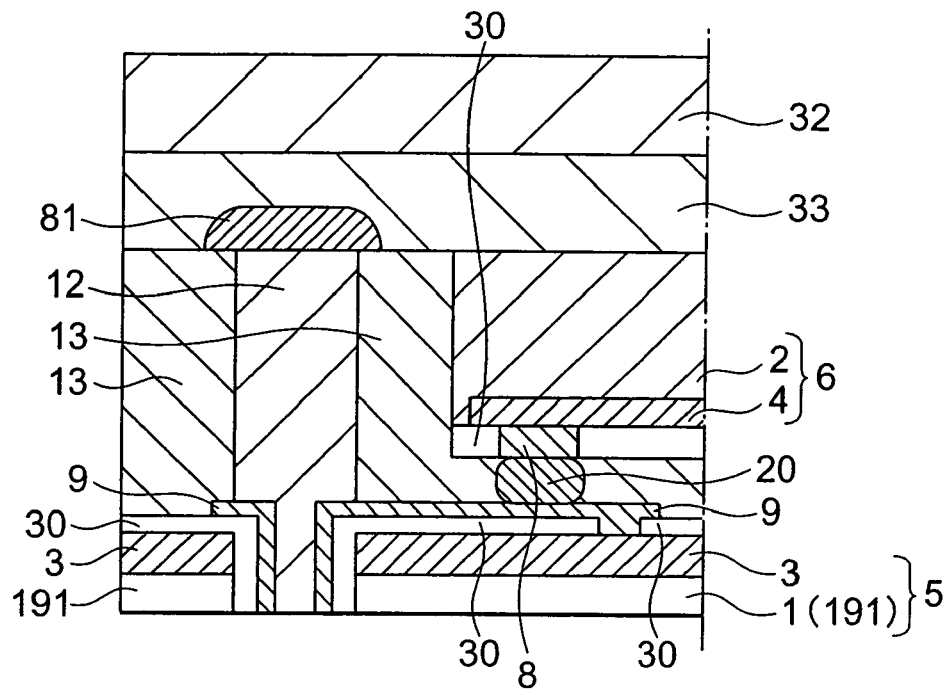
FIG. 72 is a view for illustrating a semiconductor substrate matrix etching process in the semiconductor device manufacturing method according to the nineteenth embodiment of the present invention.

In a step shown in FIG. 72, the supporting member 32 is bonded to the surface flush with the back surface of the second semiconductor substrate 2 of the second semiconductor element 6 by interposing therebetween the adhesive layer 33. Thereafter, only the semiconductor substrate matrix 190 remaining on the back surface of the SOI substrate 1 (191) is removed by etching until the bottom portion of the through electrode 12 is exposed on the back surface of the first semiconductor substrate 1 (191).

At this time, the extremely thin semiconductor film is formed on the buried insulation film 191 with the semiconductor substrate matrix 190 having ultimately been removed. Thus, by properly designing the semiconductor circuit and carrying out the process of fabricating the semiconductor circuit, the process of depositing the insulation film 30 and the process of removing the bottom portion of the hole (12) in precedence to the formation of the connecting conductor 9 can be spared while preventing short-circuit from being formed between the semiconductor substrate 1 (191) and the through electrode 12.

Further, in the formation of the through electrode 12 by electroplating, no especial step is required because the semiconductor substrate matrix 190 which is not yet removed at this time point can be used as the plating electrode.

Furthermore, for the removal of the semiconductor substrate matrix by etching after the semiconductor substrate matrix has been ground, control of the etching rate is rendered unnecessary because the removal is automatically stopped at the buried oxide film (insulation film) 191.

As is apparent from the above, since the SOI substrate has the buried insulation film 191 formed in advance, there is no necessity of forming the insulation film. Thus, the semiconductor device enjoying enhanced electrical stability and reliability can be realized.

Incidentally, the forgoing description has been made on the assumption that the first semiconductor substrate 1 employed in the semiconductor devices described hereinbefore in conjunction with the first to thirteenth embodiments is replaced by the SOI substrate. It should however be appreciated that in the semiconductor devices according to the fourteenth to eighteenth embodiments of the invention, similar replacement is possible.

Additionally, although it has been described that the so-called buried oxide-type SOI substrate, i.e., the semiconductor substrate having the buried oxide film 191 buried or embedded therein is employed, a so-called bonded-type SOI substrate, i.e., the composite substrate formed by bonding at a high temperature a semiconductor substrate on the surface of another semiconductor substrate formed previously with an oxide film, whereon one of the semiconductor substrates is ground to a predetermined thickness, may be employed.

Besides, although the SOI substrate is employed as the first semiconductor substrate, it should be understood that the semiconductor device of the same structure capable of serving for the same function can be realized by forming an electrically conductive layer on a back surface of a so-called thin film transistor (TFT) substrate in which a thin film transistor (TFT) is formed on an insulation substrate, forming a hole which reaches the electrically conductive layer and then forming a through electrode by plating, using the electrically conductive layer as the electrode and eliminating finally the electrically conductive layer.

Embodiment 20

Figure 73:
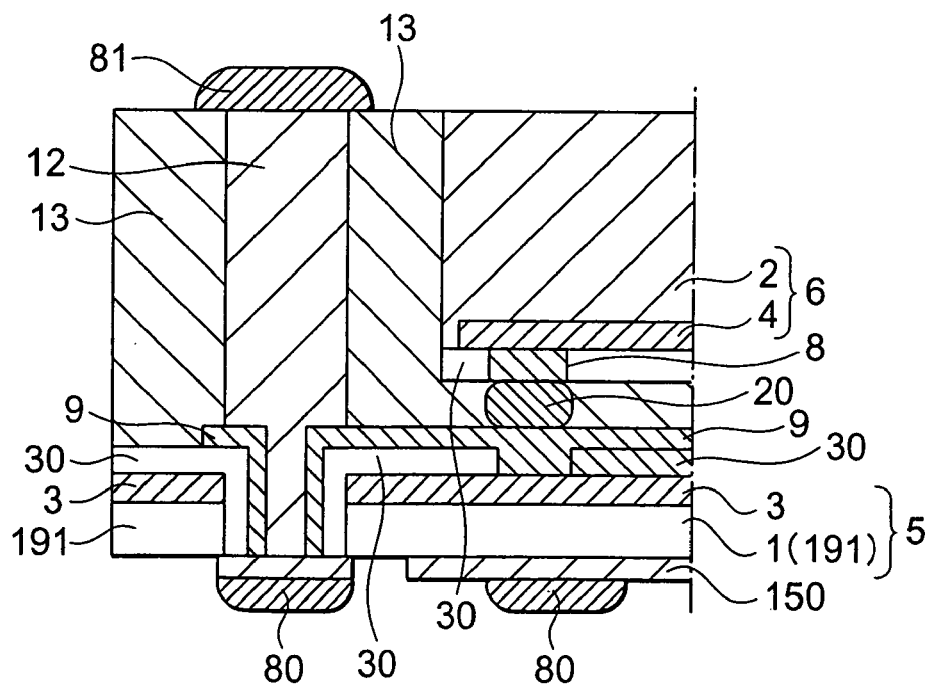
FIG. 73 is a sectional view showing a semiconductor device according to a twentieth embodiment of the present invention.

FIG. 73 is a sectional view showing a semiconductor device according to a twentieth embodiment of the present invention. In this figure, the constituents or components similar to those described previously in conjunction with the first to nineteenth embodiments of the invention by reference to FIGS. 1 to 72 are denoted by like reference symbols, and repeated description in detail of these components will be omitted.

Referring to FIG. 73, a wiring conductor layer 150 is formed on the surface of the buried insulation film 191 which is exposed in back surface of the first semiconductor element 5 formed in the first semiconductor substrate.

The wiring conductor layer 150 mentioned above is used for rewiring by resorting to a method well known in the semiconductor process technology. The rewiring can easily be realized by making use of the insulation film 191.

Further, upon grinding the back surface of the semiconductor substrate matrix 190 of the SOI substrate, the grinding is carried out till the back surface of the buried insulation film 191 (back surface of the insulation film 191) is exposed with the semiconductor substrate matrix 190 being completely eliminated without interrupting the grinding at the time point the through electrode bottom portion is exposed. Then, the surface of the buried insulation film 191 having no offset portions can be obtained, whereby the wiring conductor layer 150 can be formed with more ease.

A protruding electrode 80 may be formed in the wiring conductor layer 150.

Embodiment 21

Figure 74:
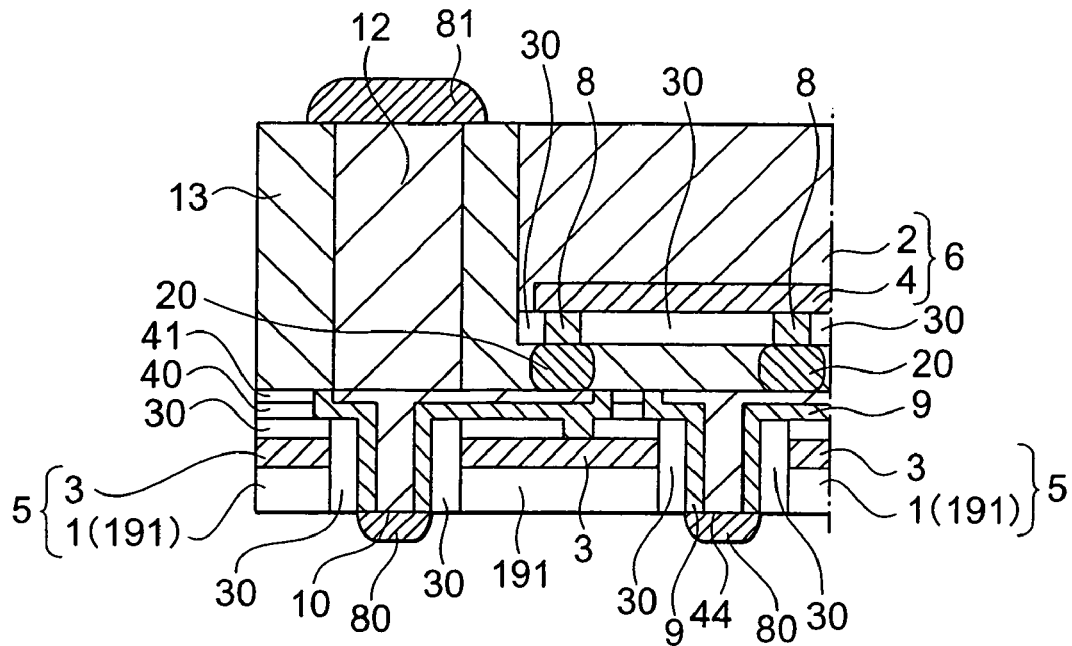
FIG. 74 is a sectional view showing a semiconductor device according to a twenty-first embodiment of the present invention.
Figure 75:
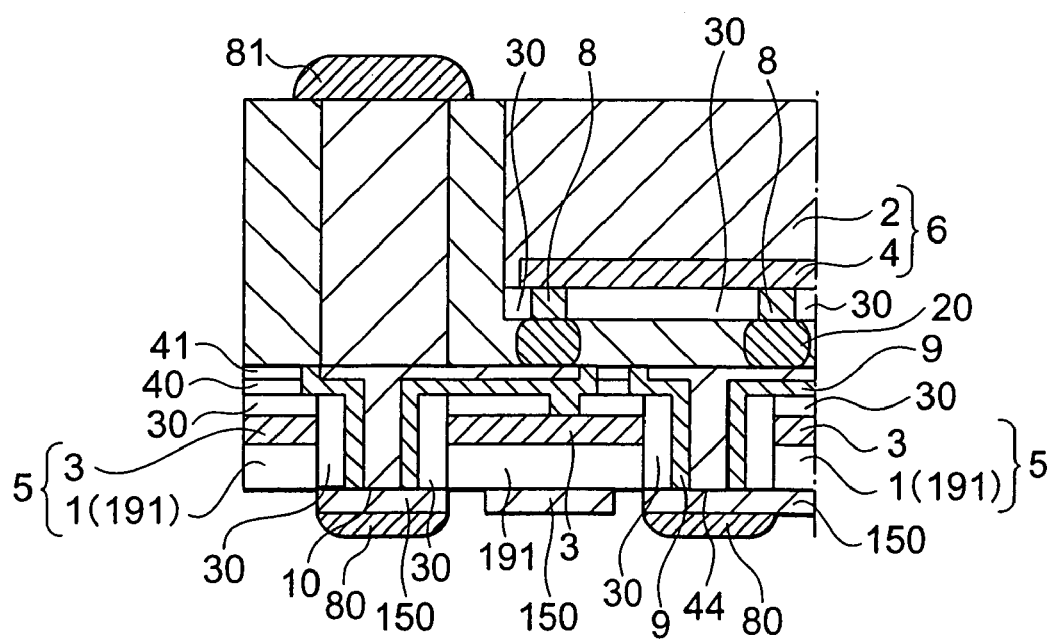
FIG. 75 is a sectional view showing a modification of the semiconductor device according to the twenty-first embodiment of the present invention.

FIGS. 74 and 75 are sectional views showing a semiconductor device according to a twenty-first embodiment of the present invention. In these figures, the constituents or components similar to those described previously in conjunction with the first to twentieth embodiments of the invention by reference to FIGS. 1 to 73 are denoted by like reference symbols, and repeated description in detail of these components is omitted.

In FIG. 74, there is shown a semiconductor device which corresponds to a combination of the semiconductor devices according to the fourth and nineteenth embodiments of the invention.

On the other hand, FIG. 75 shows a semiconductor device corresponding to a combination of the semiconductor devices according to the fourth and twentieth embodiments of the invention.

In the semiconductor device shown in FIG. 74, the back surface of the buried oxide film (insulation film) 191 of the SOI substrate 1 can be made use of as the first external terminal without providing the wiring conductor, the number of terminals can be increased with shortest transmission paths.

Further, by employing the SOI substrate 1, the overall thickness of the extremely thin semiconductor layer in which the first semiconductor circuit 3 is formed and the buried oxide film 191 is still considerably small. Thus, the etching depth for forming the holes is extremely small. Owing to this feature, the conductive material for the hole can be buried upon forming the connecting conductor 9 without resorting to the plating process. In this way, a large number of small terminals can be formed by a much simplified method.

Incidentally, protruding electrodes 80 may be provided by forming the wiring conductor layers 150 on the back surface of the SOI substrate 1, as shown in FIG. 75.

Embodiment 22

Figure 76:
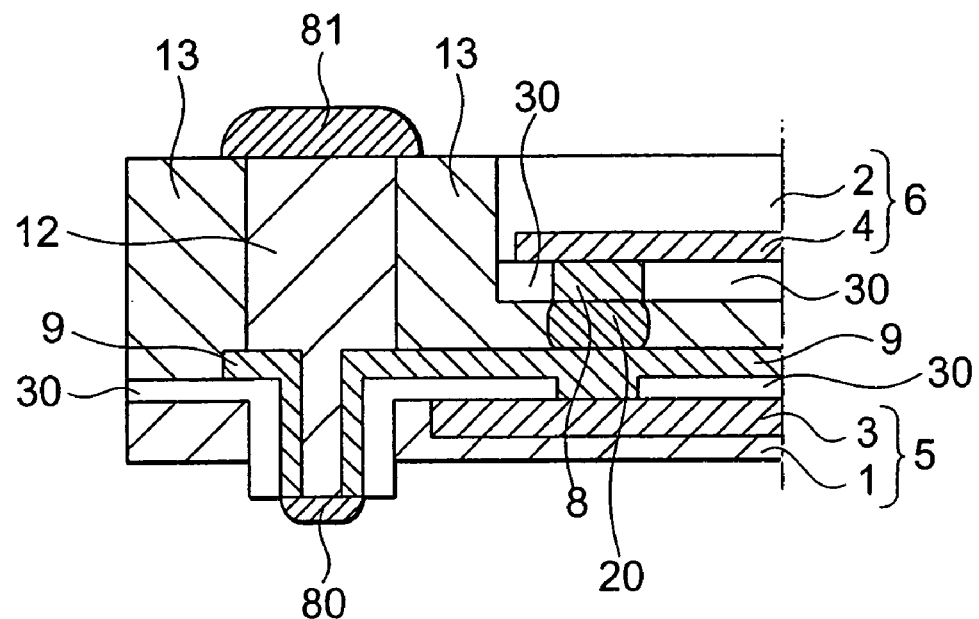
FIG. 76 is a sectional view showing a semiconductor device according to a twenty-second embodiment of the present invention.
Figure 77:
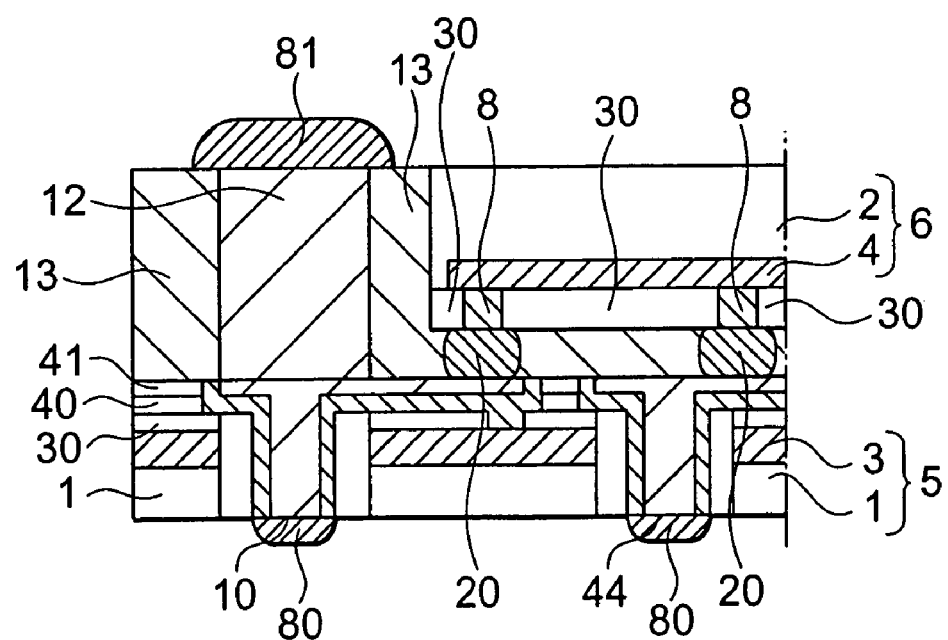
FIG. 77 is a sectional view showing a modification of the semiconductor device according to the twenty-second embodiment of the present invention.

FIGS. 76 and 77 are sectional views showing a semiconductor devices according to twenty-second embodiment of the present invention. In these figures, the constituents or components similar to those described previously in conjunction with the first to twenty-first embodiments of the invention by reference to FIGS. 1 to 75 are denoted by like reference symbols, and repeated description in detail of these components will be omitted.

In the semiconductor device shown in FIG. 76, an SOI substrate or an insulation substrate having the thin film transistor (TFT) formed thereon is employed as the second semiconductor substrate 2 of the second semiconductor element 6.

In the semiconductor device shown in FIG. 77, the SOI substrate is employed as the second semiconductor substrate 2 of the semiconductor device 6 shown in FIG. 74.

Thus, in the semiconductor devices according to the first to thirteenth embodiments of the invention and the semiconductor devices in which the SOI substrate is employed as the first semiconductor substrate 1, it is possible to improve the electrical stability and the chemical/mechanical withstanding capability to thereby enhance the reliability with ease, similarly to the semiconductor device according to the fourteenth embodiment in which the back surface of the second semiconductor element 6 is coated with the insulation material (insulation film), without need for forming the insulation film on the back surface of the second semiconductor element 6 by using the substrate having the insulation layer deposited thereon in advance.

In the method of manufacturing the semiconductor devices described above, the SOI substrate or alternatively the insulation substrate having the thin film transistor (TFT) formed thereon is employed as the second semiconductor element 6 in the step described hereinbefore in conjunction with the third embodiment by reference to FIG. 12.

Further, in the step shown in FIG. 14, the grinding is carried out until the back surface of the second semiconductor element 6 is exposed.

Embodiment 23

Figure 78:
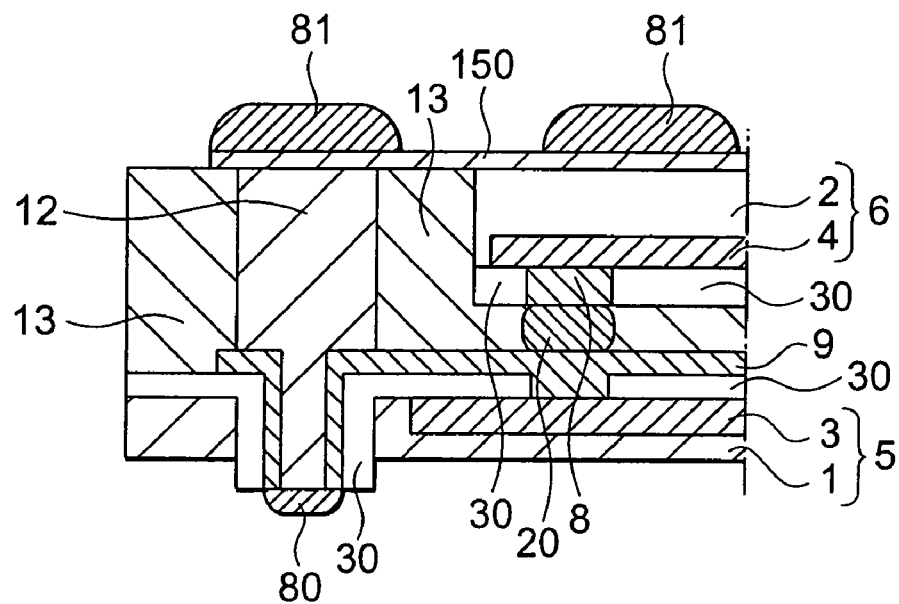
FIG. 78 is a sectional view showing a semiconductor device according to a twenty-third embodiment of the present invention.
Figure 79:
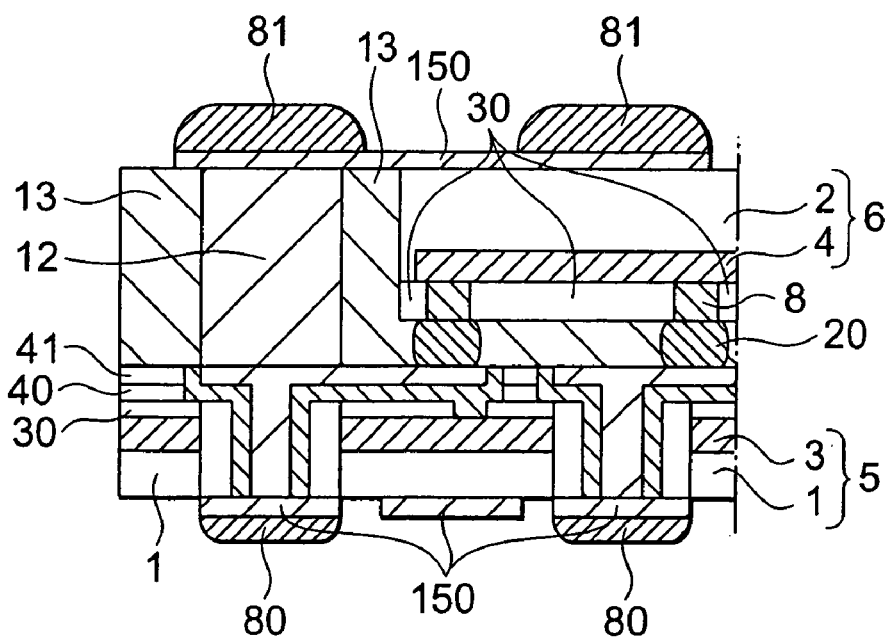
FIG. 79 is a sectional view showing a modification of the semiconductor device according to the twenty-third embodiment of the present invention.

FIGS. 78 and 79 are sectional views showing semiconductor devices according to a twenty-third embodiment of the present invention. In these figures, the constituents or components similar to those described previously in conjunction with the first to twenty-second embodiments of the invention by reference to FIGS. 1 to 77 are denoted by like reference symbols, and repeated description in detail of these components will be omitted.

In the semiconductor device shown in FIG. 78, a wiring conductor layer 150 is formed on the surface flush with the back surface of the second semiconductor element 6 in the semiconductor device shown in FIG. 76, wherein the back surface of the wiring conductor layer 150 is made use of as regions for disposition of external terminals.

Bump electrode (second protruding electrode 81) may be formed on the top surface of the wiring conductor layer 150, as in the case of the semiconductor device shown in FIG. 78.

Thus, in the semiconductor devices according to the instant embodiment of the invention, the integration density can be enhanced with the number of the connecting terminals being increased without need for additional step of forming the insulation film.

Similarly, the wiring conductor layer 150 may additionally be formed on the surface extending in flush with the back surface of the first semiconductor element 5 in the semiconductor device shown in FIG. 77, as can be seen in FIG. 79.

Embodiment 24

Figure 80:
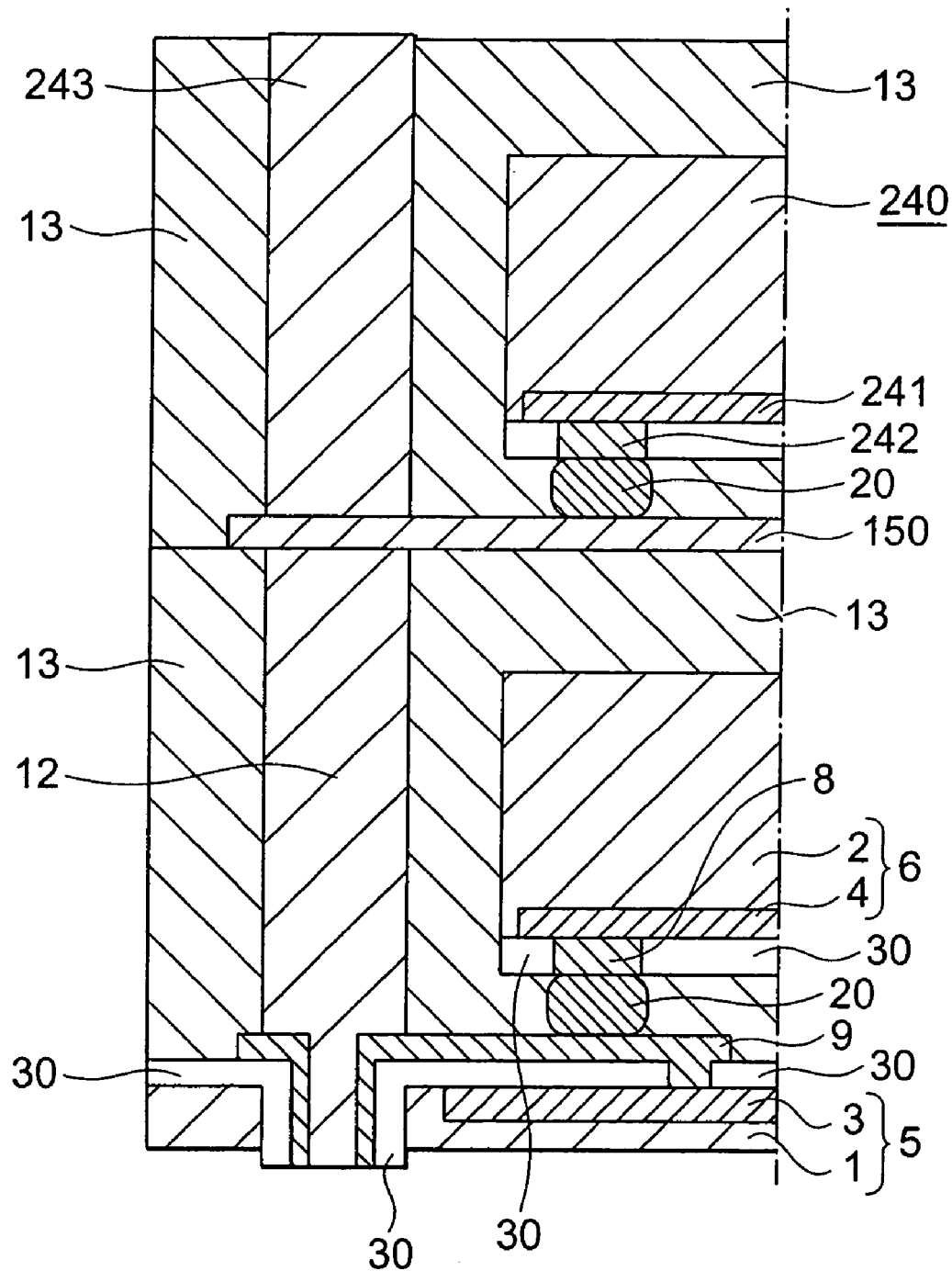
FIG. 80 is a sectional view showing a semiconductor device according to a twenty-fourth embodiment of the present invention.
Figure 81:
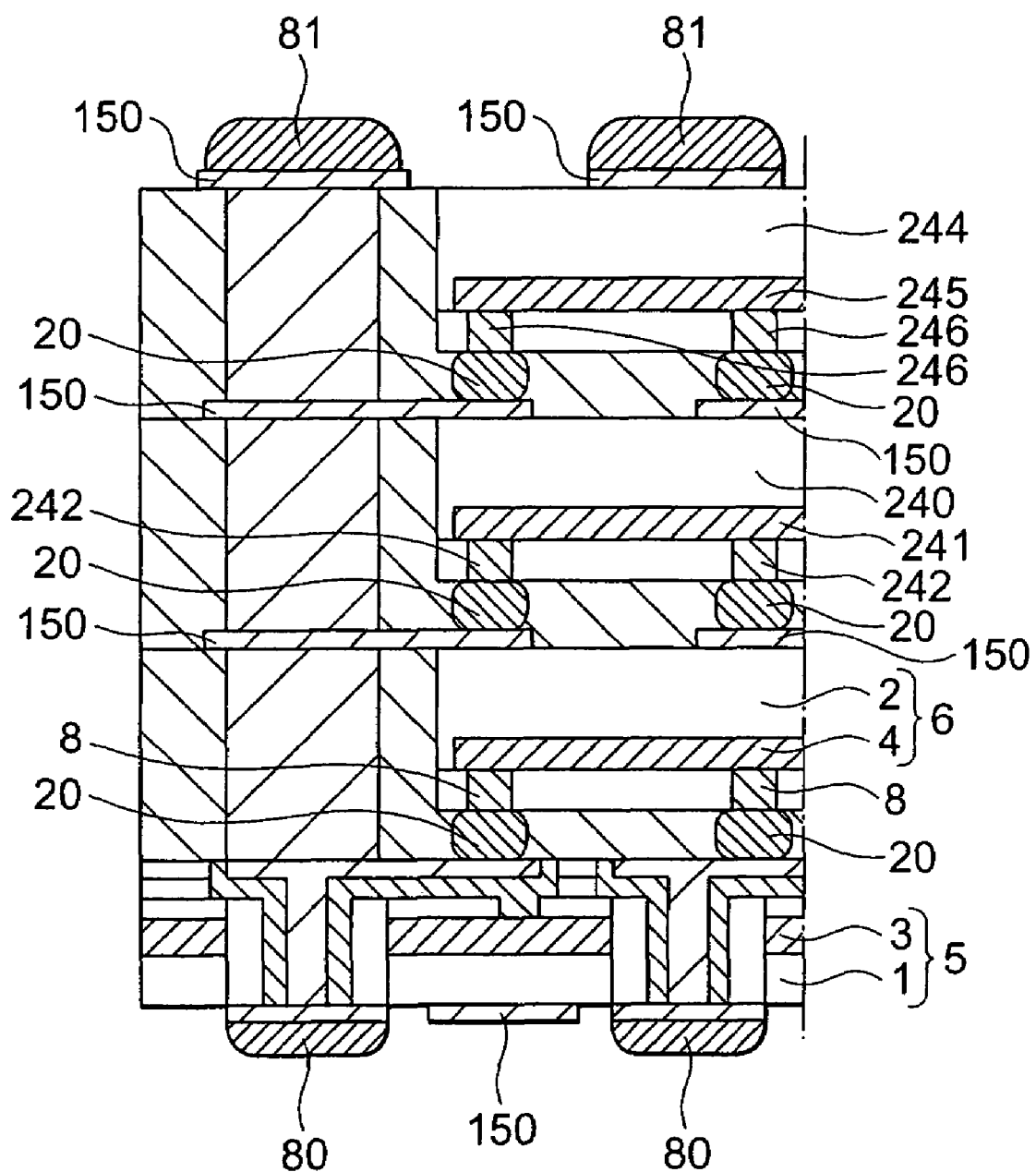
FIG. 81 is a sectional view showing a modification of the semiconductor device according to the twenty-fourth embodiment of the present invention.

FIGS. 80 and 81 are sectional views showing stack type semiconductor devices according to a twenty-fourth embodiment of the present invention. In these figures, the components similar to those described previously in conjunction with the first to twenty-third embodiments of the invention by reference to FIGS. 1 to 79 are denoted by like reference symbols, and repeated description in detail of these components is omitted.

In the semiconductor device shown in FIG. 80, a third semiconductor element generally denoted by 240 is stacked with interposition of the additional wiring conductor (wiring conductor layer 150) formed on the back surface of the second semiconductor element 6 of the semiconductor device shown in FIG. 46. The third semiconductor element 240 is implemented in the same structure as the second semiconductor element 6. Incidentally, reference numeral 241 denotes a semiconductor circuit and 242 denotes an electrode.

In the case of the semiconductor device shown in FIG. 81, a third semiconductor element 240 and a fourth semiconductor element 244 each formed in an SOI substrate or thin film transistor (TFT) substrate are serially stacked with interposition of the additional wiring conductors (wiring conductor layer 150) formed on the back surface of the second semiconductor element 6 of the semiconductor device shown in FIG. 76. The third and fourth semiconductor elements 240 and 244 are each realized in the same structure as the second semiconductor element 6. Incidentally, in FIG. 81, reference numerals 245 and 241 denote semiconductor circuits, respectively, and numeral 246 and 242 denote electrodes, respectively. In the semiconductor device shown in FIG. 81, bump electrodes (protruding electrodes 80, 81) are formed on the top and back surfaces, respectively.

In this manner, a plurality of semiconductor elements can be stacked or laminated by repeating the same structure, whereby the integration density can be enhanced.

Embodiment 25

FIGS. 82 to 86 are views for illustrating processes involved in the semiconductor device manufacturing method according to the twenty-fifth embodiment of the present invention. In FIGS. 82 to 86, the components similar to those described previously in conjunction with the first to twenty-fourth embodiments of the invention by reference to FIGS. 1 to 81 are denoted by like reference symbols, and repeated description in detail of these components is omitted.

In FIGS. 82 to 86, there is illustrated a method of manufacturing the semiconductor device according to the twenty-fourth embodiment of the invention. More specifically, in the additional wiring conductor forming process described hereinbefore in conjunction with the sixteenth to eighteenth embodiments or twenty-second or twenty-third embodiments, terminals are formed at the positions where the bump electrodes are to be formed on the third semiconductor element 240 and connected to the bump electrodes. Subsequently, the method described in conjunction with the sixteenth to eighteenth embodiments is repetitionally carried out to thereby extend the through electrode 12 upwardly.

Figure 82:
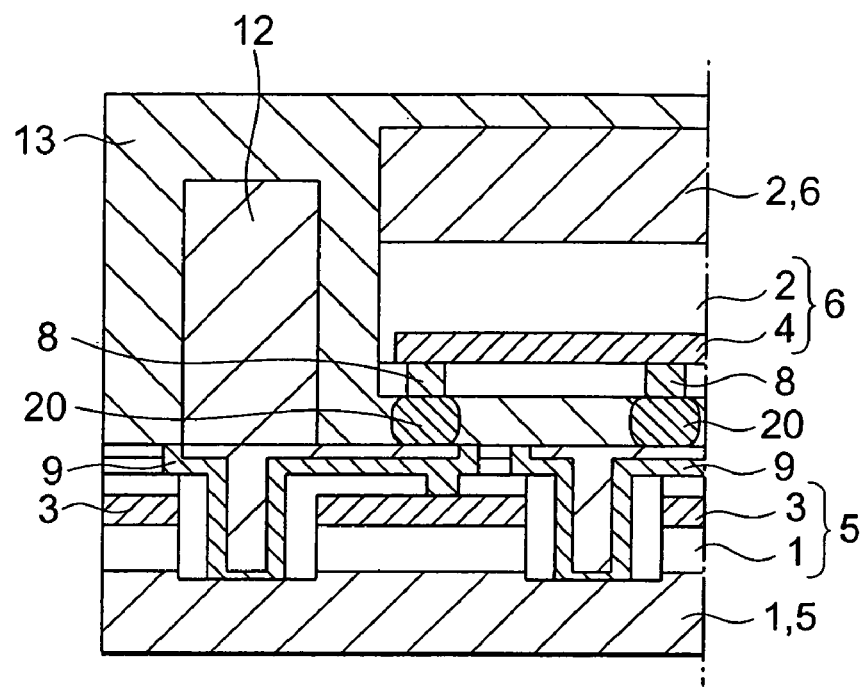
FIG. 82 is a view for illustrating a step involved in a semiconductor device manufacturing method according to a twenty-fifth embodiment of the present invention.

In the step shown in FIG. 82, the first semiconductor element 5 and the second semiconductor element 6 are each formed by using the SOI substrate.

Figure 83:
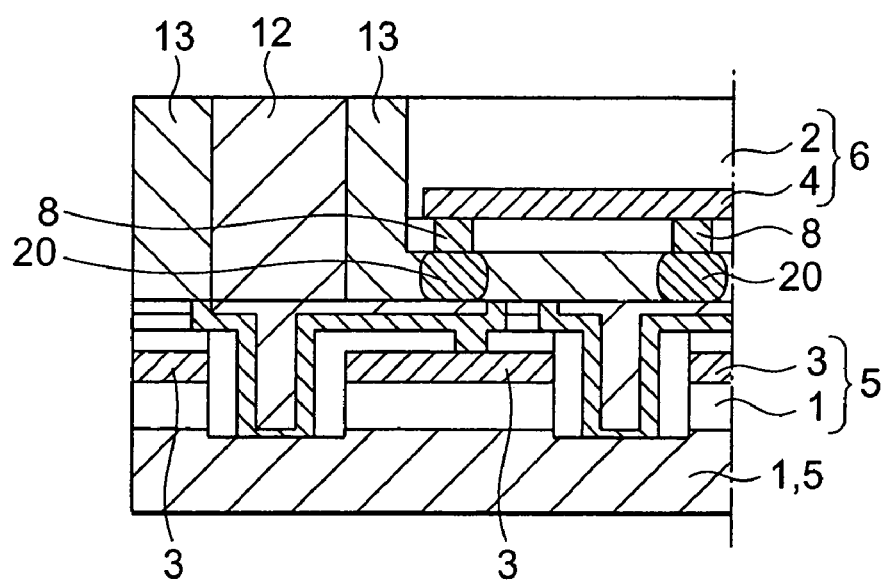
FIG. 83 is a view for illustrating another step involved in the semiconductor device manufacturing method according to the twenty-fifth embodiment of the present invention.

In the step shown in FIG. 83, the insulation layer on the back surface of the second semiconductor substrate and the top end portion of the through electrode top portion is exposed by grinding.

Figure 84:
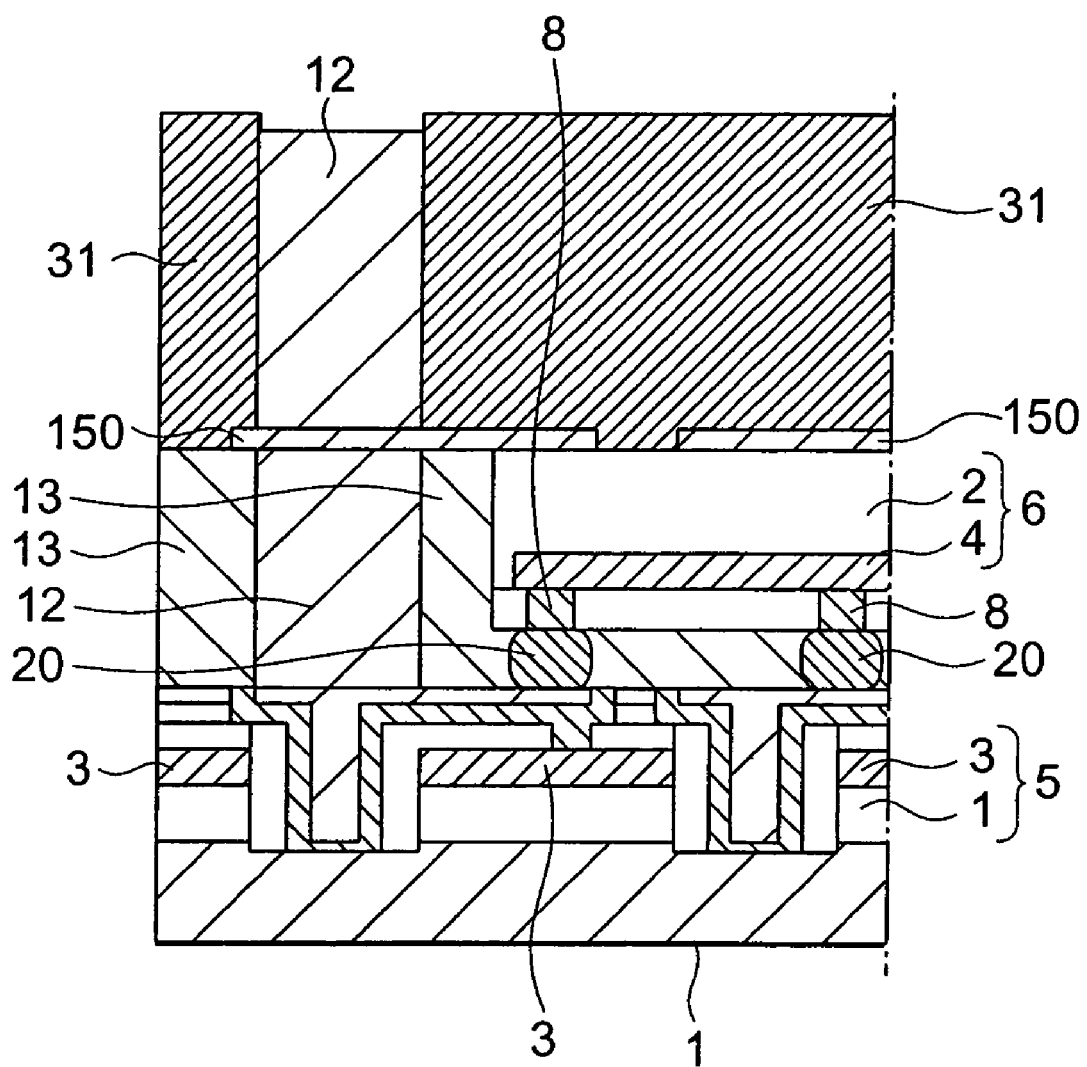
FIG. 84 is a view for illustrating yet another step involved in the semiconductor device manufacturing method according to the twenty-fifth embodiment of the present invention.

In the step shown in FIG. 84, the additional wiring conductor 150 is deposited on the second semiconductor substrate 2, whereon the photoresist layer 31 having an opening in which the through electrode is to be formed is formed. In succession, the through electrode 12 is formed by electroplating. In that case, the first semiconductor substrate 1 being used as the cathode.

Figure 85:
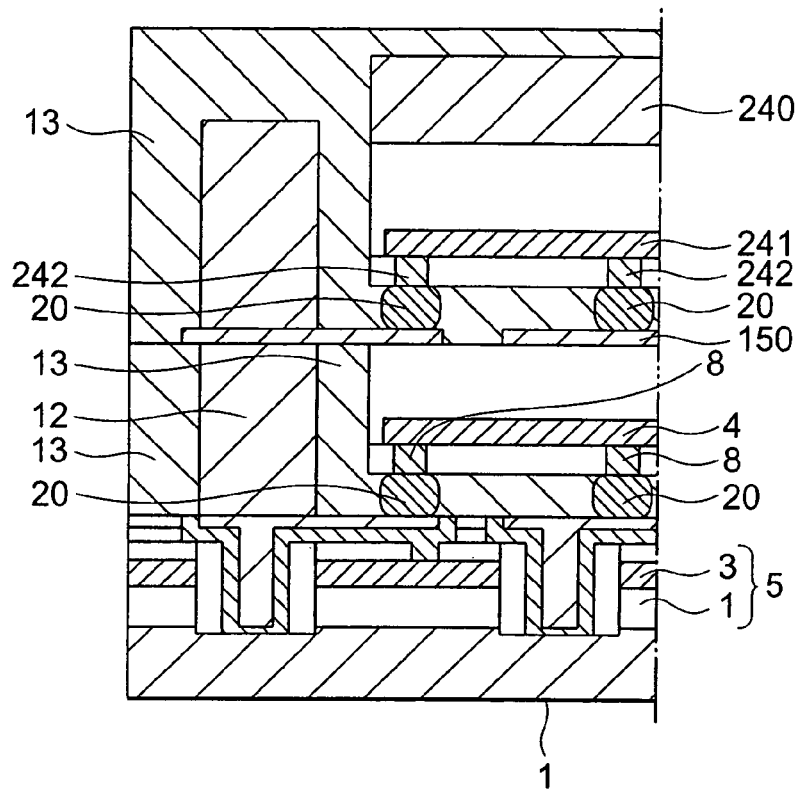
FIG. 85 is a view for illustrating still another step involved in the semiconductor device manufacturing method according to the twenty-fifth embodiment of the present invention.

In the step shown in FIG. 85, the photoresist (layer?) 31 is removed, and then the third semiconductor element 240 including the SOI substrate is disposed to be subsequently covered with the insulation material 13.

In the step shown in FIG. 86, the top end portion of the extended through electrode 12 and the insulation layer of the second semiconductor substrate are exposed through the grinding process similarly to the steps described previously by reference to FIG. 86.

Further, a fourth semiconductor element et seq. may be stacked by repetitively carrying out the process shown in FIGS. 82 to 86.

Finally, the back surface of the first semiconductor substrate is ground to expose the bottom portion of the through electrode 12. At this stage, the bump electrodes (protruding electrodes) may be formed on the back surface.

Extension of the through electrode 12 can be realized similarly through the processes described hereinbefore in conjunction with the seventeenth and eighteenth embodiments of the invention.

By the method described above, the semiconductor device can be manufactured with an enhanced integration density.

Embodiment 26

Figure 86:
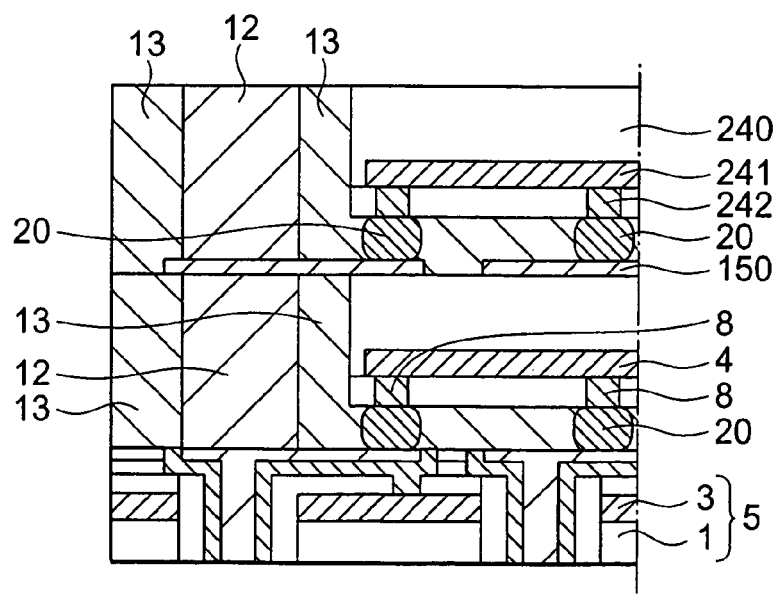
FIG. 86 is a view for illustrating a further step involved in the semiconductor device manufacturing method according to the twenty-fifth embodiment of the present invention.
Figure 87:
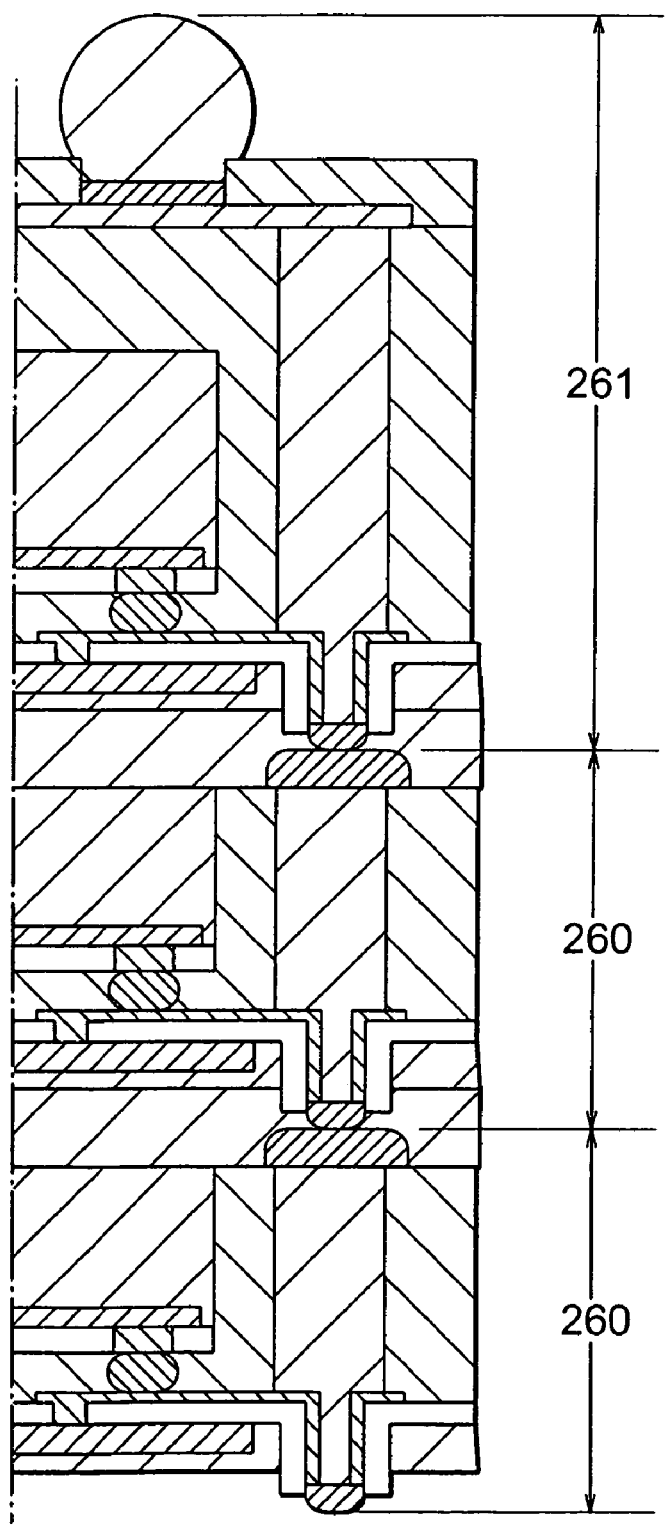
FIG. 87 is a sectional view showing a stack type semiconductor device according to a twenty-sixth embodiment of the present invention.

FIG. 87 is a sectional view showing an integrated semiconductor device stack according to a twenty-sixth embodiment of the present invention. In this figure, the constituents or components similar to those described previously in conjunction with the first to twenty-fifth embodiments of the invention by reference to FIGS. 1 to 86 are denoted by like reference symbols, and repeated description in detail of these components is omitted.

FIG. 87 shows a stack-type integrated semiconductor device of a composite structure realized by stacking the semiconductor structures described hereinbefore in conjunction with the first to twenty-fifth embodiments in combination. More specifically, the semiconductor device now concerned is implemented by stacking semiconductor devices 260 according to the eighth embodiment of the present invention shown in FIG. 33 and the semiconductor device 261 according to the fifteenth embodiment shown in FIG. 55.

In the semiconductor device stack shown in FIG. 87, two semiconductor devices 260 shown in FIG. 33 and one semiconductor device shown in FIG. 55 are employed. It goes however without saying that a given number of any semiconductor devices described hereinbefore in conjunction with the first to twenty-fifth embodiments may be stacked in a given order.. Thus, a semiconductor device stack structure of an extremely large scale can be realized.

Embodiment 27

Figure 88:
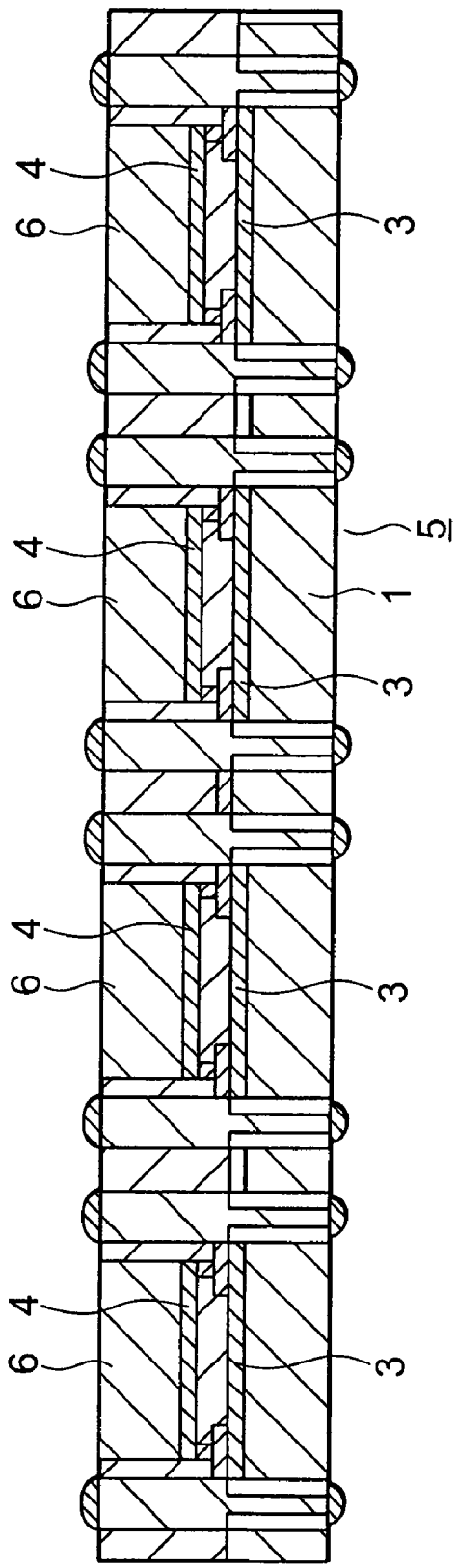
FIG. 88 is a sectional view showing a planar array type semiconductor device according to a twenty-seventh embodiment of the present invention.
Figure 89:
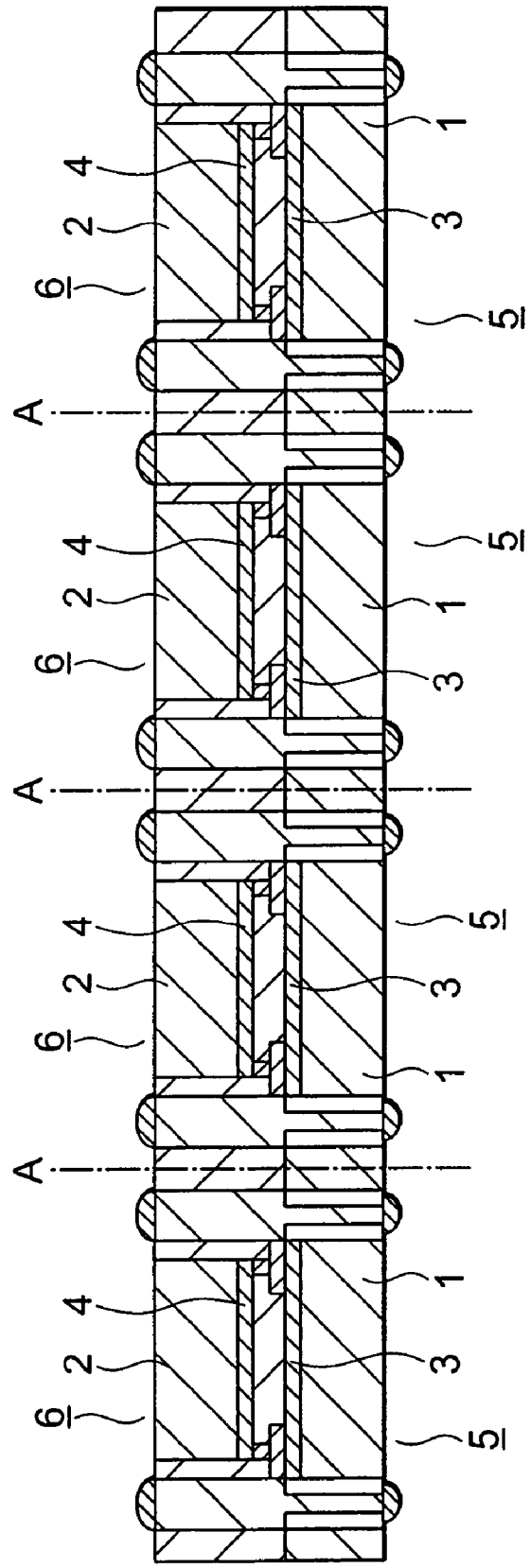
FIG. 89 is a sectional view showing another planar type semiconductor device according to the twenty-seventh embodiment of the present invention.

FIGS. 88 and 89 are sectional views showing an array type semiconductor device (which may also be referred to as the semiconductor device array) according to a twenty-seventh embodiment of the present invention. In these figures, the constituents or components similar to those described previously in conjunction with the first to twenty-sixth embodiments of the invention by reference to FIGS. 1 to 87 are denoted by like reference symbols, and repeated description in detail of these components is omitted.

FIG. 88 shows an array type semiconductor device implemented in the form of a semiconductor module in which a plurality of second semiconductor elements 6 are mounted on a single first semiconductor substrate in a planar array.

On the other hand, in the array type semiconductor device shown in FIG. 89, a group of first semiconductor circuits are formed on a single semiconductor substrate independently of one another, and second semiconductor elements are disposed on the first semiconductor circuits, respectively. Thus, the semiconductor device shown in FIGS. 1, 3 and others can be obtained by cutting the structure shown in FIG. 89 at locations indicated by "A", respectively.

The semiconductor device of this type can be manufactured according to the method described hereinbefore in conjunction with the third embodiment of the invention. Thus, integration of a large scale can be realized.

Embodiment 28

Figure 90:
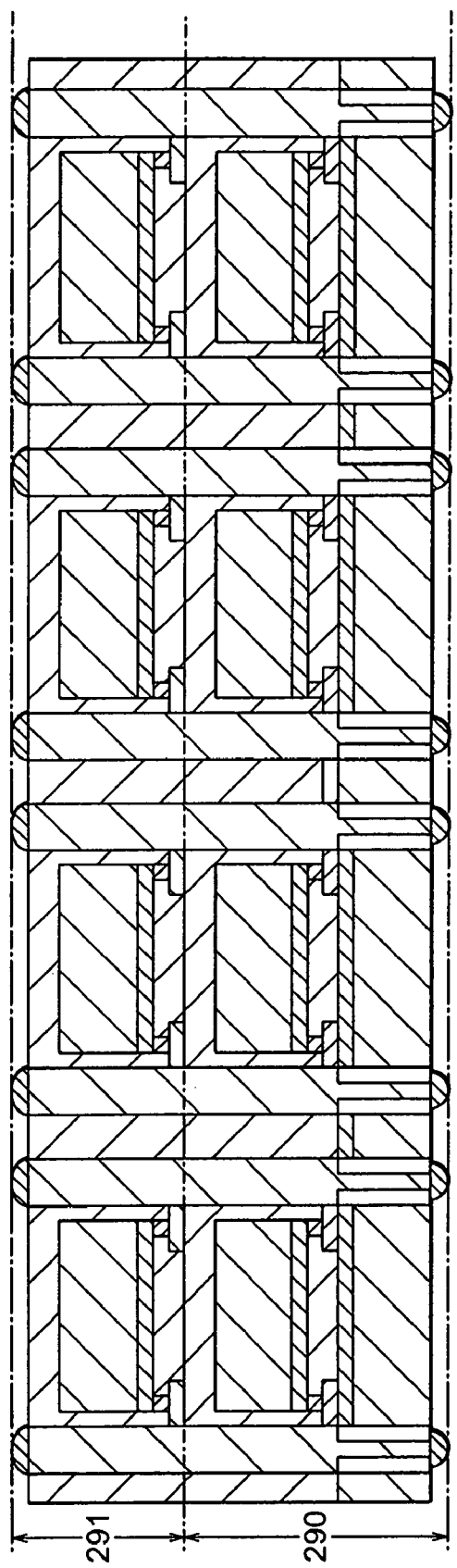
FIG. 90 is a sectional view showing a composite type semiconductor device according to a twenty-eighth embodiment of the present invention.

FIG. 90 is a sectional view showing a composite type semiconductor device structure according to a twenty-eighth embodiment of the present invention.

In the composite type semiconductor device structure shown in FIG. 90, a group of third semiconductor elements generally denoted by numeral 291 are stacked on the semiconductor module 290 described above in conjunction with the twenty-seventh embodiment by adopting the stacking structure described previously in conjunction with the twenty-fifth embodiment. Thus, the composite type semiconductor module of a greater scale can be realized by combining the planar array of the semiconductor elements with the stacked array thereof.

Embodiment 29

Figure 91:
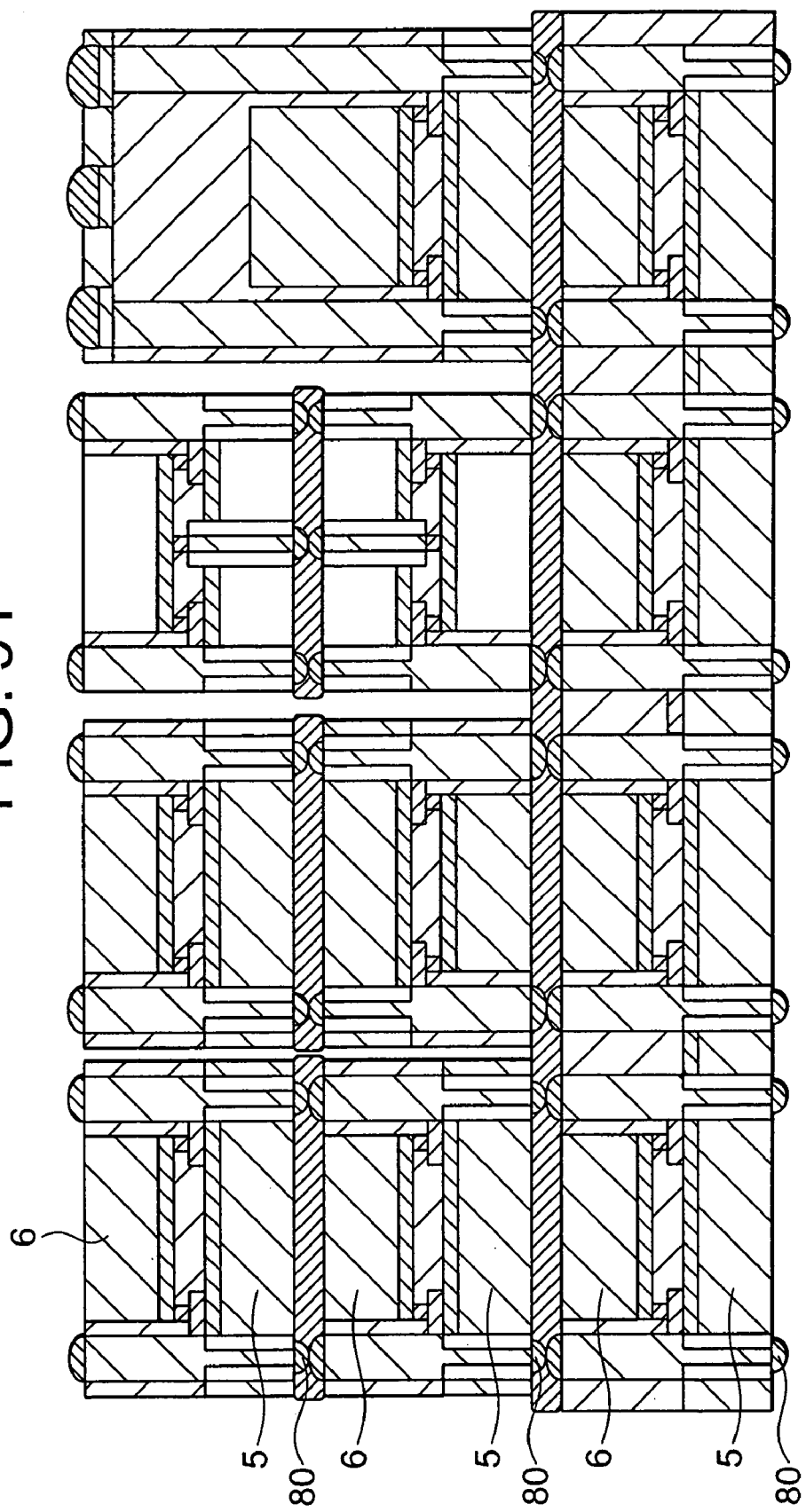
FIG. 91 is a sectional view showing a composite type semiconductor device according to a twenty-ninth embodiment of the present invention.

FIG. 91 is a sectional view showing a composite type semiconductor device structure according to a twenty-ninth embodiment of the present invention.

In the structure shown in FIG. 91, the first semiconductor substrate 1 of the semiconductor module having the connecting terminals exposed on the back surface as described previously in conjunction with the twenty-seventh and twenty-eighth embodiments is connected with the semiconductor device stacks (composite stacked structures shown in FIGS. 42 to 45 and FIG. 87) including the semiconductor devices described hereinbefore in conjunction with the first to tenth embodiments or the semiconductor devices according to the eleventh to thirteenth embodiments and the semiconductor device according to twenty-sixth embodiment. With this structure, the composite semiconductor module of an extremely large scale can be realized.

Embodiment 30

Figure 92:
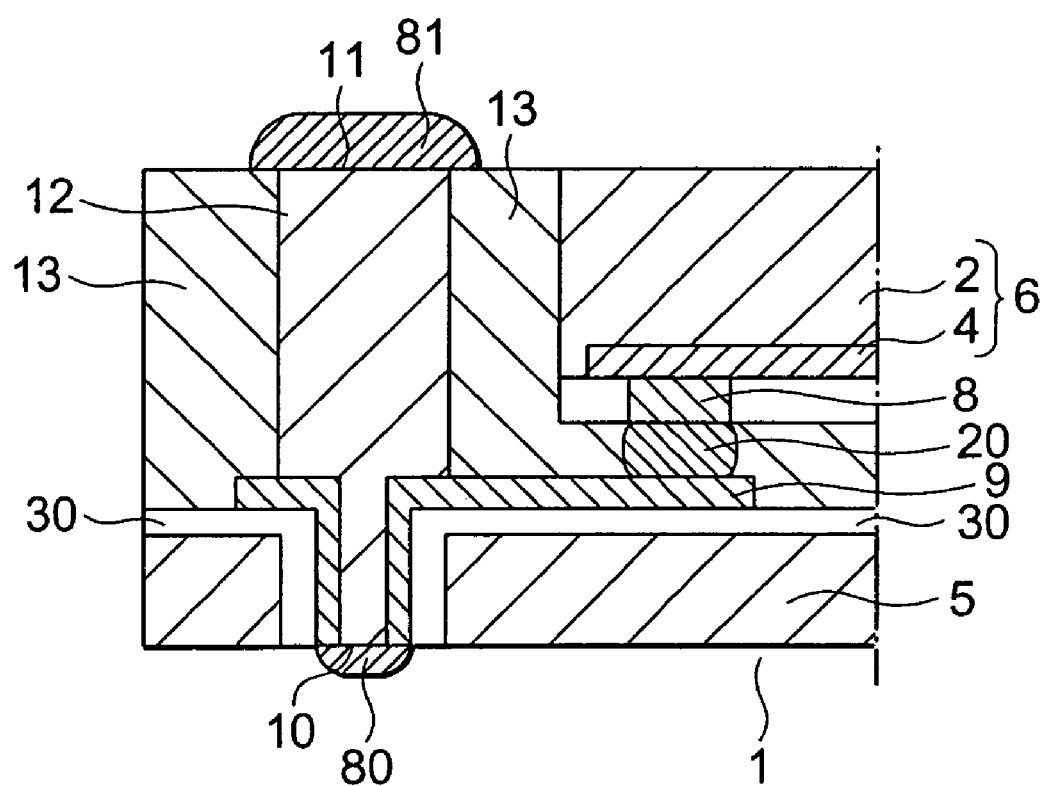
FIG. 92 is a sectional view showing a semiconductor device according to a thirtieth embodiment of the present invention.

FIG. 92 is a sectional view showing a semiconductor device according to a thirtieth embodiment of the present invention. In this figure, the constituents or components similar to those described previously in conjunction with the first to twenty-ninth embodiments of the invention by reference to FIGS. 1 to 91 are denoted by like reference symbols, and repeated description in detail of these components is omitted.

In the structure shown in FIG. 92, the first semiconductor circuit 3 is not formed on the first semiconductor substrate 1. Thus, with this structure, the integration density as realized is inferior to that of the semiconductor devices described so far. However, because the structure is simple and because the manufacturing process is not time-consuming and simple, there can be realized very inexpensive semiconductor device with high yield.

At this juncture, it should be added that similar structure can be realized even in the case where a metal board is employed in place of the first semiconductor substrate 1.

Further, by using the etching process in combination with the back-surface grinding, the semiconductor substrate matrix and the metal board of the first semiconductor substrate may all be removed.

Many modifications and variations of the present invention are possible in the light of the above techniques. It is therefore to be understood that within the scope of the appended claims, the invention may be practiced otherwise than as specifically described.

What is claimed is:

1. A method of manufacturing a semiconductor device, comprising:

a circuit forming step of forming a first semiconductor circuit including a connecting terminal portion on a first semiconductor substrate;

a hole forming step of forming a first hole of a predetermined depth reaching a semiconductor substrate matrix of said first semiconductor substrate at a position located outside of a region in which a second semiconductor element including a second semiconductor circuit and a second electrode formed previously in a second semiconductor substrate is to be disposed;

an insulation film deposition step of depositing a insulation film on a lateral wall and a bottom of said first hole and a surface of said first semiconductor substrate in which said first semiconductor circuit is formed;

an insulation film eliminating step of eliminating said insulation film formed on the bottom of said hole and said connecting terminal portion;

a wiring conductor connecting step of forming a wiring conductor layer of an electrically conductive material such that one end portion of said wiring conductor layer is connected to the semiconductor substrate matrix forming the bottom of said hole with other end portion thereof serving as a first electrode;

a resist pattern forming step of applying a resist on the side of said semiconductor substrate in which said first semiconductor circuit is formed to thereby form a resist pattern of a predetermined thickness, said resist pattern having an opening for forming said first hole;

an electrode forming step of forming a through electrode on said electrically conductive material through said opening formed in said resist pattern by electroplating with said first semiconductor substrate matrix being used as a cathode;

a resist removing step of removing said resist;

an element interconnecting step of connecting a first semiconductor element including said first semiconductor circuit and said first electrode formed in said first semiconductor substrate with said second semiconductor element through the medium of said first electrode and said second electrode;

a through electrode insulation coating step of coating said second semiconductor substrate and said through electrode with an insulation material on the surface of said first semiconductor substrate in which said first semiconductor circuit is formed;

a surface grinding step of grinding the insulation material coated in said through electrode insulation coating step from a side of said first semiconductor substrate on which said second semiconductor substrate is mounted until said through electrode is exposed; and a back surface grinding step of grinding a back surface of said first semiconductor substrate by a predetermined thickness.

2. The semiconductor device manufacturing method according to claim 1, further comprising:

a protruding electrode forming step of forming a protruding electrode on a top portion of said through electrode exposed on the side f said second semiconductor substrate through an electroplating process by using said first semiconductor substrate as a cathode, after said surface grinding step has been carried out.

3. The semiconductor device manufacturing method according to claim 1, further comprising:

a back surface etching step of eliminating by etching said semiconductor substrate matrix exposed on the back surface of said first semiconductor substrate until said through electrode protrudes from said first semiconductor substrate in succession to said back surface etching step.

4. The semiconductor device manufacturing method according to claim 1, wherein in said hole forming step, a second hole is formed at a position distanced from said first hole by a predetermined distance with a predetermined depth reaching said semiconductor substrate matrix, wherein in said insulation film depositing step, an insulation film is deposited on a lateral surface and a bottom of said second hole, wherein in said insulation film eliminating step, said insulation film formed on the bottom of said second hole is removed, wherein in said wiring conductor connecting step, a wiring conductor is formed with one end portion being connected to said connecting terminal, wherein in said resist pattern forming step, a resist pattern of a predetermined thickness is formed in which an opening is formed at a location where said second hole is to be formed, and wherein in said electrode forming step, an electrically conductive material is buried into said second hole.

5. The semiconductor device manufacturing method according to claim 1, wherein in said resist pattern forming step, the resist pattern is formed at a height higher than the back surface of said second semiconductor substrate which is located oppositely to the surface in which said second semiconductor circuit forming surface is formed, wherein in said electrode forming step, said through electrode is formed at a height higher than the back surface of said second semiconductor substrate which is located oppositely to the surface in which said second semiconductor circuit is formed, and wherein in said surface grinding step, only said through electrode is exposed.

6. The semiconductor device manufacturing method according to claim 1, further comprising a surface conductor portion forming step in which the surface ground by said surface grinding step is coated with an insulation film pattern capable of accommodating a position of a top portion of said through electrode, to thereby form an electrically conductive portion which is connected to said top portion and which has a thickness not lower than a height of surface of said insulation film pattern through on electroplating by making use of said semiconductor substrate matrix of said first semiconductor substrate as cathode.

* * * * *